(12) United States Patent
Hsu et al.

(10) Patent No.: US 9,911,629 B2
(45) Date of Patent: Mar. 6, 2018

(54) INTEGRATED PASSIVE DEVICE PACKAGE AND METHODS OF FORMING SAME

(71) Applicant: Taiwan Semiconductor Manufacturing Company, Ltd., Hsin-Chu (TW)

(72) Inventors: Feng-Cheng Hsu, New Taipei (TW); Shuo-Mao Chen, New Taipei (TW); Jui-Pin Hung, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/225,083

(22) Filed: Aug. 1, 2016

(65) Prior Publication Data
US 2017/0229322 A1 Aug. 10, 2017

Related U.S. Application Data

(60) Provisional application No. 62/293,724, filed on Feb. 10, 2016.

(51) Int. Cl.
| | |
|---|---|
| *H01L 21/00* | (2006.01) |
| *H01L 21/56* | (2006.01) |
| *H01L 21/78* | (2006.01) |
| *H01L 23/00* | (2006.01) |
| *H01L 23/31* | (2006.01) |

(52) U.S. Cl.
CPC .......... *H01L 21/568* (2013.01); *H01L 21/565* (2013.01); *H01L 21/78* (2013.01); *H01L 23/3121* (2013.01); *H01L 24/02* (2013.01); *H01L 24/83* (2013.01); *H01L 2224/02372* (2013.01); *H01L 2224/02373* (2013.01)

(58) Field of Classification Search
CPC ...................................... H01L 22/32
See application file for complete search history.

(56) References Cited

U.S. PATENT DOCUMENTS

| | | | |
|---|---|---|---|
| 7,829,998 B2 * | 11/2010 | Do | H01L 21/6835 257/698 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |

(Continued)

*Primary Examiner* — William Harriston
(74) *Attorney, Agent, or Firm* — Slater Matsil, LLP

(57) ABSTRACT

An embodiment device package includes a first die, a second die, and a molding compound extending along sidewalls of the first die and the second die. The package further includes redistribution layers (RDLs) extending laterally past edges of the first die and the second die. The RDLs include an input/output (I/O) contact electrically connected to the first die and the second die, and the I/O contact is exposed at a sidewall of the device package substantially perpendicular to a surface of the molding compound opposite the RDLs.

20 Claims, 57 Drawing Sheets

(56) References Cited

U.S. PATENT DOCUMENTS

| | | |
|---|---|---|
| 2009/0140394 A1* | 6/2009 | Bathan ................ H01L 21/561 257/621 |
| 2009/0294914 A1* | 12/2009 | Pagaila ............... H01L 21/6835 257/621 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0353840 A1* | 12/2014 | Yap ........................ H01L 24/97 257/774 |

* cited by examiner

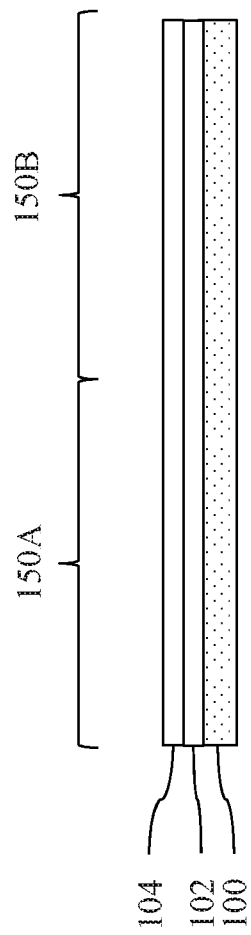
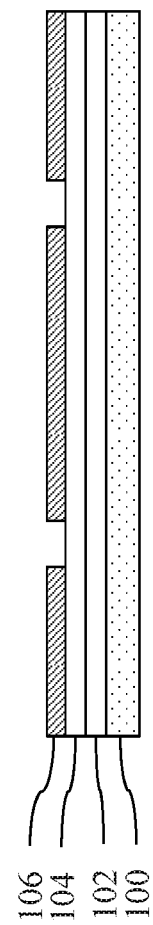
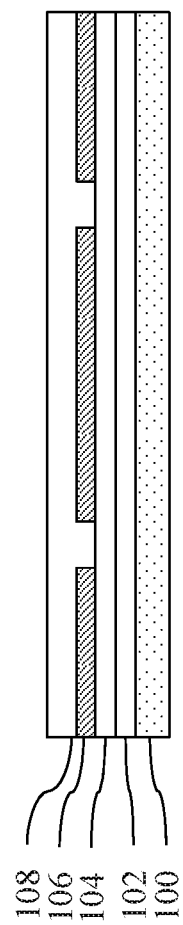

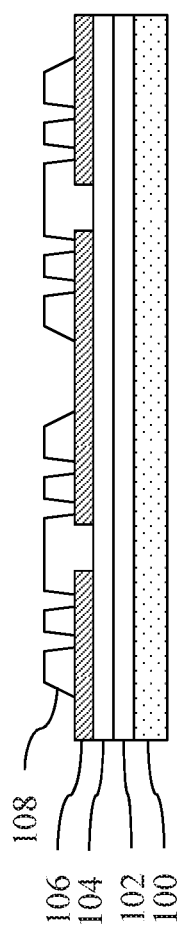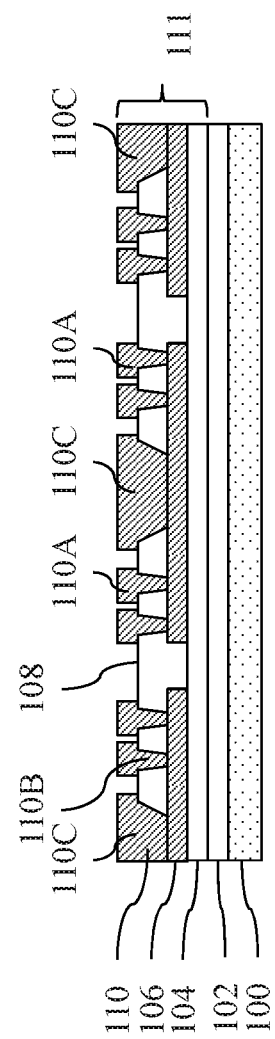

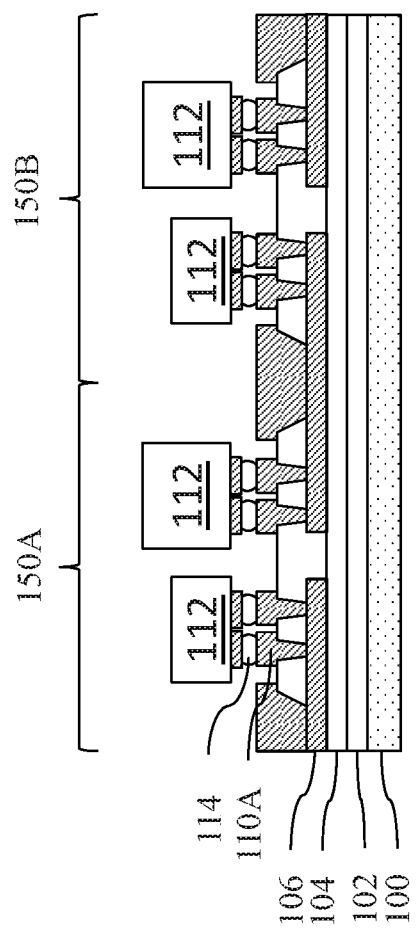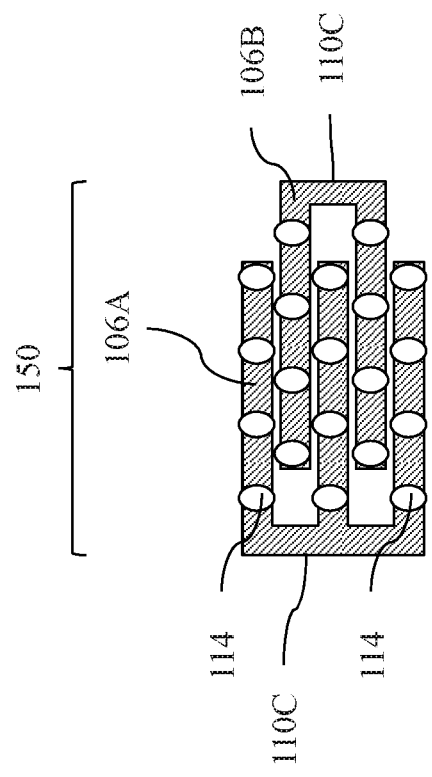

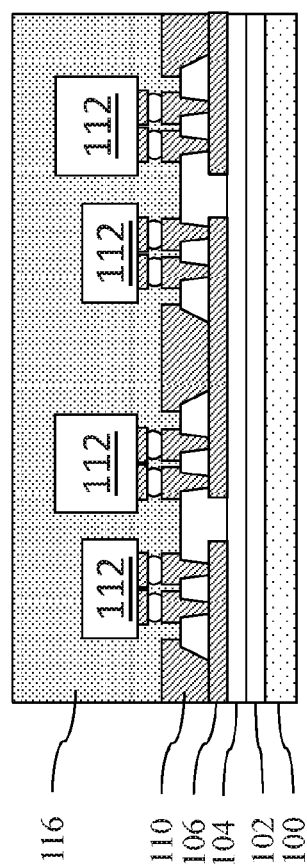
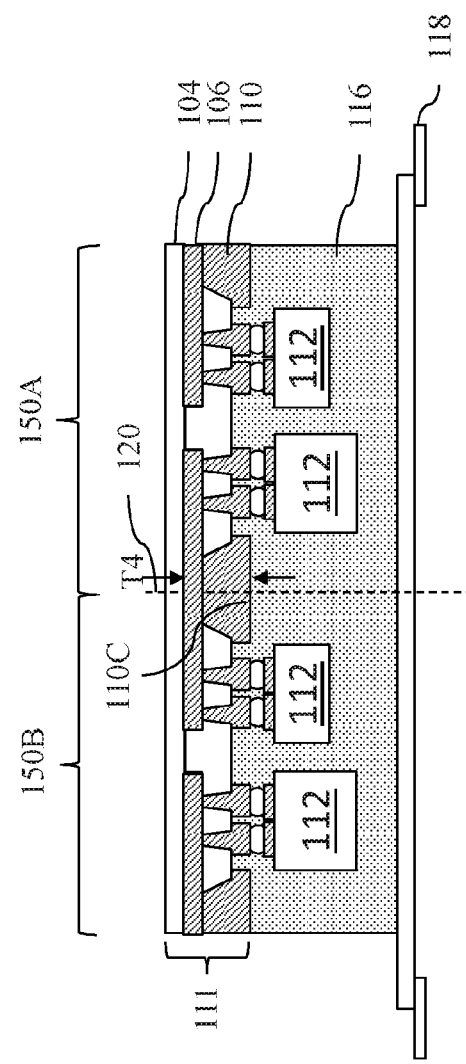

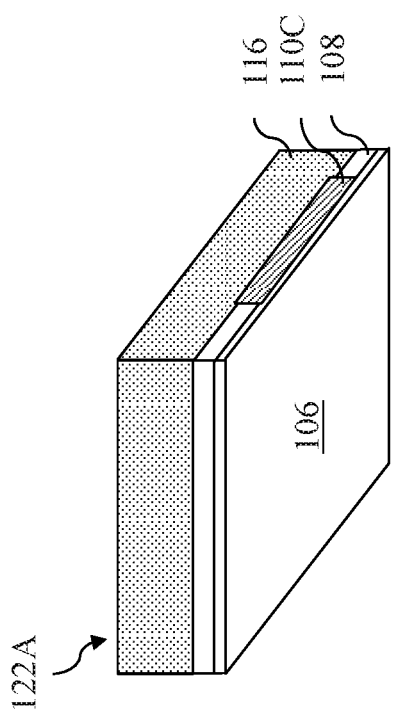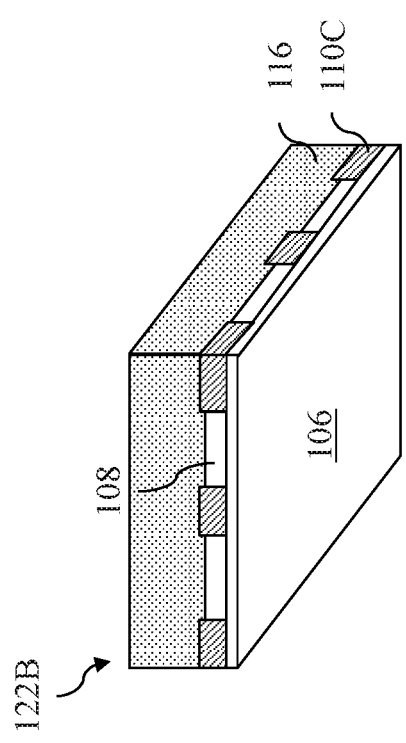

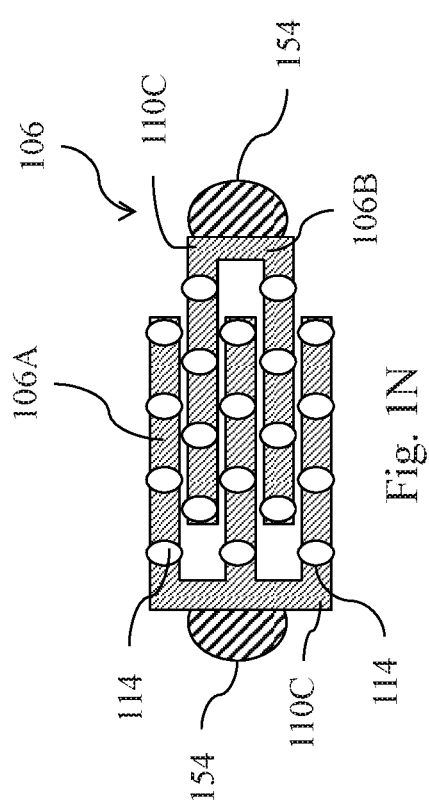
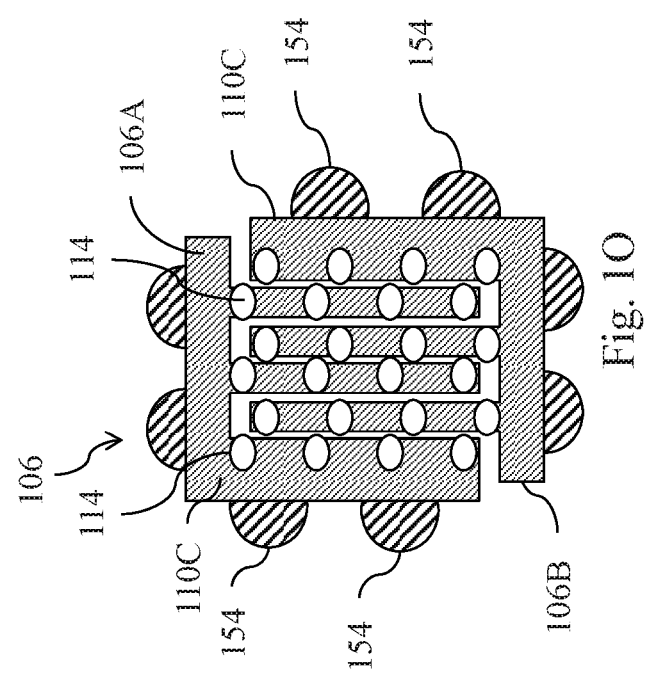

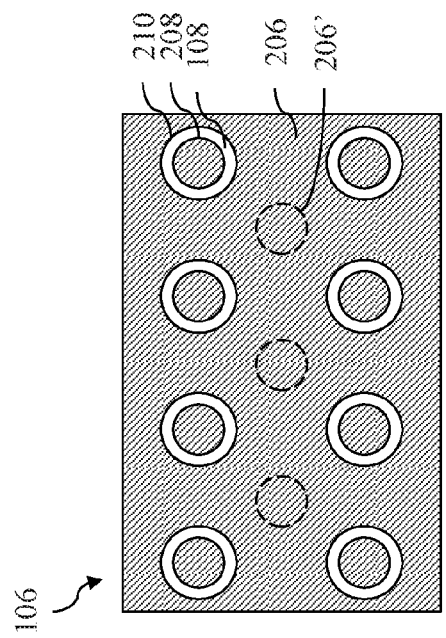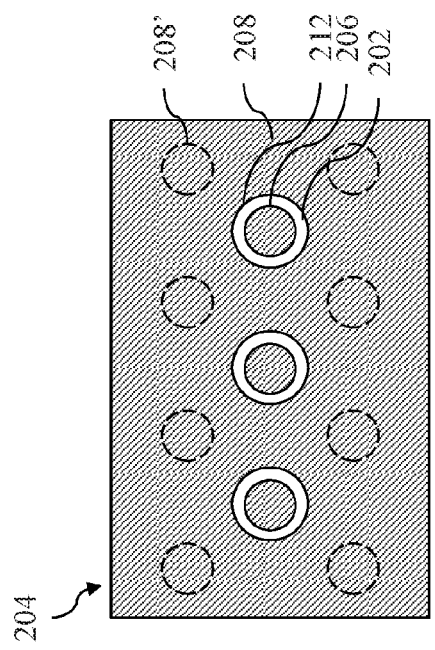
Fig. 2B
Fig. 2C

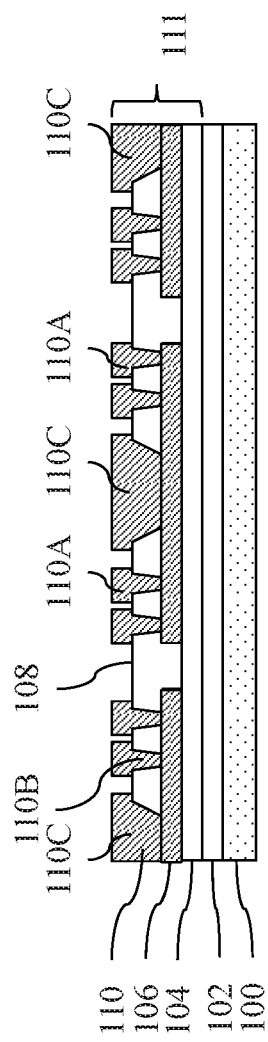
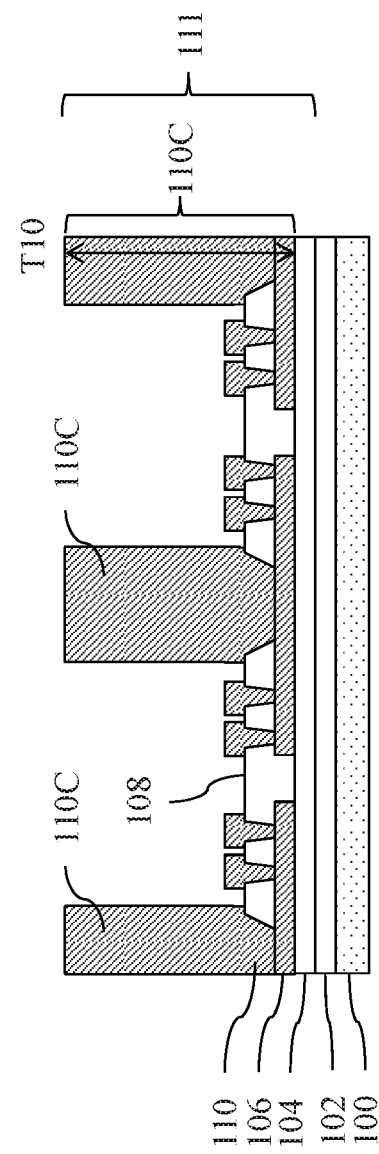

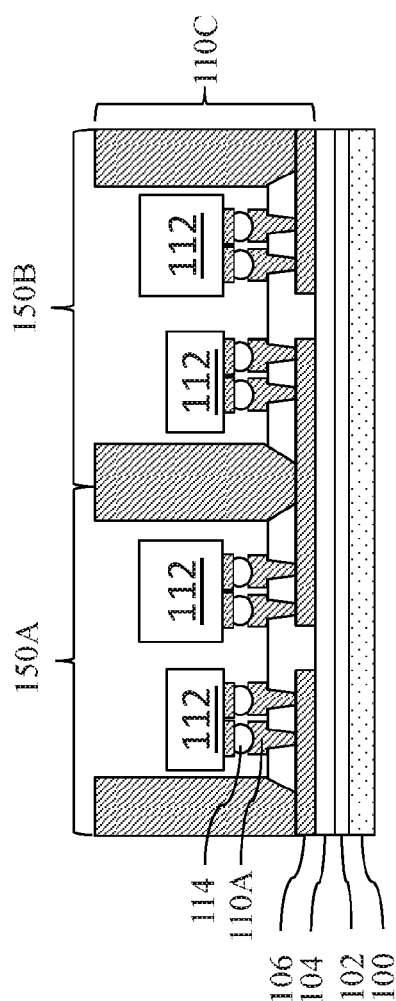
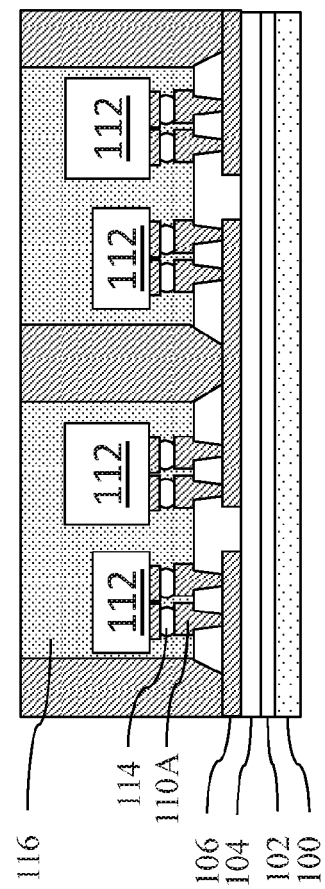
Fig. 3C
Fig. 3D

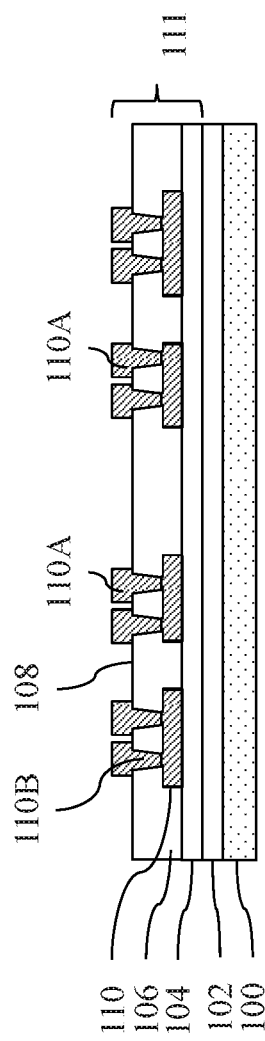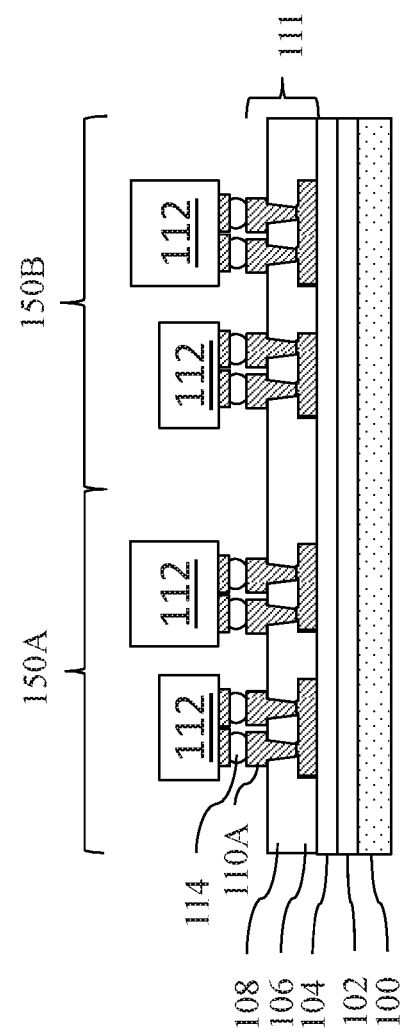

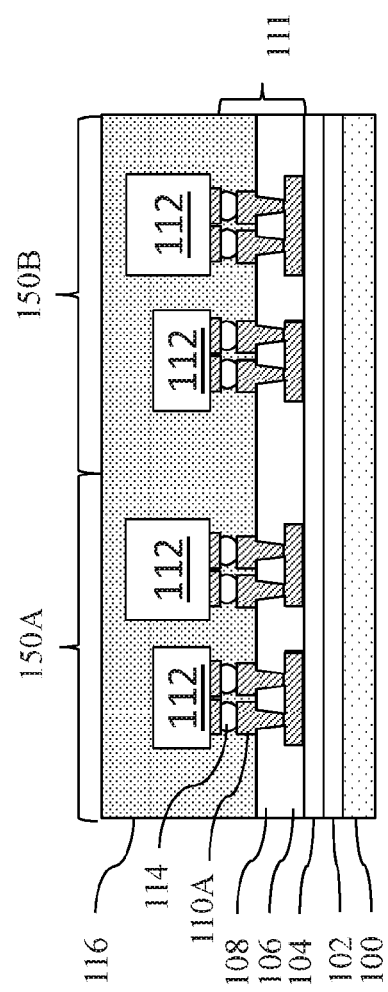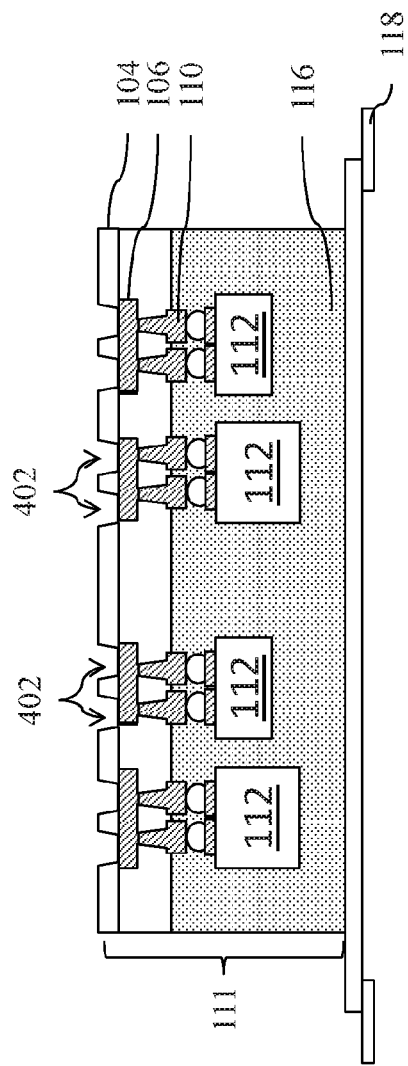

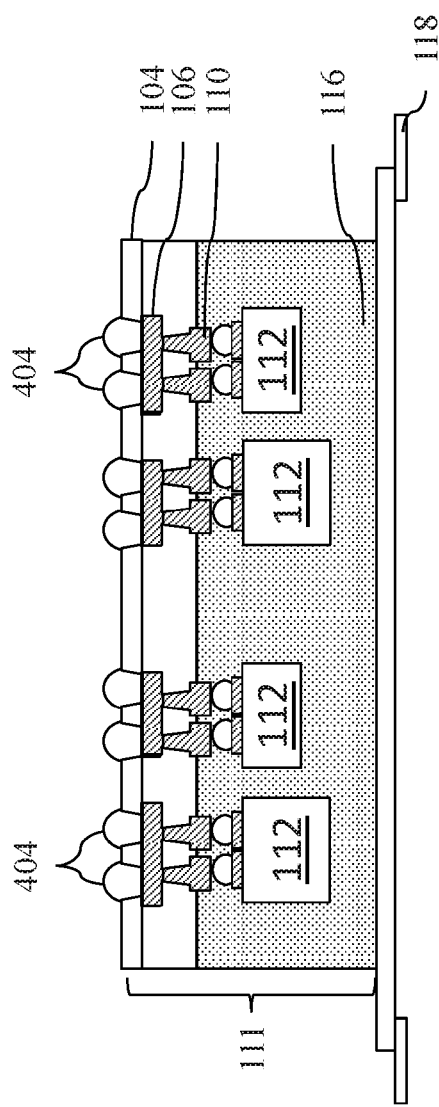
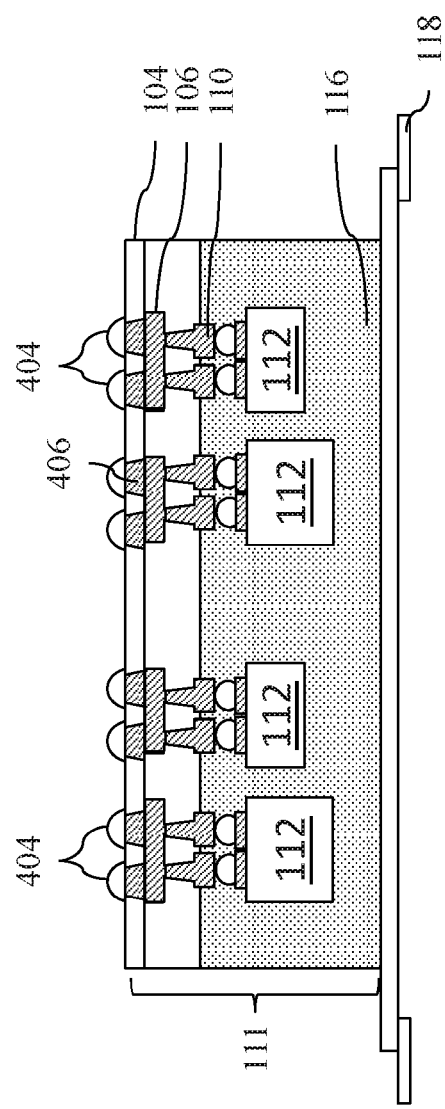
Fig. 4E
Fig. 4F

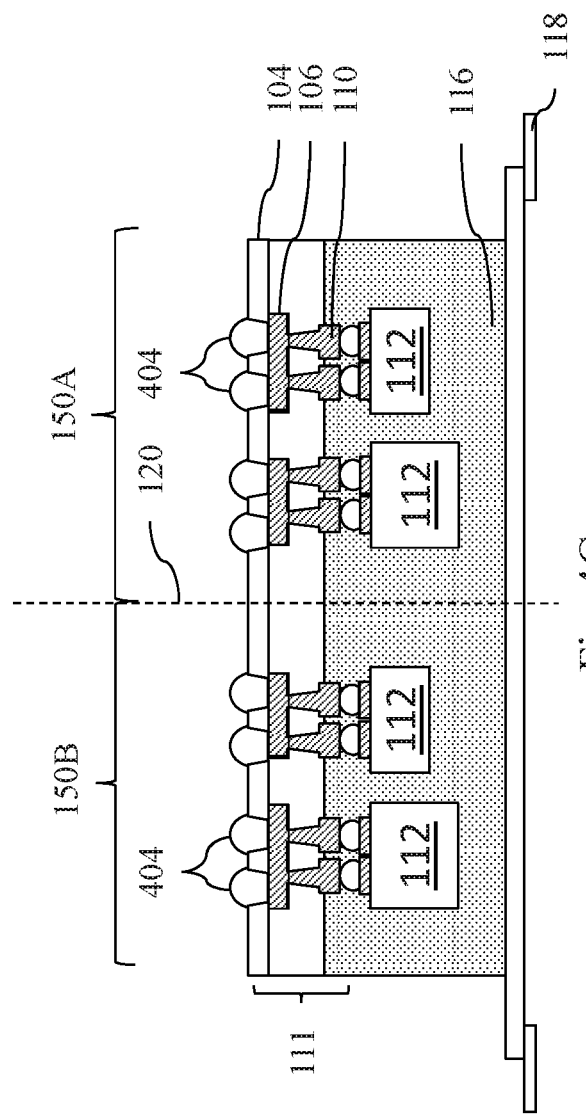

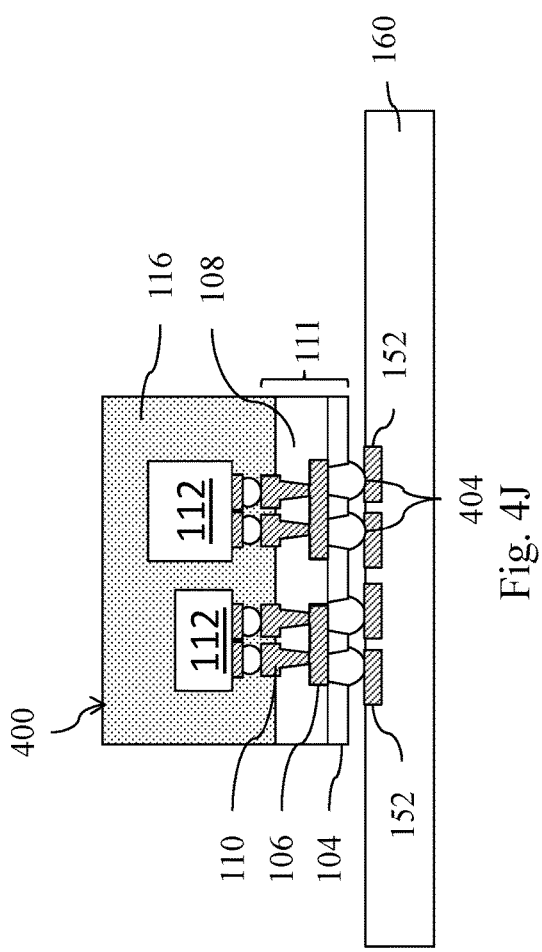
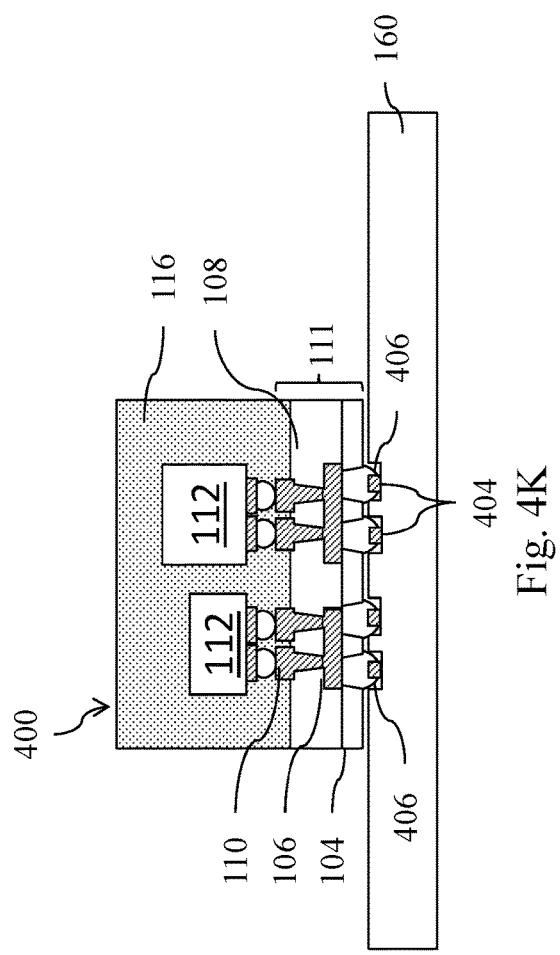

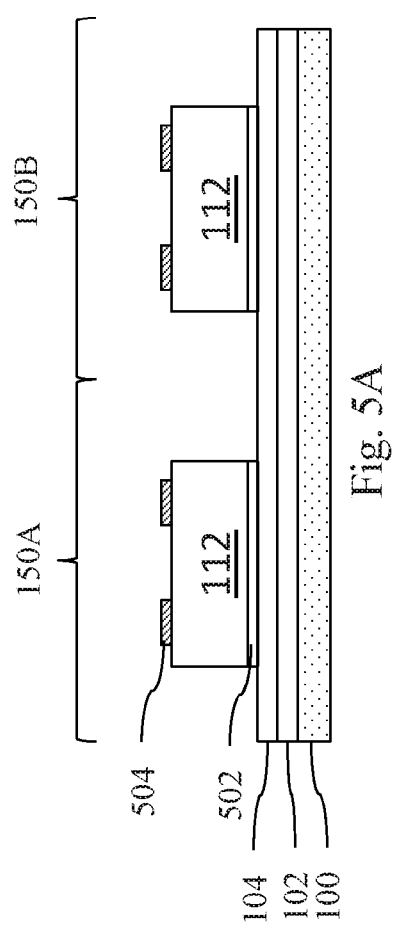
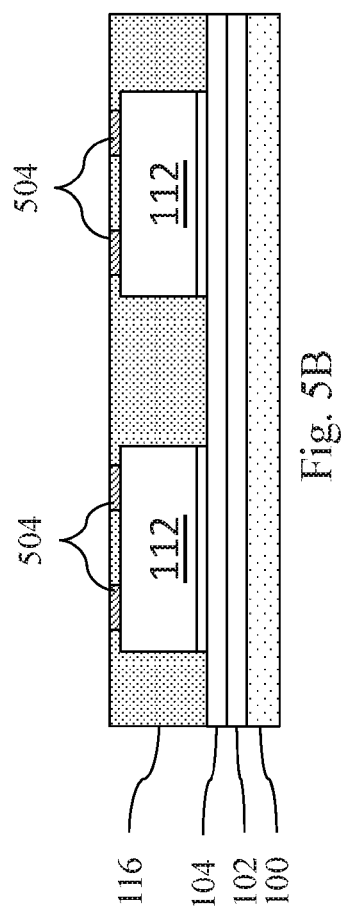

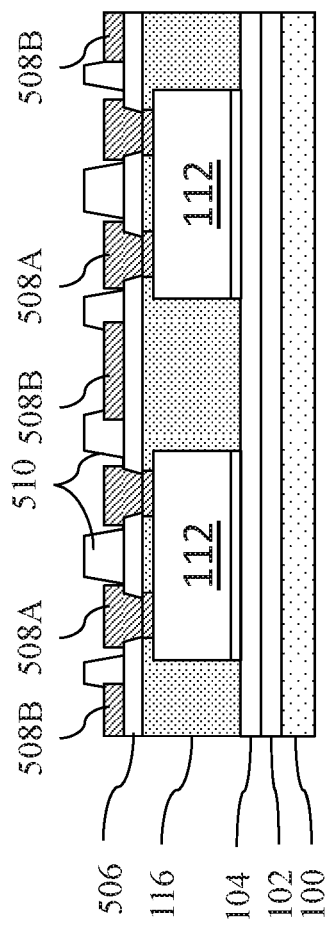
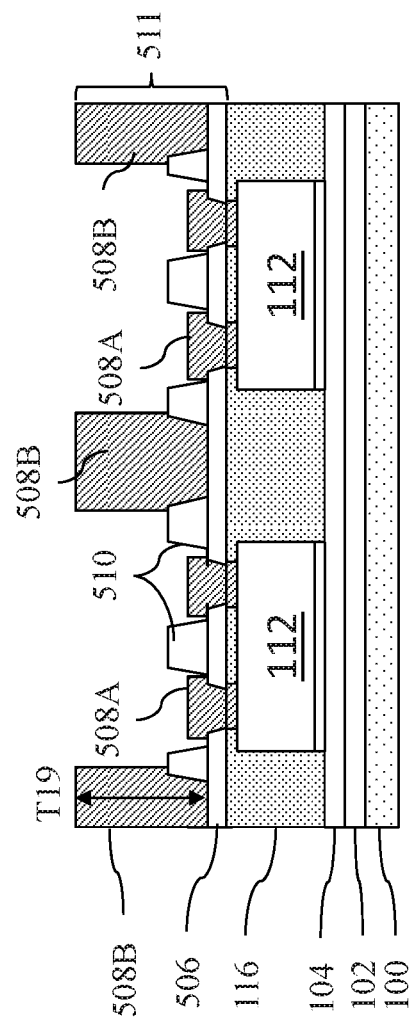

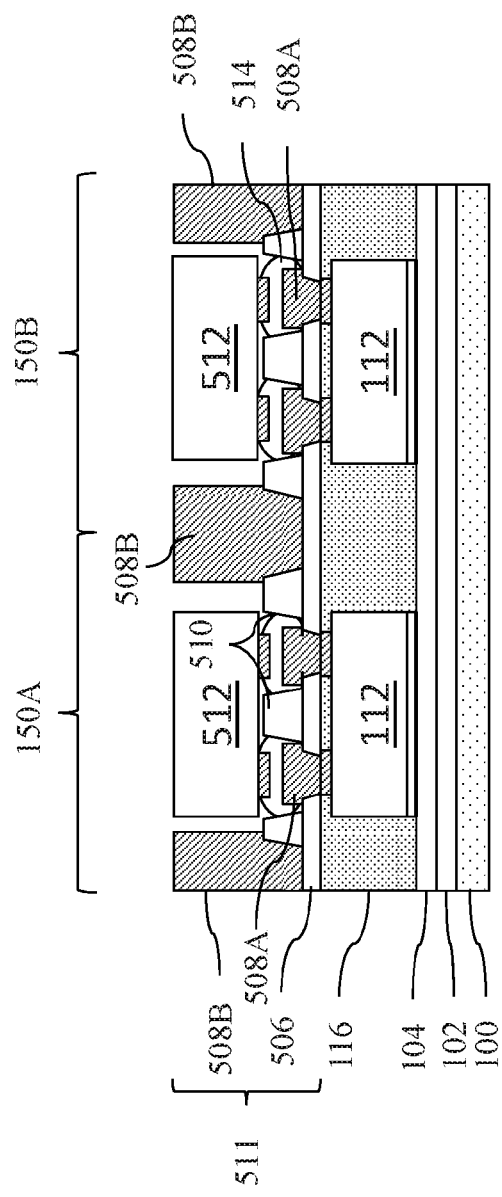
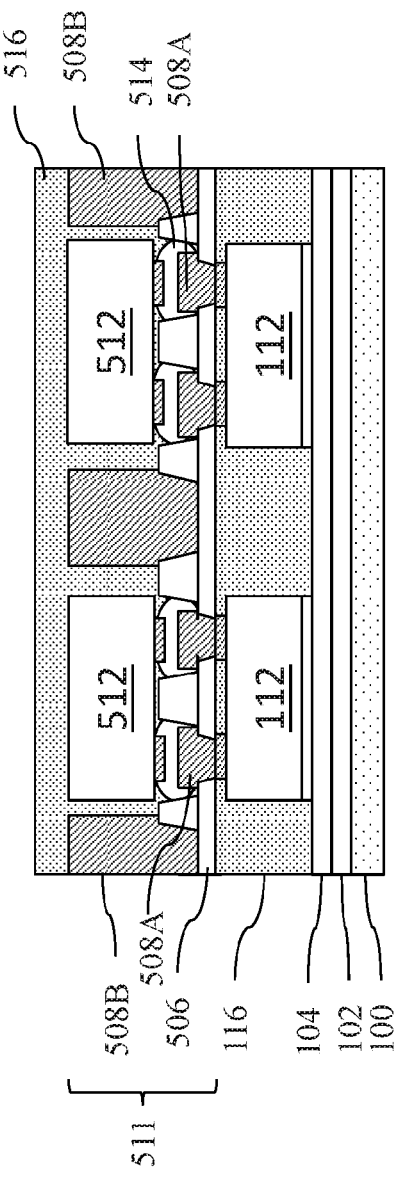

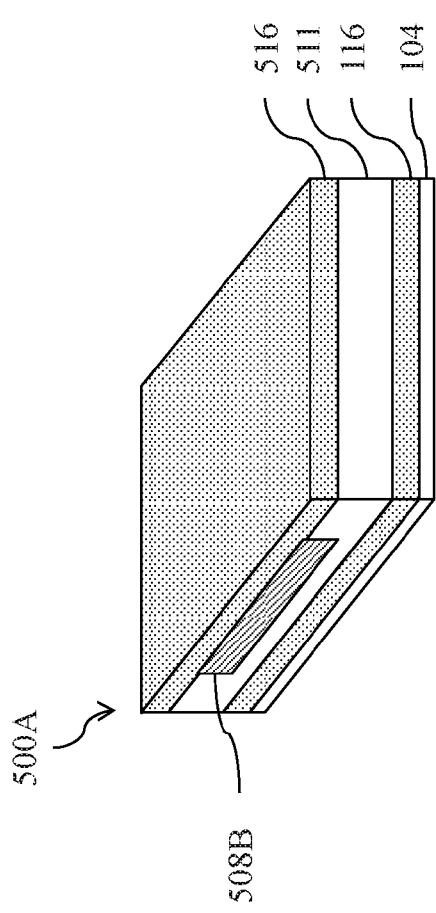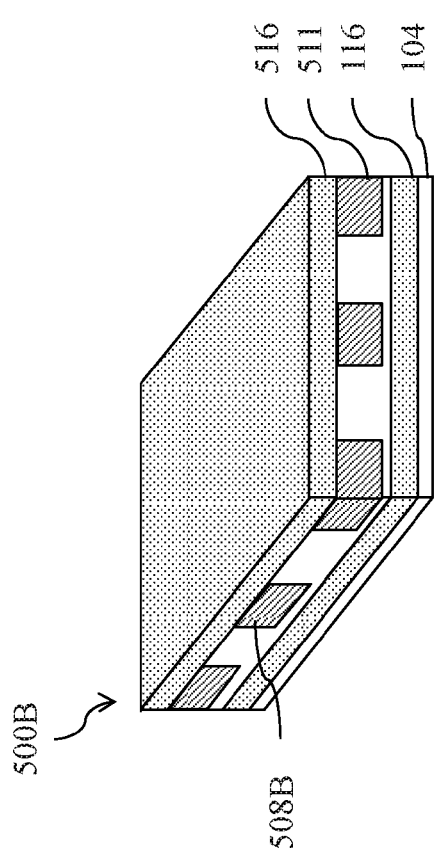

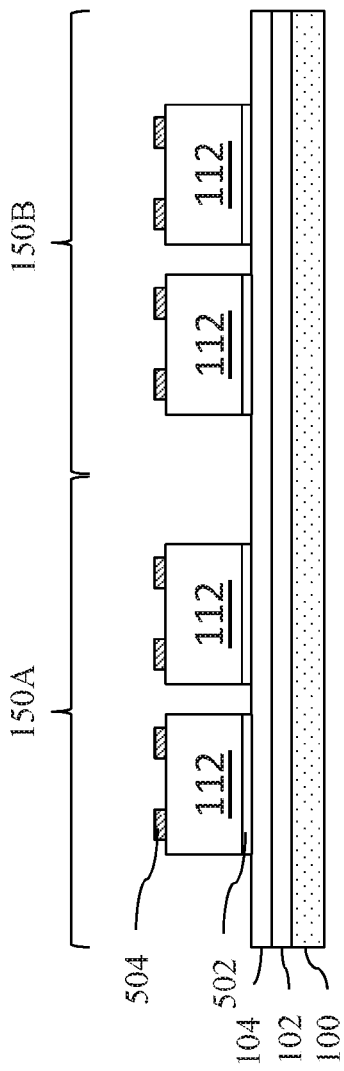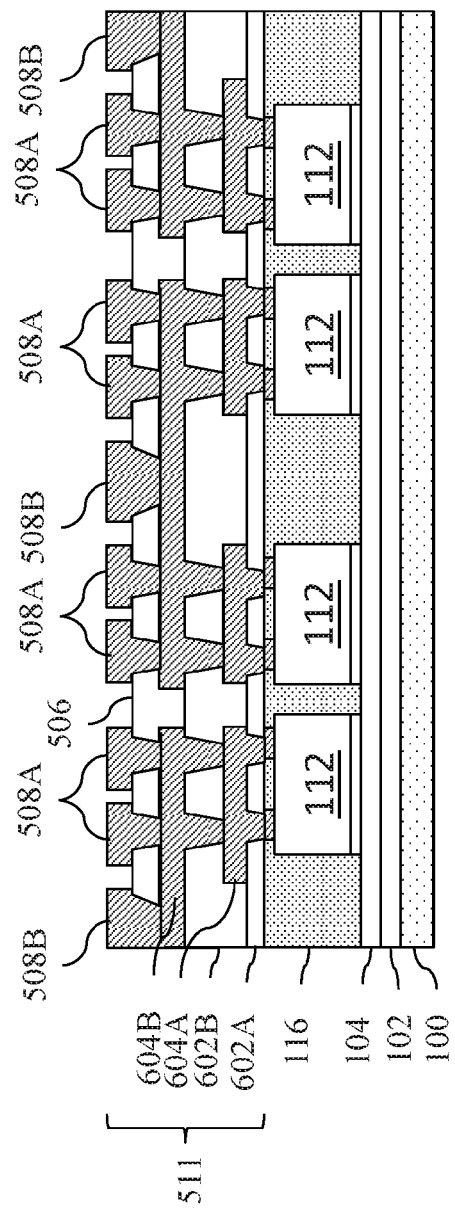

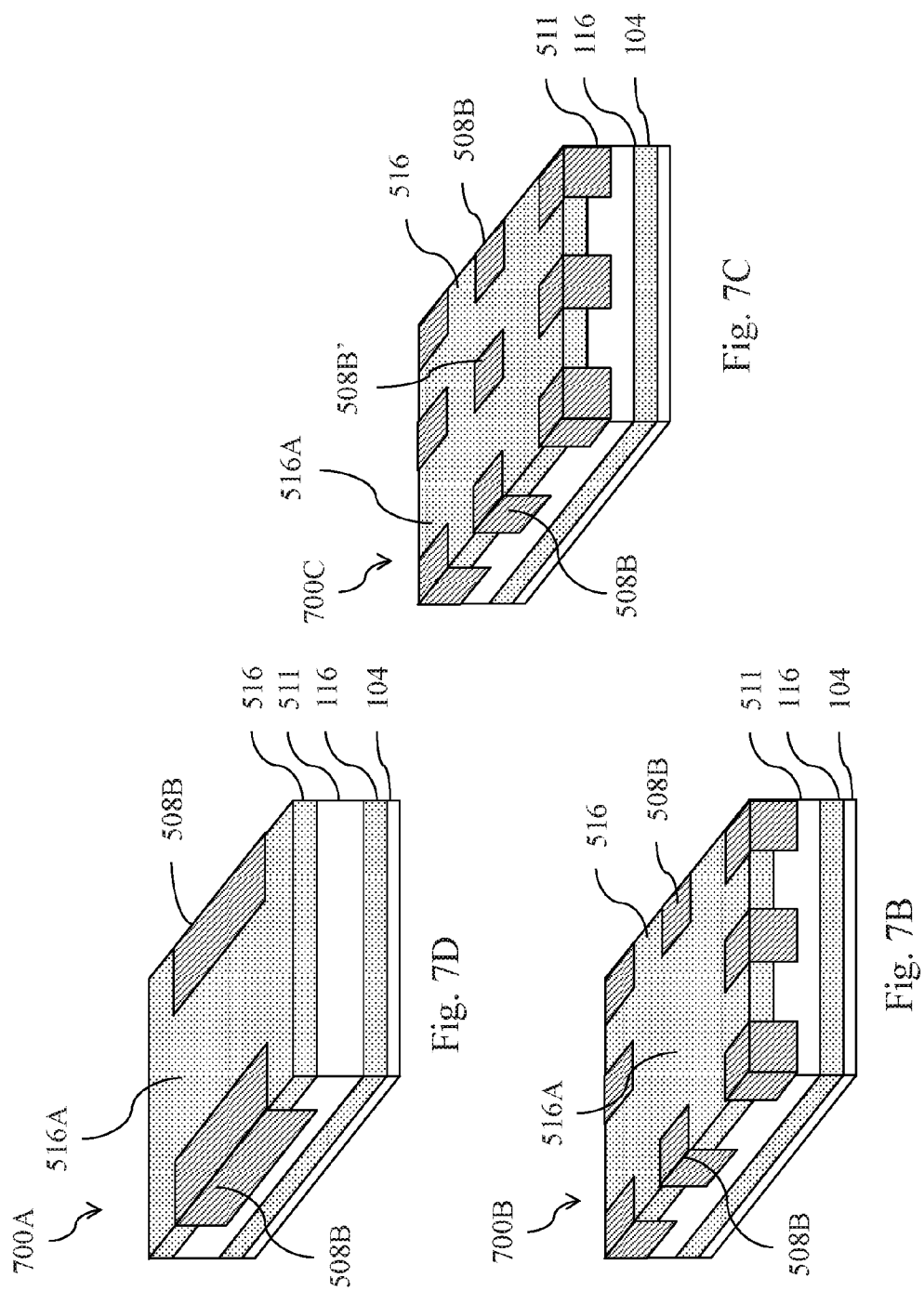

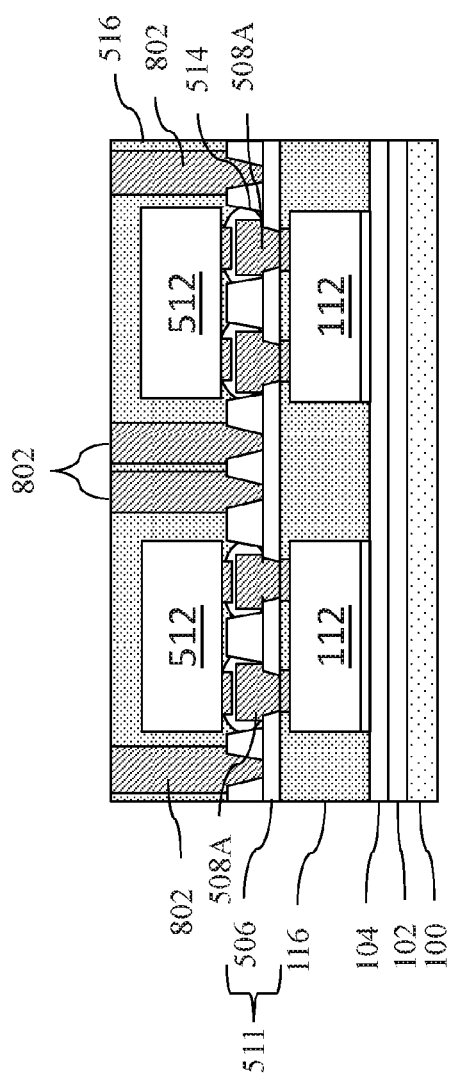
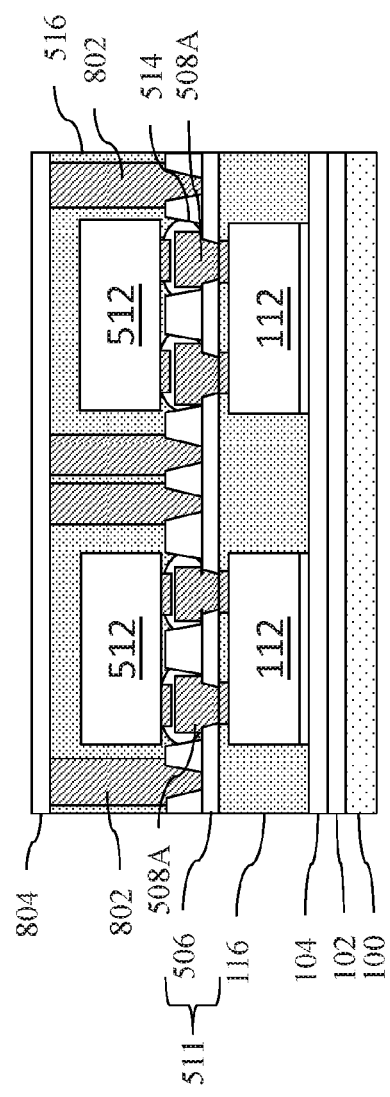
Fig. 8A
Fig. 8B

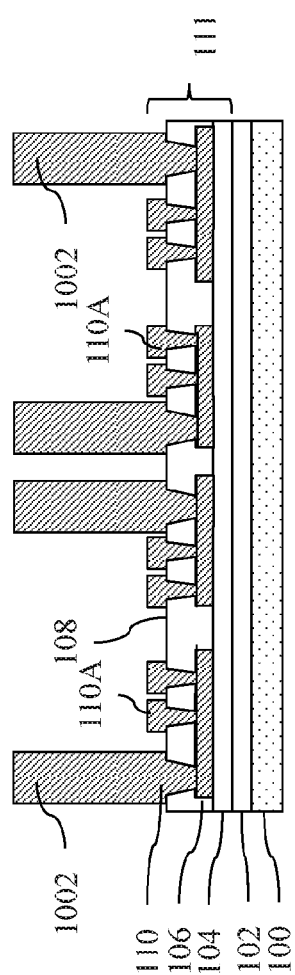
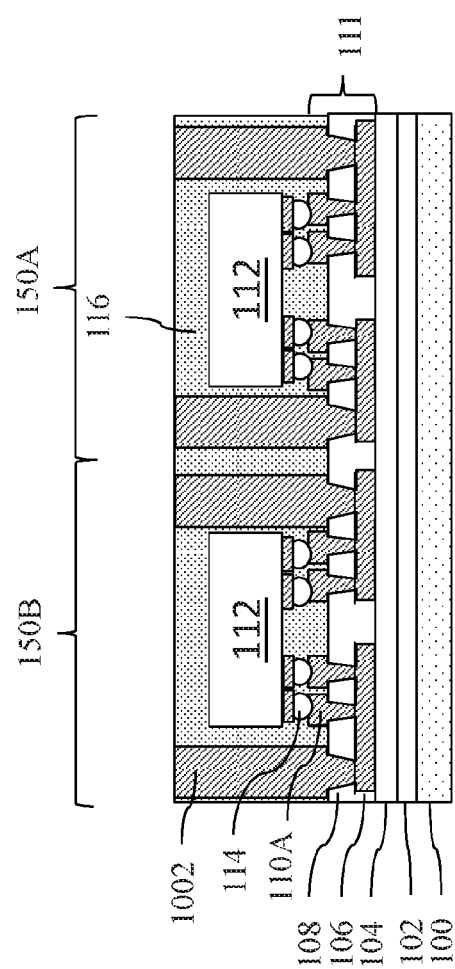
Fig. 10A
Fig. 10B

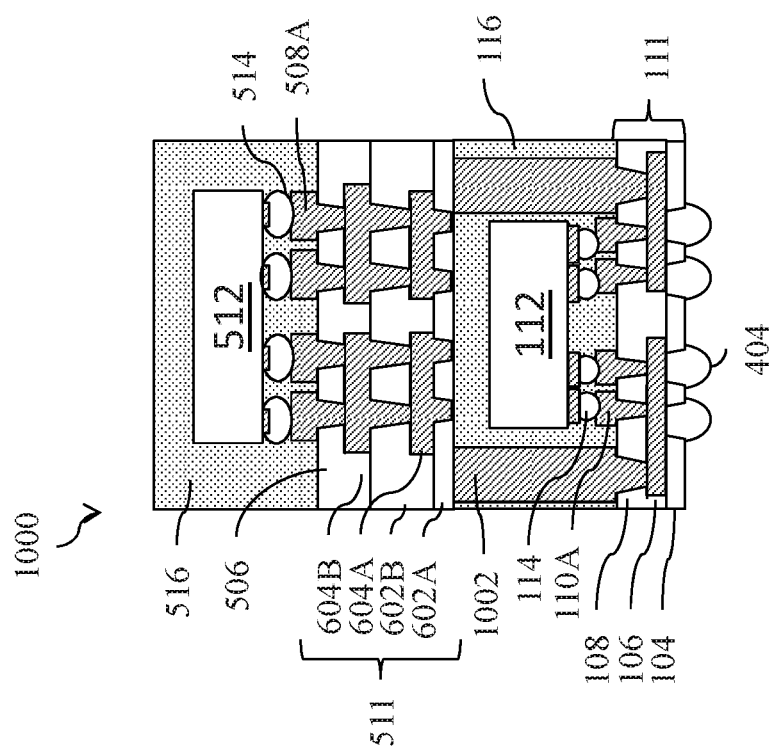

INTEGRATED PASSIVE DEVICE PACKAGE AND METHODS OF FORMING SAME

PRIORITY CLAIM AND CROSS-REFERENCE

This application claims the benefits of U.S. Provisional Application Ser. No. 62/293,724, filed on Feb. 10, 2016, which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components require smaller and more advanced packaging systems than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 1C, 1D, 1E, 1F, 1G, 1H, 1I, 1J, 1K, 1L, 1M, 1N, and 1O illustrate cross-sectional and top-down views of various intermediary stages of manufacturing an integrated passive device (IPD) package according to some embodiments;

FIGS. 2A, 2B and 2C illustrate cross-sectional and top-down views of an IPD package according to some other embodiments;

FIGS. 3A, 3B, 3C, 3D, 3E, 3F, 3G, 3H, 3I and 3J illustrate cross-sectional and top-down views of an IPD package according to some other embodiments;

FIGS. 4A, 4B, 4C, 4D, 4E, 4F, 4G, 4H, 4I, 4J and 4K illustrate cross-sectional and top-down views of an IPD package according to some other embodiments;

FIGS. 5A, 5B, 5C, 5D, 5E, 5F, 5G, 5H, 5I, 5J, 5K, 5L and 5M illustrate cross-sectional and top-down views of an IPD package according to some other embodiments;

FIGS. 6A, 6B, 6C, 6D and 6E illustrate cross-sectional and top-down views of an IPD package according to some other embodiments;

FIGS. 7A, 7B, 7C, 7D, 7E and 7F illustrate cross-sectional and top-down views of an IPD package according to some other embodiments;

FIGS. 8A, 8B, 8C, 8D, 8E, 8F and 8G illustrate cross-sectional and top-down views of an IPD package according to some other embodiments;

FIGS. 10A, 10B, 10C, 10D, 10E, 10F and 10G illustrate cross-sectional and top-down views of an IPD package according to some other embodiments.

DETAILED DESCRIPTION

Figure 1J:
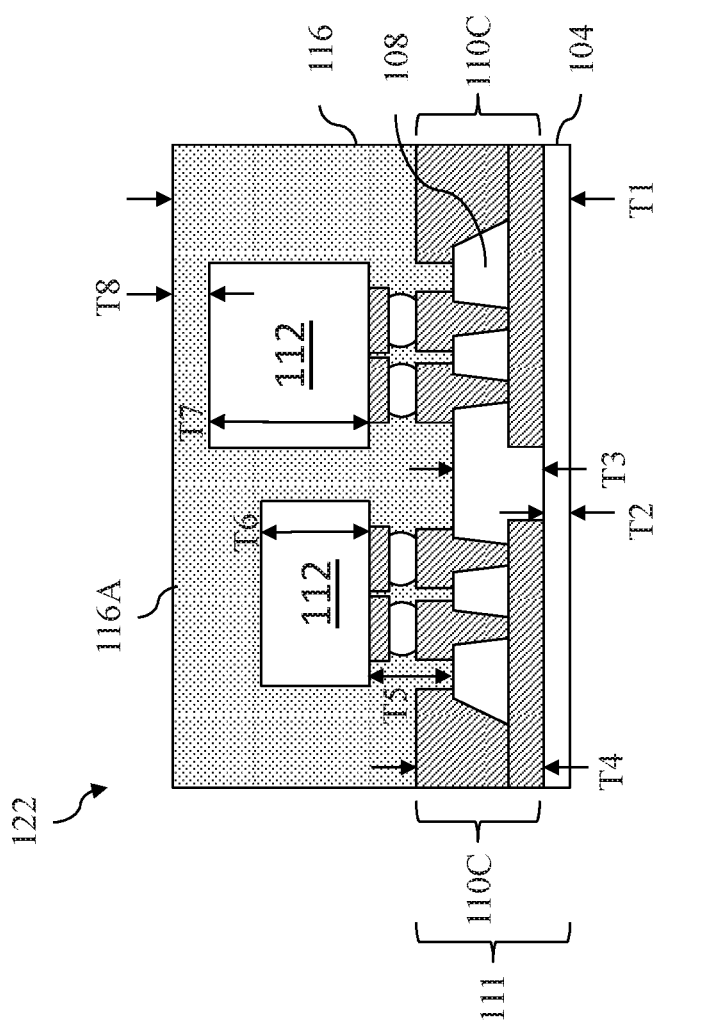

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described within a specific context, namely an integrated passive device (IPD) package having passive device dies. However, various embodiments may also be applied to other types of packages, such as packages having active device dies.

IPD packages are provided in accordance with various exemplary embodiments. Some variations of some embodiments are discussed. Throughout the various views and illustrative embodiments, like reference numbers are used to designate like elements.

Various embodiments include packages incorporating multiple encapsulated dies, such as passive device dies. Embodiments may include one or more of the following non-limiting features: homogeneous or heterogeneous passive devices integration; multiple layers of vertically stacked dies; reduced percentage of area on a printed circuit board (PCB) occupied by passive devices; package thicknesses of less than about 150 µm for packages having one layer of dies; and package thicknesses of less than about 250 µm for packages having multiple layers of stacked dies. Embodiments may further provide one or more of the following non-limiting advantages: customizable designs for device packages; application-specific integration of dies; lower cost; smaller form factor; surface-mount technology (SMT) compatible designs; known good IPD packages; providing two-terminal and multi-terminal IPD packages using the same general manufacturing platform; packages having multiple layer (e.g., two or more layers) of stacked dies; reduced parallel connection of capacitors; reduced parasitic effect and improved electrical performance; and additional space on PCBs for other modules (e.g., portable devices) and/or batteries.

FIGS. 1A through 1O illustrate cross-sectional and top-down views of various intermediary stages of manufacturing an IPD package according to some embodiments. FIG. 1A illustrates a carrier substrate 100 and a release layer 102 formed on carrier substrate 100. Carrier 100 includes at least two die placement regions 150 (labeled 150A and 150B). As will be described in greater detail below, features are formed on carrier 100 in various die placement regions 150, and features in each die placement region 150 are subsequently singulated from other features on carrier 100. Thus, multiple packages can be formed simultaneously.

Carrier substrate 100 may be a glass carrier substrate, a ceramic carrier substrate, or the like. Carrier substrate 100 may be a wafer, such that multiple IPD packages can be formed on the carrier substrate 100 simultaneously. Release layer 102 may be formed of a polymer-based material, which may be removed along with carrier substrate 100 from the overlying structures that will be formed in subsequent steps. In some embodiments, release layer 102 is an epoxy-based thermal-release material, which loses its adhesive property when heated, such as a Light-to-Heat-Conversion (LTHC) release coating. In other embodiments, release layer 102 may be an ultra-violet (UV) glue, which loses its adhesive property when exposed to UV lights. Release layer 102 may be dispensed as a liquid and cured or may be a laminate film laminated onto carrier substrate 100. The top surface of release layer 102 may be leveled and may have a high degree of co-planarity.

As illustrated in FIG. 1A, a dielectric layer 104 is formed on release layer 102. The bottom surface of dielectric layer 104 may be in contact with the top surface of release layer 102. In some embodiments, dielectric layer 104 is formed of a polymer, such as polybenzoxazole (PBO), polyimide, benzocyclobutene (BCB), or the like. In other embodiments, dielectric layer 104 is formed of a nitride such as silicon nitride; an oxide such as silicon oxide, phosphosilicate glass (PSG), borophosphosilicate glass (BPSG), fluorosilicate glass (FSG); or the like. Other materials may be used as well. Dielectric layer 104 may be formed by any acceptable deposition process, such as spin coating, chemical vapor deposition (CVD), laminating, the like, or a combination thereof.

As illustrated in FIG. 1B, conductive features 106 are formed on dielectric layer 104. As an example to form conductive features 106, a seed layer (not shown) is formed over dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to pattern of conductive features 106. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form conductive features 106 as illustrated. In some embodiments, conductive features 106 are conductive lines, which provide, for example, power, ground, and/or signal lines to subsequently attached dies. Conductive features 106 may further extend to an outer perimeter of dielectric layer 104 in order to provide input/output (I/O) contacts on sidewalls of the completed package as explained in greater detail below.

In FIG. 1C, a dielectric layer 108 is formed on conductive features 106 and dielectric layer 104. In some embodiments, dielectric layer 108 is formed of a polymer, which may be a photo-sensitive material such as PBO, polyimide, BCB, or the like, that may be patterned using a lithography mask. In other embodiments, dielectric layer 108 is formed of a nitride such as silicon nitride; an oxide such as silicon oxide, PSG, BSG, or BPSG; or the like. Dielectric layer 108 may be formed by spin coating, lamination, CVD, the like, or a combination thereof.

In FIG. 1D, dielectric layer 108 is then patterned. The patterning forms openings to expose portions of conductive features 106. The patterning may be by an acceptable process, such as by exposing dielectric layer 108 to light when dielectric layer 108 is a photosensitive material or by etching using, for example, an anisotropic etch. If dielectric layer 108 is a photosensitive material, dielectric layer 108 can be developed after the exposure.

In FIG. 1E, conductive features 110 (e.g., including contact pads 110A and I/O contacts 110C) with vias (e.g., conductive vias 110B) are formed on dielectric layer 108. As an example to form conductive features, a seed layer (not shown) is formed over dielectric layer 108 and in openings through dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to conductive features 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The remaining portions of the seed layer and conductive material form contact pads 110A, conductive vias 110B, and I/O contacts 110C. Contact pads 110A may be used as bond pads for bonding dies (see FIG. 1F) in subsequent process steps. Conductive vias 110B are formed in openings through dielectric layer 108 to electrically connect contact pads 110A to, e.g., conductive features 106. I/O contacts 110C may be used to subsequently bond the completed package to another device feature, such as a printed circuit board. At least a portion of contacts 110C are disposed at an outer perimeter of carrier 100 in order to provide contacts at sidewalls of the completed package as explained in greater detail below. Thus, redistribution layers (RDLs) 111 are formed.

FIG. 1F illustrates dies 112 bonded to contact pads 110A using, for example, connectors 114. In some embodiments, connectors 114 are solder balls, such as microbumps, controlled collapse chip connection (C4) bumps, ball grid array (BGA) balls, or the like. A plurality of dies 112 is placed in each die placement region 150A and 150B. Although only two dies are illustrated as being placed in each region 150A/150B, embodiments may include any number of dies (e.g., greater than two) in each die placement region 150. Thicknesses of dies 112 (e.g., as measured between top and bottom surfaces) may or may not be the same. Dies 112 may include all passive device dies, all active device dies, or a combination thereof. In an embodiment, all dies in the completed package are passive device dies substantially free of any active regions. In other embodiments, a combination of active and passive device dies may be included in a package.

Embodiment passive device dies include one or more passive devices, such as, capacitors, resistors, transformers, inductors, combinations thereof, and the like. Generally, passive device dies may be substantially free of any active semiconductor regions, and thus, passive device dies may be free of any transistors or diodes. Embodiment passive device dies may provide only a single, discrete passive device or multiple passive devices may be formed within a single die.

Embodiment active device dies may include a substrate, active devices, and an interconnect structure (not separately individually illustrated). The substrates of active device dies may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the active device die substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, diodes, photo-diodes, and the like may be formed at the top surface of the active device substrates. In some embodiments, passive devices (e.g., capacitors, resistors, fuses, and the like), may also be included at the top surface of the active device substrate or in overlying interconnect structures. Interconnect structures may be formed over the active devices and the substrates. The interconnect structures may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structures electrically connect various active devices to form functional circuits the active device dies. The functions provided by such circuits may include memory structures, processing structures, sensors, amplifiers, power distribution, input/output circuitry, or the like. One of ordinary skill in the art will appreciate that the above examples are provided for illustrative purposes only to further explain applications various embodiments and are not meant to limit the embodiments in any manner. Other circuitry may be used as appropriate for a given application.

I/O and passivation features may be formed over the interconnect structure of each active device die. For example, contact pads may be formed over the interconnect structure and may be electrically connected to the active devices through the various conductive features in the interconnect structure. The contact pads may comprise a conductive material such as aluminum, copper, and the like. Furthermore, one or more passivation layers may be formed over the interconnect structures and the contact pad. In some embodiments, the passivation layers may be formed of non-organic materials such as silicon oxide, un-doped silicate glass, silicon oxynitride, and the like. Other suitable passivation materials may also be used. Portions of the passivation layers may cover edge portions of the contact pads. Additional interconnect features, such as additional passivation layers, conductive pillars, and/or under bump metallurgy (UBM) layers, may also be optionally formed over the contact pads.

The various features of dies 112 may be formed by any suitable method and are not described in further detail herein. Furthermore, the general features and configuration of dies 112 described above are but one example embodiment, and dies 112 may include any combination of any number of the above features as well as other features.

Dies 112 are electrically connected to conductive features 106 by conductive features 110. In an embodiment where dies 112 include only passive device dies, conductive features 106 provide power lines and ground lines to dies 112. For example, FIG. 1G provides a top-down view of an example layout for conductive features 106 in a die placement region 150. The locations of connectors 114 are provided in FIG. 1G for reference. As illustrated by FIG. 1G, conductive features 106 includes a first portion 106A and a second portion 106B interlaced with first portion 106A. First portion 106A may be E-shaped while second portion 106B resembles a sideways U. In an embodiment, first portion 106A provides a power line while second portion 106B provides a ground line. In another embodiment, first portion 106A provides a ground line while second portion 106B provides a power line. Other configurations of conductive features 106 may be used in other embodiments. Furthermore, when dies 112 include active device dies, conductive features 106 may further include on or more signal lines.

In FIG. 1H, the various components are encapsulated in a molding compound 116. In embodiments, molding compound 116 comprises an epoxy, a resin, a moldable polymer such as PBO, a molded underfill (MUF), or another moldable material. Molding compound 116 may encircle dies 112 in a top-down view (not provided). In an embodiment, molding compound 116 may be applied by compression molding, transfer molding, or the like. In an embodiment, molding compound 116 may be applied to cover top surfaces of dies 112. Molding compound 116 may be applied in liquid form, and may be subsequently cured to provide a solid encapsulant.

In FIG. 1I, a carrier substrate de-bonding is performed to detach (de-bond) carrier substrate 100 from RDLs 111, e.g., dielectric layer 104. In accordance with some embodiments, the de-bonding includes projecting a light such as a laser light or an UV light on release layer 102 so that release layer 102 decomposes under the heat of the light and carrier substrate 100 can be removed. The structure is then flipped over and placed on a tape 118.

As further illustrated in FIG. 1I, a singulation process (not illustrated) may be performed along scribe lines 120, e.g., between adjacent regions 150 (labeled 150A and 150B). In the illustrated embodiment, scribe line 120 extends through conductive features 106 and 110. For example, scribe line 120 may extend through I/O contacts 110C. The sawing singulates packages in a region (e.g., region 150A) from other packages formed in other regions (e.g., region 150B). Because the sawing is along scribe line 120, the sawing may further cut through conductive features 106 and 110, such as I/O contacts 110C.

Singulation may be performed using any suitable process using, for example, a mechanical saw/blade, a laser, combinations thereof, or the like. In some embodiments, the singulation process may be selected in accordance with a thickness T4 of conductive features (e.g., a combination of conductive features 106 and 110) within RDL 111. For example, when thickness T4 is about 20 μm to about 30 μm, mechanical dicing, laser grooving, water-assisted laser cutting, or a combination thereof may be used for singulation. Mechanical dicing may include using a saw having a width greater than about 35 μm and may be advantageously selected as a low cost option with a relatively high wafer per hour (WPH) output. Laser grooving may include using a laser having a width of about 50 μm and may be advantageously selected for reduced manufacturing defects (e.g., reduced copper smear) and higher accuracy. Water-assisted laser cutting may include using a laser having a width of about 50 μm to about 80 μm and may be advantageously selected for reduced manufacturing defects (e.g., reduced copper smear) and higher accuracy with a relatively high wafer per hour (WPH) output. As another example, when thickness T4 is greater than about 100 μm, water-assisted laser cutting, routing machining, or a combination thereof may be used for singulation. Water-assisted laser cutting may include using a laser having a width of about 50 μm to about 80 μm and may be advantageously selected for reduced manufacturing defects (e.g., reduced copper smear) and higher accuracy with a relatively high wafer per hour (WPH) output. Routing machining may include using a router with blade(s) having a width of about 100 μm and may be advantageously selected for reduced manufacturing cost.

FIG. 1J illustrates the completed device package 122. Package 122 includes a plurality of dies 112 encapsulated in a molding compound 116. Fan-out RDLs 111 having conductive features (e.g., conductive features 106 and 110) are electrically connected to dies 112, and fan-out RDLs may extend laterally past edges of dies 112 to increase an area available for electrical routing to dies 112.

Package 122 has a thickness T1, which may be between about 120 μm to about 170 μm. For example, in an embodiment, thickness T1 is about 137 μm. In such embodiments, a thickness T2 of dielectric layer 104 may be about 7 μm; a thickness T3 of dielectric layer 108 may be about 10 μm; a thickness T4 of conductive features (e.g., the combination of conductive features 106 and 110) in RDLs 111 may be about 20 μm to about 30 μm; a thickness T5 of a distance between a bottom between of die 112 and a top surface of RDLs 111 may be about 30 μm; a thickness T6 of a first die 112 may be about 50 μm or greater; a thickness T7 of a second die 112 may be about 70 μm; and a thickness T8 between a top surface of the second die 112 and a top surface of molding compound 116 may be about 20 μm. In other embodiments, package 122 and/or the various features within package 122 may have other thickness, such as, greater than or less than the values provided.

Furthermore, as explained above, some conductive features (e.g., I/O contacts 110C) in RDLs 111 provide contact pads exposed at sidewalls of package 122. For example, because conductive features in RDLs 111 extend to an outer perimeter of package 122 (see FIG. 1G) and because the singulation process exposes a sidewall of conductive features in RDLs 110, I/O contacts 110C are exposed at sidewalls of package 122. For example, an exposed surface of I/O contacts 110C is substantially perpendicular to a top surface 116A of molding compound 116 (e.g., a surface 116A opposite RDLs 111). I/O contacts 110C may be disposed between dielectric layer 104 and molding compound 116.

In various embodiments, package 122 may include any number of I/O contacts. For example, FIG. 1K illustrates a perspective view of a package 122A having two I/O contacts 110C. One contact is illustrated in FIG. 1K, and the second contact may be disposed on an opposing side (not shown) of the package as the illustrated contact 110C. In an embodiment two-terminal device, a first I/O contact 110C provides a connection for power lines while a second I/O contact 110C provides a connection for ground lines. As another example, FIG. 1L illustrates a perspective view of a package 122B having more than two I/O contacts 110C. In package 122B, multiple I/O contacts 110C may be disposed on a side of the package. Furthermore, some contacts 110C may wrap around a corner of package 122B and are disposed on two sides of the package.

Figure 1M:
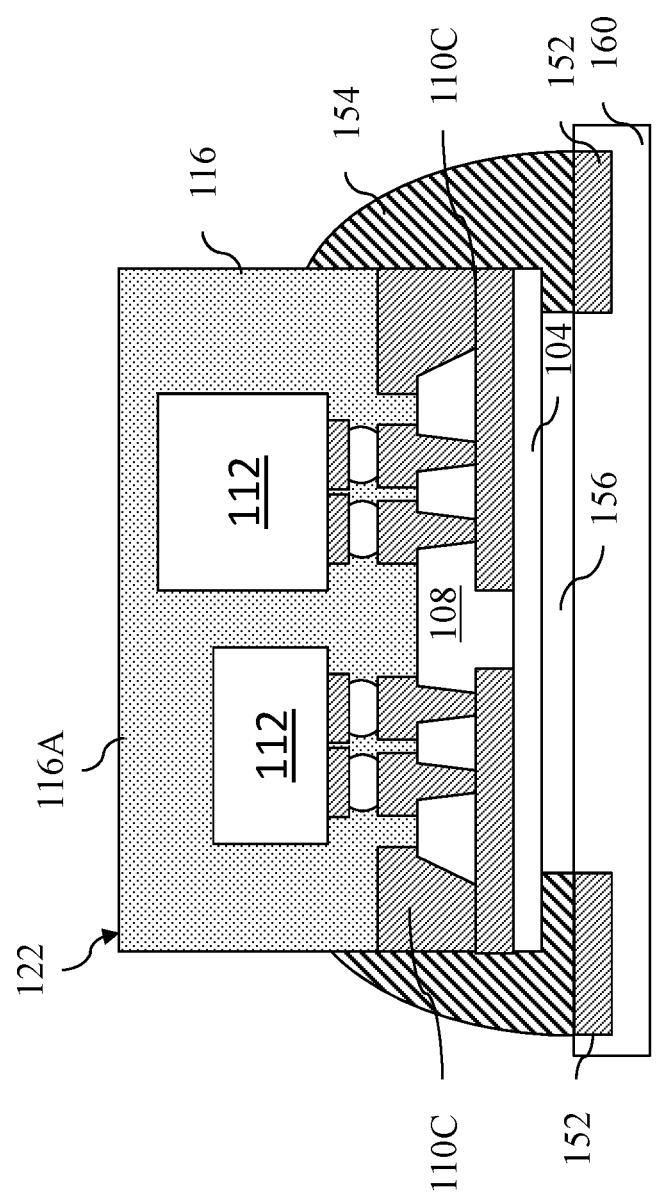

I/O contacts 110C may be used to electrically connect package 122 to another device feature. For example, FIG. 1M illustrates package 122 bonded to a substrate 160. In some embodiments, substrate 160 is another device package, a package substrate, a PCB substrate, an interposer, a motherboard, or the like. Substrate 160 may include conductive contact pads 152, and package 122 is bonded to substrate 160 by solder regions 154 on contact pads 152. In some embodiments, solder regions 154 (e.g., solder paste) are applied to contact pads 152, and package 122 is then aligned and placed on solder regions 154 using a pick-and-place tool. A reflow is subsequently performed to bond package 122 to substrate 160. After bonding, a spacing 156 (e.g., an air gap) may remain between package 122 and substrate 160. In other embodiments, spacing 156 is eliminated such that a bottom surface of package 122 contacts a top surface of substrate 160.

Solder region 154 may extend along sidewalls of package 122 to electrically connect to I/O contacts 110C at sidewalls of package 122. For example, FIG. 1N provides a top-down view of conductive features 106 and solder regions 154 on sidewalls of I/O contacts 110C. The configuration of FIG.

1N may be similar to the configuration described with respect to FIG. 1G where like reference numerals indicate like elements. FIG. 1O illustrates an alternative configuration for conductive features 106 where a first portion 106A of conductive features 106 is a mirror image (across both horizontal and vertical axes) of a second portion 106B of conductive features 106B. In FIG. 1O, solder regions 154 are illustrated for reference.

Figure 2A:
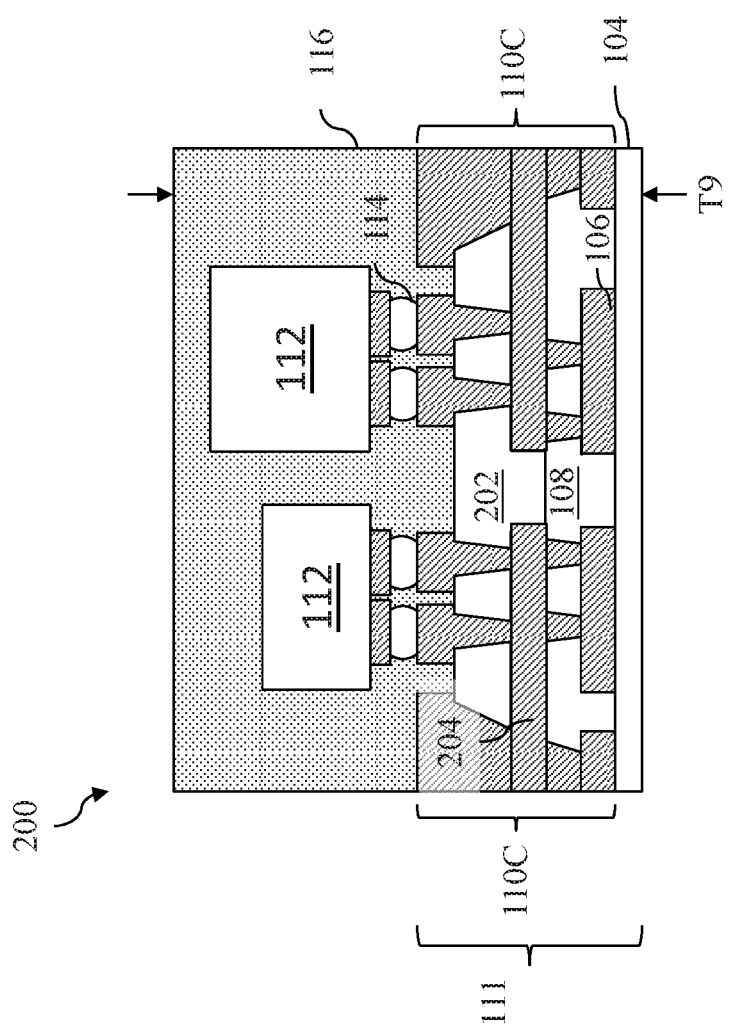

Referring back to FIG. 1J, package 122 includes one layer of redistribution lines (e.g., conductive features 106) to provide power, ground, and/or signal lines in the provided package. Other embodiments may include packages having more than one layer of redistribution lines, such as two layers or more than two layers. For example, FIG. 2A illustrates a cross-sectional view of a package 200 having multiple layers of redistribution lines. Package 200 may be similar to package 122 where like reference numerals indicate like elements. However, package 200 includes at least an additional layer of redistribution lines, such as conductive features 204 disposed in a dielectric layer 202. Conductive features 204 and dielectric layer 202 may be similar to conductive features 106 and dielectric layer 108 (both in material and formation method).

For example, conductive features 204 with vias are formed on dielectric layer 108. As an example to form conductive features 204, openings are patterned through dielectric layer 108 to expose underlying conductive features 106. A seed layer (not shown) is formed over dielectric layer 108 and in openings through dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to conductive features 204. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form contact conductive features 204.

Subsequently, a dielectric layer 202 is formed on conductive features 204 and dielectric layer 108. In some embodiments, dielectric layer 202 is formed of a polymer, which may be a photo-sensitive material such as PBO, polyimide, BCB, or the like, that may be patterned using a lithography mask. In other embodiments, dielectric layer 108 is formed of a nitride such as silicon nitride; an oxide such as silicon oxide, PSG, BSG, or BPSG; or the like. Dielectric layer 202 may be formed by spin coating, lamination, CVD, the like, or a combination thereof.

Dielectric layer 202 is then patterned. The patterning forms openings to expose portions of conductive features 204. The patterning may be by an acceptable process, such as by exposing dielectric layer 202 to light when dielectric layer 202 is a photosensitive material or by etching using, for example, an anisotropic etch. If dielectric layer 202 is a photosensitive material, dielectric layer 202 can be developed after the exposure. Conductive features 110 may then be formed on patterned dielectric layer 202 using a similar process as explained above.

Conductive features 204 provide additional flexibility in routing layout design. For example, FIGS. 2B and 2C illustrate top-down views of conductive features 106 and conductive features 204 in package 200, respectively. In embodiments where dies 112 are passive device dies, conductive features 106 and 204 may provide power lines and ground lines. In one embodiment, conductive pattern 206 provides power lines while conductive pattern 208 provides ground lines. In another embodiment, conductive pattern 206 provides ground lines while conductive pattern 208 provides power lines. In conductive features 106, conductive pattern 206 is substantially rectangular with through holes 210 disposed there-through. Conductive pattern 208 are disposed in through holes 210, and may be insulated from conductive pattern 206 (e.g., by a portion of dielectric layer 108 in through hole 210). Conductive pattern 206 may further include vias for routing to upper conductive features 204, and the location of such vias are illustrated by dashed lines 206'. In conductive features 204, conductive pattern 208 is substantially rectangular with through holes 212 disposed there-through. Conductive pattern 206 are disposed in through holes 212, and may be insulated from conductive pattern 208 (e.g., by a portion of dielectric layer 202 in through hole 212). Conductive pattern 208 may further include vias for routing to lower conductive features 206, and the location of such vias are illustrated by dashed lines 208'. In other embodiments, the conductive features in RDLs 111 may have other configurations.

Figure 3E:
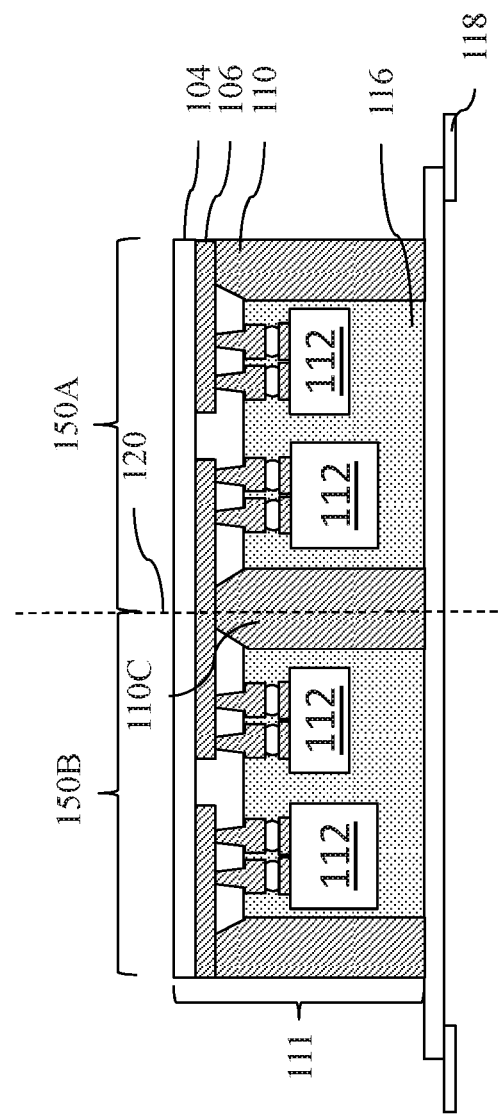

FIGS. 3A through 3G illustrates cross-sectional and perspective views of various intermediary stages of manufacturing a device package according to various other embodiments. FIG. 3A illustrates a carrier substrate 100, a release layer 102, and RDLs 111 formed over release layer 102. RDLs 111 may include dielectric layer 104, conductive feature 106 (e.g., conductive lines), dielectric layer 108, and conductive features 110 (e.g., contact pads 110A, vias 110B, and I/O contacts 110C). The various features of FIG. 3A may be similar to the features of package 122 (see FIG. 1J) where like reference numerals indicate like elements. Furthermore, various process steps similar to those described above with respect to FIGS. 1A through 1E may be used to arrive at the structure illustrated in FIG. 3A. Thus, further description of these processes is omitted for brevity. Although FIG. 3A illustrate RDLs 111 having one layer of conductive lines (e.g., conductive features 106), other embodiments may include any number of conductive lines (e.g., as described with respect to FIG. 2A). Conductive features in RDLs 111 may have any suitable pattern, such as the patterns described with respect to FIGS. 1G, 1O, 2B, 2C, or the like.

In FIG. 3B, I/O contacts 110C are extended to a height T10. For example, additional conductive material is formed on I/O contacts 110C. As an example to form the additional conductive material, a seed layer (not shown) is formed over I/O contacts 110C. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. In other embodiments, I/O contacts 110c are used as the seed layer, and separate seed layer is not deposited. A photoresist is then formed and patterned on the seed layer. The photoresist may be formed by spin coating or the like and may be exposed to light for patterning. The pattern of the photoresist corresponds to I/O contacts 110c, and the photoresist may mask contact pads 110A. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and optionally portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form I/O contacts 110C. I/O contacts 110C have a total thickness T10 (e.g., a combination of the additional conductive material, conductive features 110, and conductive features 106) of about 110 μm to about 160 μm.

FIG. 3C illustrates dies 112 bonded to contact pads 110A using, for example, connectors 114. Dies 112 may be disposed between adjacent I/O contacts 110C. In some embodiments, connectors 114 are solder balls, such as microbumps, C4 bumps, BGA balls, or the like. A plurality of dies 112 is placed in each die placement region 150A and 150B. Furthermore, although only two dies are illustrated as being placed in each region 150A/150B, embodiments may include any number of dies (e.g., greater than two) in each die placement region 150. Thicknesses of dies 112 (e.g., as measured between top and bottom surfaces) may or may not be the same. Dies 112 may include all passive device dies, all active device dies, or a combination thereof.

Dies 112 are electrically connected to conductive features in RDLs 111 (e.g., conductive features 106) by conductive features 110. In an embodiment where dies 112 include only passive device dies, conductive features in RDLs 111 (e.g., conductive features 106) provide power lines and ground lines to dies 112. For example, conductive features in RDLs 111 (e.g., conductive features 106) may have a pattern as described with respect to FIGS. 1G, 1O, 2B, and/or 2C.

In FIG. 3D, the various components are encapsulated in a molding compound 116. In embodiments, molding compound 116 comprises an epoxy, a resin, a moldable polymer such as PBO, a MUF, or another moldable material. Molding compound 116 may encircle dies 112 in a top-down view (not provided). In an embodiment, molding compound 116 may be applied by compression molding, transfer molding, or the like. In an embodiment, molding compound 116 may be applied to cover top surfaces of dies 112. Molding compound 116 may be applied in liquid form, and may be subsequently cured to provide a solid encapsulant. After curing, a planarization process (e.g., a chemical mechanical polish (CMP), mechanical grinding, or the like) may be applied on molding compound 116 to expose I/O contacts 110C. After planarization, top surfaces of molding compound 116 and I/O contacts 110C may be substantially level.

In FIG. 3E, a carrier substrate de-bonding is performed to detach (de-bond) carrier substrate 100 from RDLs 111, e.g., dielectric layer 104. In accordance with some embodiments, the de-bonding includes projecting a light such as a laser light or an UV light on release layer 102 so that release layer 102 decomposes under the heat of the light and carrier substrate 100 can be removed. The structure is then flipped over and placed on a tape 118.

As further illustrated in FIG. 3E, a singulation process (not illustrated) may be performed along scribe lines 120, e.g., between adjacent regions 150 (labeled 150A and 150B). In the illustrated embodiment, scribe line 120 extends through conductive features 106 and 110. For example, scribe line 120 may extend through I/O contacts 110C. The sawing singulates packages in a region (e.g., region 150A) from other packages formed in other regions (e.g., region 150B). Because the sawing is along scribe line 120, the sawing may further cut through conductive features 106 and 110, such as I/O contacts 110C. Singulation may be performed using any suitable process using, for example, a mechanical saw/blade, a laser, combinations thereof, or the like. In some embodiments, the singulation process may be selected in accordance with a thickness T10 of conductive features (e.g., a combination of conductive features 106 and 110) within RDL 111 as described above.

Figure 3F:
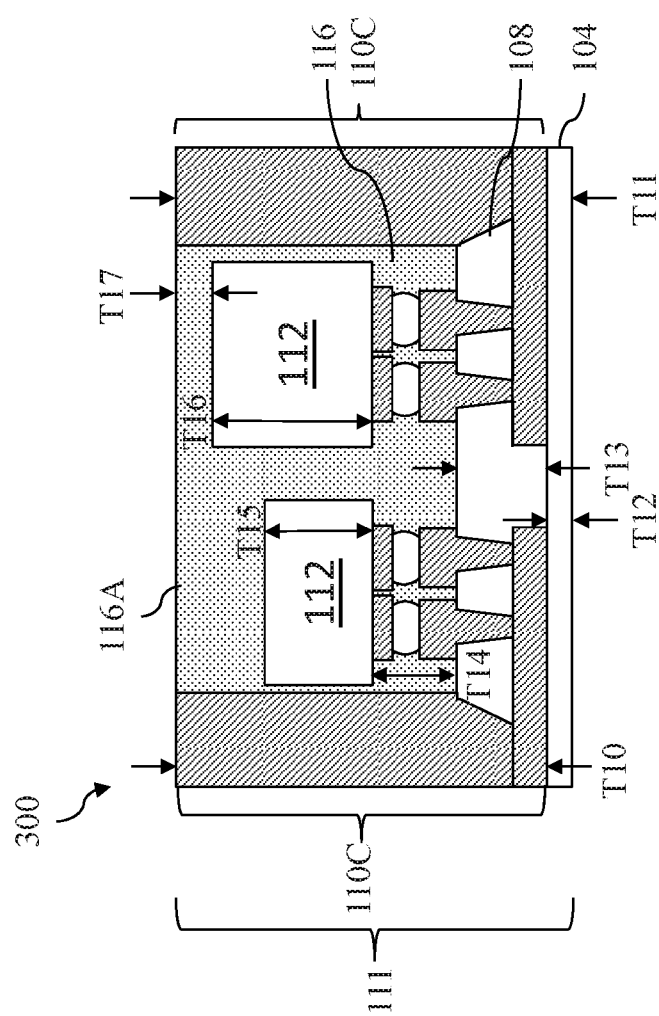

FIG. 3F illustrates the completed device package 300. Package 300 includes a plurality of dies 112 encapsulated in a molding compound 116. Fan-out RDLs 111 having conductive features (e.g., conductive features 106 and 110) are electrically connected to dies 112, and fan-out RDLs may extend laterally past edges of dies 112 to increase an area available for electrical routing to dies 112.

Package 300 has a thickness T11, which may be between about 120 μm to about 170 μm. In such embodiments, a thickness T12 of dielectric layer 104 may be about 7 μm; a thickness T13 of dielectric layer 108 may be about 10 μm; a thickness T10 of conductive features (e.g., the combination of conductive features 106 and 110) in RDLs 111 may be about 20 μm to about 30 μm; a thickness T14 of a distance between a bottom between of die 112 and a top surface of RDLs 111 may be about 30 μm; a thickness T15 of a first die 112 may be about 50 μm or greater; a thickness T16 of a second die 112 may be about 70 μm; and a thickness T17 between a top surface of the second die 112 and a top surface of molding compound 116 may be about 20 μm. In other embodiments, package 300 and/or the various features within package 300 may have other thickness, such as, greater than or less than the values provided.

Furthermore, as explained above, some conductive features (e.g., I/O contacts 110C) in RDLs 111 provide contact pads exposed at sidewalls of package 122. For example, I/O contacts 110C are exposed at sidewalls of package 122. An exposed surface of I/O contacts 110C is substantially perpendicular to a top surface 116A of molding compound 116 (e.g., a surface 116A opposite RDLs 111). I/O contacts 110C may further extend to top surface 116A of molding compound 116. Thus, I/O contacts 110C are exposed on at least two sides (e.g., a sidewall and top surface) of package 300.

Figure 3G:
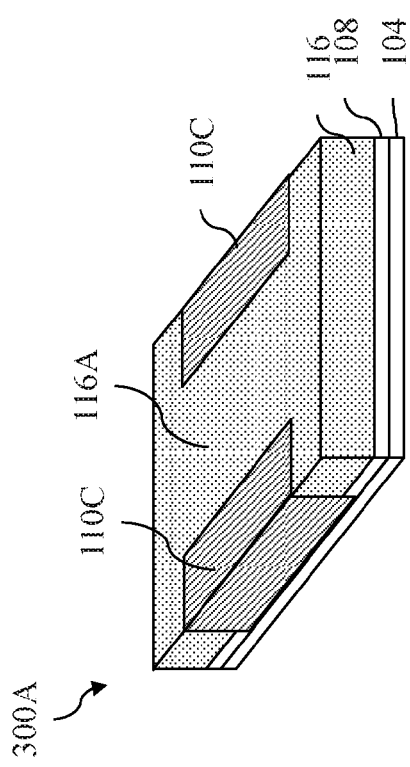
Figure 3H:
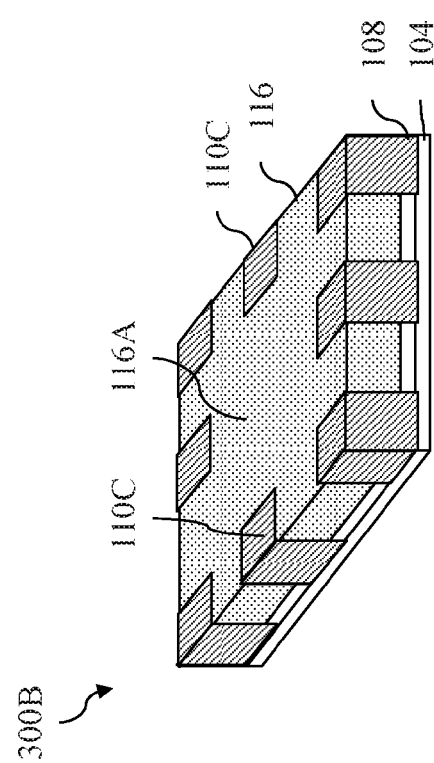

In various embodiments, package 300 may include any number of I/O contacts. For example, FIG. 3G illustrates a perspective view of a package 300A having two I/O contacts 110C. One contact is illustrated in FIG. 3G, and the second contact may be disposed on an opposing side (not shown) of the package as the illustrated contact 110C. In an embodiment two-terminal device, a first I/O contact 110C provides a connection for power lines while a second I/O contact 110C provides a connection for ground lines. As another example, FIG. 3H illustrates a perspective view of a package 300B having more than two I/O contacts 110C. In package 300B, multiple I/O contacts 110C may be disposed on a side of the package. Furthermore, some contacts 110C may wrap around a corner of package 300B and be disposed on at least three sides of package 300B.

Figure 3I:
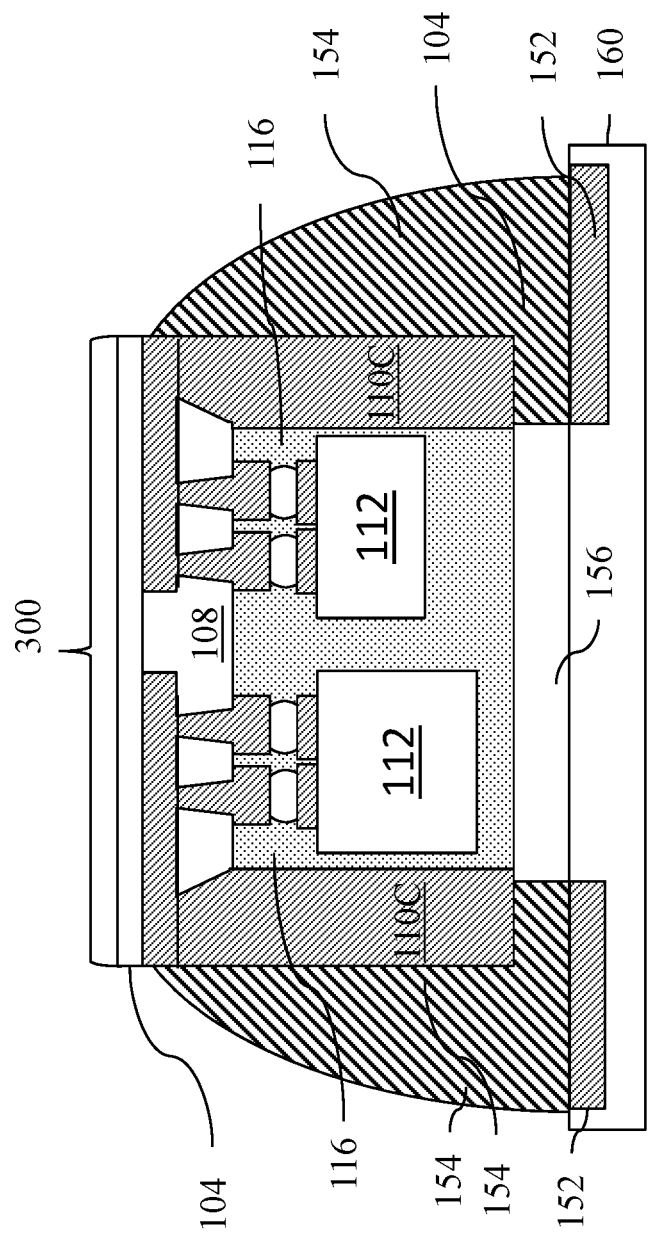
Figure 3J:
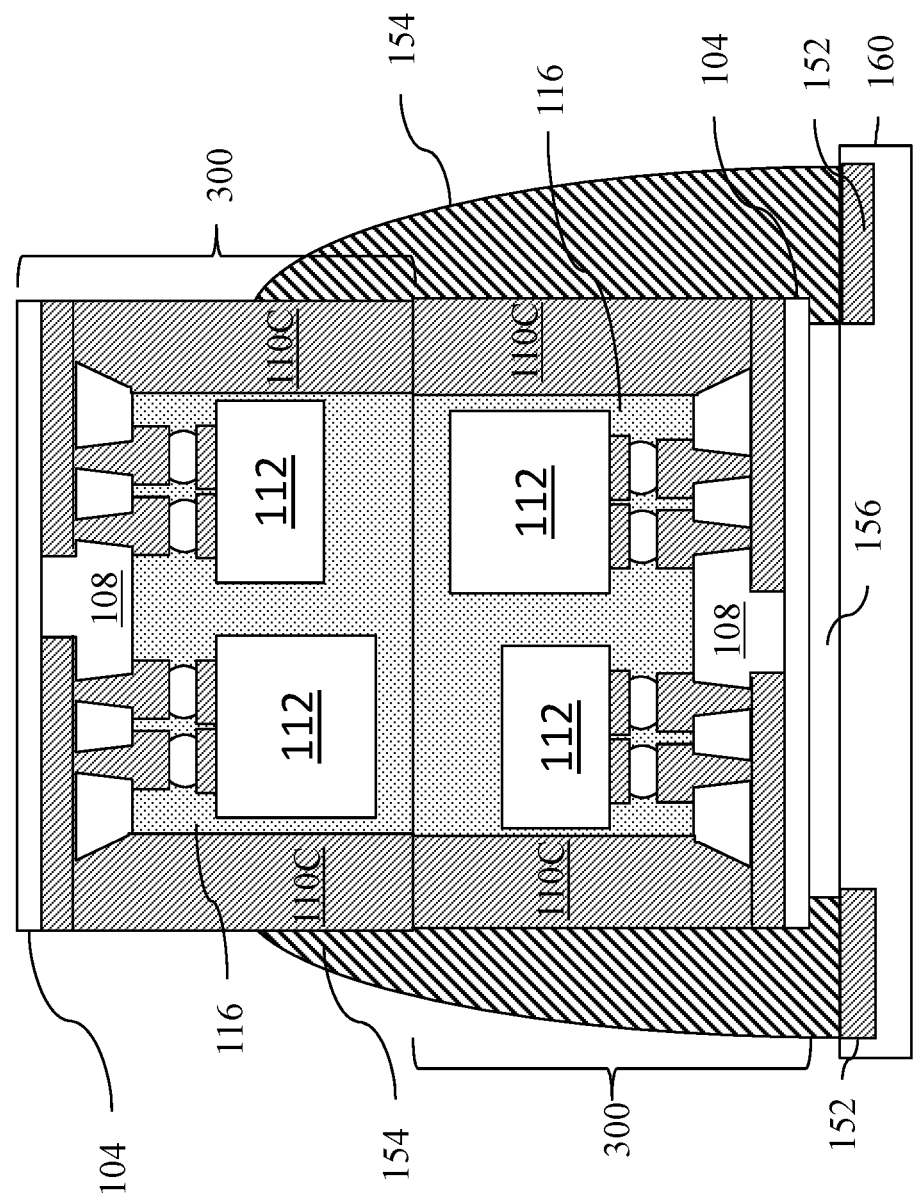

I/O contacts 110C may be used to electrically connect package 300 to another device feature. For example, FIG. 3I illustrates package 300 bonded to a substrate 160 by solder regions 154 on sidewalls of I/O contacts 110C. In some embodiments, package 300 may be oriented so that surface 116A of molding compound 116 (e.g., the surface of molding compound 116 opposite RDLs 111) is facing substrate 160. Thus, a portion of solder region 154 disposed between substrate 160 and package 300 may contact an exposed lateral surface of I/O contacts 110C (e.g., a surface of I/O contacts 110C substantially level with surface 116A of molding compound 116). Furthermore, because I/O contacts 110C extend to surface 116A of molding compound 116 opposing RDLs 111, multiple packages 300 may be vertically bonded and stacked on substrate 160 as illustrated by FIG. 3J. For example, two packages 300 may be stacked vertically so that I/O contacts 110C are vertically aligned. For example, a line perpendicular to a lateral surface of I/O contact 110C intersects I/O contacts 110C of both packages 300 in the stacked device. In an embodiment, packages 300 may be bonded, for example, by solder regions 154, and I/O contacts 110C of different packages may directly adjoin and contact each other. In other embodiments, a solder region (not shown) may be disposed between packages 300 on lateral surfaces of I/O contacts 110C. By allowing vertical stacking of multiple packages 300, increased component density can be advantageously achieved. Solder region 154 may extend along sidewalls of packages 300 to electrically connect to I/O contacts 110C at sidewalls of packages 300.

Figure 4H:
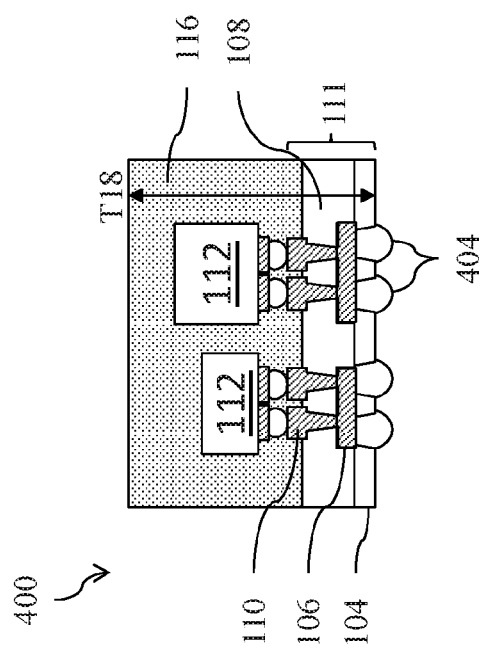

FIGS. 4A through 4I illustrate cross-sectional and top-down views of various intermediary stages of manufacturing a device package according to various other embodiments. FIG. 4A illustrates a carrier substrate 100, a release layer 102, and RDLs 111 formed over release layer 102. RDLs 111 may include dielectric layer 104, conductive feature 106 (e.g., conductive lines), dielectric layer 108, and conductive features 110. The various features of FIG. 4A may be similar to the features of package 122 where like reference numerals indicate like elements. Furthermore, various process steps similar to those described above with respect to FIGS. 1A through 1E may be used to arrive at the structure illustrated in FIG. 4A. Thus, further description of these processes is omitted for brevity. However, in FIG. 4A, conductive features 110 do not include any sidewall I/O contacts 110C (see FIG. 1J). Although FIG. 4A illustrate RDLs 111 having one layer of conductive lines (e.g., conductive features 106), other embodiments may include any number of conductive lines (e.g., as described with respect to FIG. 2A). Conductive features in RDLs 111 may have any suitable pattern, such as the patterns described with respect to FIGS. 1G, 1O, 2B, 2C, or the like.

FIG. 4B illustrates dies 112 bonded to contact pads 110A using, for example, connectors 114. In some embodiments, connectors 114 are solder balls, such as microbumps, C4 bumps, BGA balls, or the like. A plurality of dies 112 is placed in each die placement region 150A and 150B. Furthermore, although only two dies are illustrated as being placed in each region 150A/150B, embodiments may include any number of dies (e.g., greater than two) in each die placement region 150. Thicknesses of dies 112 (e.g., as measured between top and bottom surfaces) may or may not be the same. Dies 112 may include all passive device dies, all active device dies, or a combination thereof.

Dies 112 are electrically connected to conductive features in RDLs 111 (e.g., conductive features 106) by connectors 114. In an embodiment where dies 112 include only passive device dies, conductive features in RDLs 111 (e.g., conductive features 106) provide power lines and ground lines to dies 112. For example, conductive features in RDLs 111 (e.g., conductive features 106) may have a pattern as described with respect to FIGS. 1G, 1O, 2B, and/or 2C.

In FIG. 4C, the various components are encapsulated in a molding compound 116. In embodiments, molding compound 116 comprises an epoxy, a resin, a moldable polymer such as PBO, a MUF, or another moldable material. Molding compound 116 may encircle dies 112 in a top-down view (not provided). In an embodiment, molding compound 116 may be applied by compression molding, transfer molding, or the like. In an embodiment, molding compound 116 may be applied to cover top surfaces of dies 112. Molding compound 116 may be applied in liquid form, and may be subsequently cured to provide a solid encapsulant.

In FIG. 4D, a carrier substrate de-bonding is performed to detach (de-bond) carrier substrate 100 from RDLs 111, e.g., dielectric layer 104. In accordance with some embodiments, the de-bonding includes projecting a light such as a laser light or an UV light on release layer 102 so that release layer 102 decomposes under the heat of the light and carrier substrate 100 can be removed. The structure is then flipped over and placed on a tape 118.

As further illustrated in FIG. 4D, after carrier substrate 100 is de-bonded, openings 402 are formed through the dielectric layer 104 to expose portions of conductive features 106. Openings 402 may be formed, for example, using laser drilling, etching, or the like. Subsequently, as illustrated by FIG. 4E, Connectors 404 may be disposed in openings 402 in dielectric layer 104. In some embodiments, connectors 404 comprise solder balls, such as, microbumps, C4 bumps, BGA balls, and the like.

Alternatively, as illustrated by FIG. 4F, after carrier substrate 100 is de-bonded, conductive features 406 in dielectric layer 104 are exposed. In some embodiments, conductive features 406 are formed in a same process as conductive features 106. For example, openings may be patterned in dielectric layer 104 prior to forming conductive features 106. During the formation of conductive features 106, such openings may also be filled with a conductive material used to form conductive features 406. Exposing conductive features 406 may include removing portions of dielectric layer 104 on an opposing side of conductive features 406 as conductive features 106. Removing portions of dielectric layer 104 may include any suitable patterning and/or planarization process. After conductive features 406 are exposed, connectors 404 are disposed on conductive features 406.

In FIG. 4G, a singulation process (not illustrated) may be performed along scribe lines 120, e.g., between adjacent regions 150 (labeled 150A and 150B). Singulation may be performed using any suitable process using, for example, a mechanical saw/blade, a laser, combinations thereof, or the like. In the illustrated embodiment, scribe line 120 does not extend through any conductive features in RDLs 111, and I/O contacts are provided solely by connectors 404, not any sidewall I/O contacts (e.g., I/O contacts 110C see FIG. 1J). In other embodiments, connectors 404 may be combined with sidewall I/O contacts (e.g., I/O contacts 110C, see FIG. 1J).

FIG. 4H illustrates the completed device package 400. Package 400 includes a plurality of dies 112 encapsulated in a molding compound 116. Fan-out RDLs 111 having conductive features (e.g., conductive features 106 and 110) are electrically connected to dies 112, and fan-out RDLs 111 may extend laterally past edges of dies 112 to increase an area available for electrical routing to dies 112. Package 400 has a thickness T18, which may be between about 120 µm to about 170 µm in embodiments having one layer of conductive lines in RDLs 111. In embodiments having two layers of conductive lines in RDLs 111, thickness T18 of package 400 may be about 120 µm to about 200 µm. In other embodiments, package 400 may have other thickness, such as, greater than or less than the values provided.

Figure 4I:
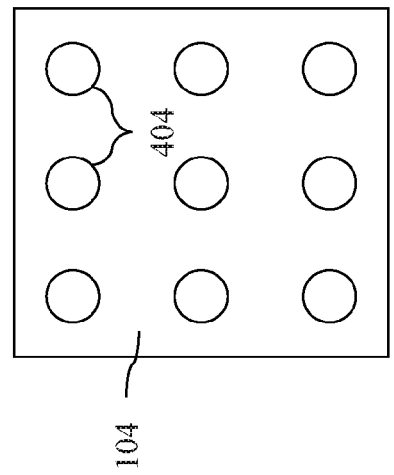

Furthermore, as explained above, I/O contacts in package 400 are provided by connectors 404. Connectors 404 may be disposed on a bottom surface of package 400 (e.g., a surface of RDLs 111 opposite dies 112). Connectors 404 may be configured in an array (see FIG. 4I) in order to provide external connectors for package 400. Although FIG. 4I illustrates an array of three-by-three connectors 404, package 400 may include any number of connectors 404.

FIG. 4J illustrates a cross-sectional view of package 400 bonded to a substrate 160 by connectors 404. For example, package 400 may be disposed on substrate 160 by a pick-and-place tool. A reflow may then be performed to bond connectors 404 to contact pads 152 of substrate 160. FIG. 4K illustrates another embodiment where contact pads 152 are replaced with conductive traces 406. In such embodiments, connectors 404 may wrap around multiple sides of conductive traces 406 after bonding.

Figure 5C:
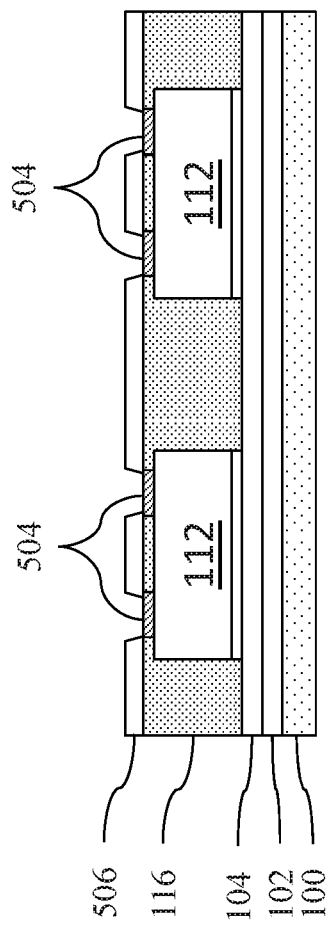

As described above, packages 122, 200, 300, and 400 each include only one layer of adjacent dies 112. Other embodiment packages may include multiple layers of stacked dies. For example, FIGS. 5A through 5J illustrates cross-sectional views of various intermediary stages of manufacturing a device having stacked dies according to some embodiments. In FIG. 5A, a carrier substrate 100, a release layer 102, and a dielectric layer 104 are illustrated. Carrier substrate 100, release layer 102, and dielectric layer 104 may be similar to the features described in FIGS. 1A through 1B.

Dies 112 are attached to a top surface of dielectric layer 104 by an adhesive layer 502. Dies 112 may include all passive device dies, all active device dies, or a combination thereof. Dies 112 may include contact pads 504 at a top surface, which provide electrical connection to device(s) within dies 112. Although FIG. 5A illustrates a single die being attached in each die placement region 150A and 150B, any number of dies may be placed in regions 150A/150B in other embodiments (see e.g., FIG. 6A).

Adhesive 502 is disposed on back sides of dies 112 and adheres dies 112 to dielectric layer 104 in the illustration. Adhesive 502 may be any suitable adhesive, epoxy, DAF, or the like. Adhesive 502 may be applied to a back side of dies 112, such as to a back side of the respective semiconductor wafer or may be applied over the surface of carrier substrate 100. Dies 112 may be singulated, such as by sawing or dicing, and adhered to dielectric layer 104 by adhesive 502 using, for example, a pick-and-place tool.

In FIG. 5B, the various components are encapsulated in a molding compound 116. In embodiments, molding compound 116 comprises an epoxy, a resin, a moldable polymer such as PBO, a MUF, or another moldable material. Molding compound 116 may encircle dies 112 in a top-down view (not provided). In an embodiment, molding compound 116 may be applied by compression molding, transfer molding, or the like. In an embodiment, molding compound 116 may be applied to cover top surfaces of dies 112. Molding compound 116 may be applied in liquid form, and may be subsequently cured to provide a solid encapsulant. After curing, a planarization may be applied to expose contact pads 504 on dies 112. After planarization, top surfaces of molding compound 116 may be substantially level with top surfaces of contact pads 504.

In FIG. 5C, a dielectric layer 506 is deposited on molding compound 116 and contact pads 504. In some embodiments, dielectric layer 506 may be a photo-sensitive material such as PBO, polyimide, BCB, or the like, that may be patterned using a lithography mask. In other embodiments, dielectric layer 506 can be formed of a nitride such as silicon nitride; an oxide such as silicon oxide, PSG, BSG, or BPSG; or the like. Dielectric layer 506 may be formed by spin coating, lamination, CVD, the like, or a combination thereof.

As further illustrated by FIG. 5C, dielectric layer 506 is patterned after deposition. The patterning forms openings to expose portions of contact pads 504. The patterning may be by an acceptable process, such as by exposing dielectric layer 506 to light when dielectric layer 506 is a photosensitive material or by etching using, for example, an anisotropic etch. If dielectric layer 506 is a photosensitive material, dielectric layer 506 can be developed after the exposure.

Figure 5D:
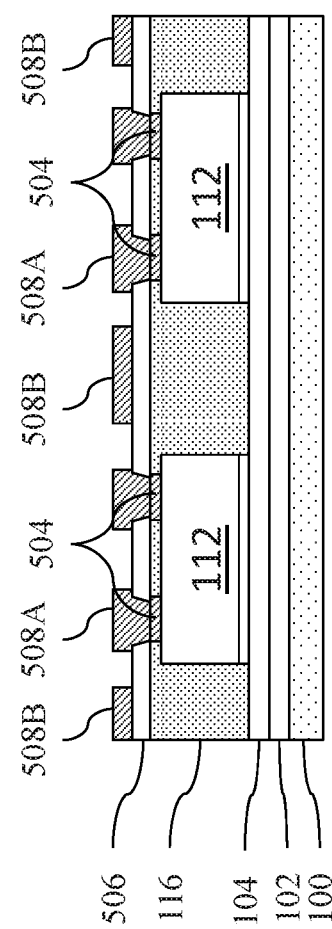

In FIG. 5D, conductive features 508 (labeled 508A and 508B) with vias are formed on dielectric layer 506. As an example to form conductive features, a seed layer (not shown) is formed over dielectric layer 506 and in openings through dielectric layer 506. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to conductive features 508. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form conductive features 508A and 508B. Conductive vias are formed in openings through dielectric layer 506 to, e.g., contact pads 504. Conductive features 508 include contact pads 508A, e.g., to provide electrical contact to other dies (see FIG. 5E), and I/O contacts 508B, e.g., to provide I/O contacts to other features at sidewalls of the completed device package (see e.g., FIG. 5J). Contact pads 508A may be electrically connected to I/O contacts 508B by conductive lines (not shown) formed on dielectric layer 506.

In FIG. 5E, dielectric layer 510 is deposited on conductive features 508 and dielectric layer 506. In some embodiments, dielectric layer 510 is formed of a polymer, which may be a photo-sensitive material such as PBO, polyimide, BCB, or the like, that may be patterned using a lithography mask. In other embodiments, dielectric layer 510 can be formed of a nitride such as silicon nitride; an oxide such as silicon oxide, PSG, BSG, or BPSG; or the like. Dielectric layer 510 may be formed by spin coating, lamination, CVD, the like, or a combination thereof. Dielectric layer 510 is then patterned. The patterning forms openings to expose portions of conductive features 508 (e.g., contact pads 508A and I/O contacts 508B). The patterning may be by an acceptable process, such as by exposing dielectric layer 510 to light when the dielectric layer is a photosensitive material or by etching using, for example, an anisotropic etch. If dielectric layer 510 is a photosensitive material, dielectric layer 510 can be developed after the exposure.

In FIG. 5F, I/O contacts 508B are optionally extended to a height T19. For example, additional conductive material is formed on I/O contacts 508B. In other embodiments, contacts 508B are not extended (see e.g., FIG. 6B). As an example to form the additional conductive material, a seed layer (not shown) is formed over I/O contacts 508B. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. In other embodiments, I/O contacts 508B are used as the seed layer, and separate seed layer is not deposited. A photoresist is then formed and patterned on the seed layer. The photoresist may be formed by spin coating or the like and may be exposed to light for patterning. The pattern of the photoresist corresponds to I/O contacts 508B. The patterning forms openings through the photoresist to expose the seed layer. In an embodiment, the photoresist may mask contact pads 508A after patterning. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and optionally portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form I/O contacts 508B. I/O contacts 508B have a total thickness T19 of about 70 μm. Thickness T19 may be different in other embodiments. For example, in an embodiment, where I/O contacts 508B are not extended (see FIG. 6B), thickness T19 of I/O contacts 508B may be about 20 μm to about 30 μm. In another embodiment, where I/O contacts 508B are extended even further, and thickness T19 of I/O contacts 508B may be about 100 μm to about 200 μm.

Thus, RDLs 511 (e.g., comprising dielectric layer 506, conductive features 508, and dielectric layer 510) is formed over dies 112 and molding compound 116. Although RDLs 511 have a particular configuration in FIG. 5F, in other embodiments RDLs 511 may include any number of conductive line layers. For example, FIG. 6B illustrates an embodiment where RDLs 511 include additional dielectric layers (e.g., dielectric layers 602A and 602B) between dies 112 and dielectric layer 506/conductive features 508. Dielectric layer 602A and 602B includes conductive features 604A and 604B, respectively, which may provide power, ground, and/or signal lines in the completed device package. Conductive vias extending through various dielectric layers 602A, 602B, and 506, electrically connect conductive lines 604A/604B, contacts pads 508A, and I/O contacts 508B to dies 112. Conductive features in RDLs 511 may have any suitable pattern, such as the patterns described with respect to FIGS. 1G, 1O, 2B, 2C, or the like.

Figure 6C:
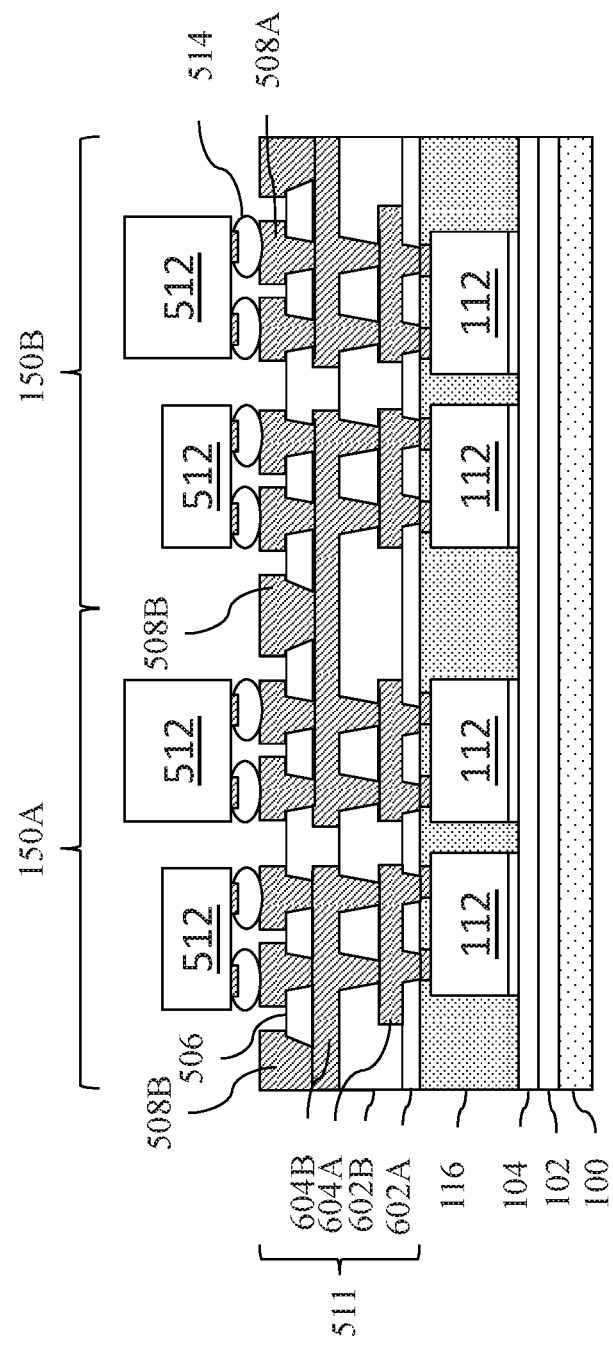
Figure 7A:
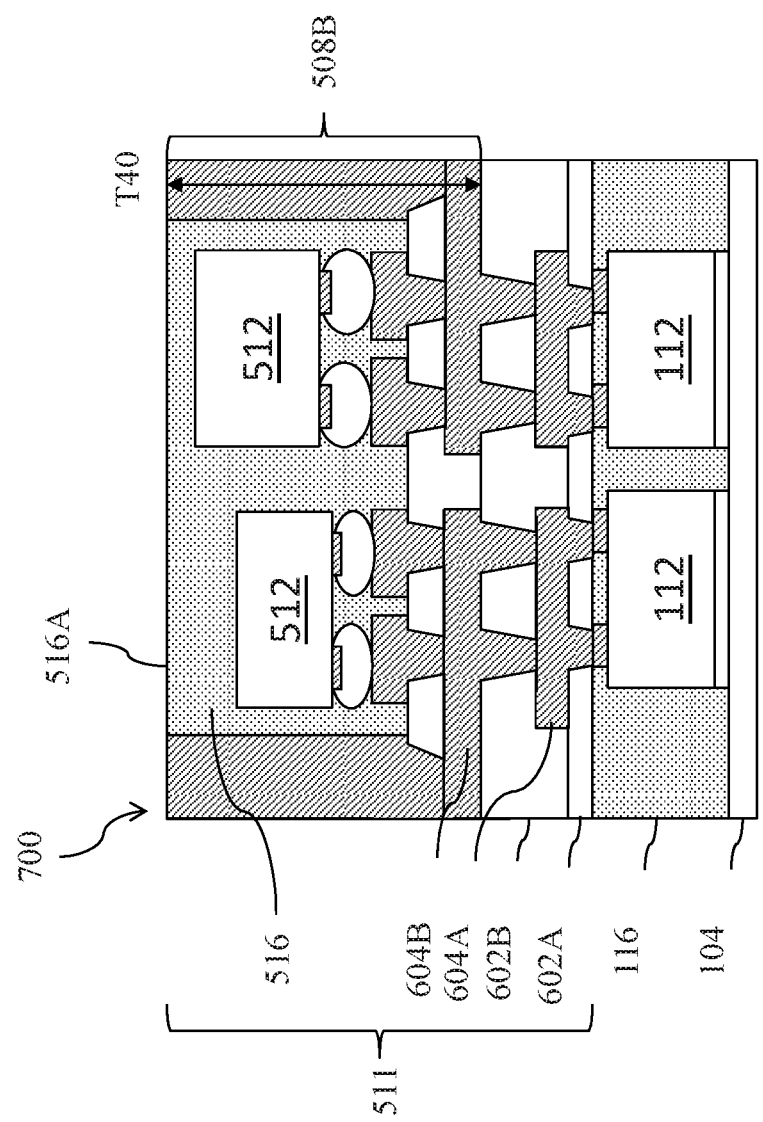

FIG. 5G illustrates dies 512 bonded to contact pads 508A using, for example, connectors 514. Dies 112 may be disposed between adjacent I/O contacts 508B. In some embodiments, connectors 114 are solder balls, such as microbumps, C4 bumps, BGA balls, or the like. Although only a single die 112 is placed in each die placement region 150A and 150B, other embodiments may include any number of dies 512 in each die placement region 150A/150B (see e.g., FIG. 6C). Thicknesses of dies 512 (e.g., in a same region or different region 150) may or may not be the same. Dies 512 may include all passive device dies, all active device dies, or a combination thereof. Dies 512 are electrically connected to dies 112 by conductive features in RDLs 511 (e.g., conductive features 508). In an embodiment where dies 112 include only passive device dies, conductive features in RDLs 511 (e.g., conductive features 508 and/or conductive features 604A/604B in FIG. 6A) provide power lines and ground lines to dies 112 and 512. Although FIG. 5G illustrates top surfaces of dies 512 and I/O contacts 508B being substantially level, in other embodiments, a top surface of I/O contact 508B may be lower than (e.g., as illustrated by FIG. 6C) or higher than (e.g., as illustrated by FIG. 7A) top surfaces of dies 512.

In FIG. 5H, the various components over RDLs 111 are encapsulated in a molding compound 516. In embodiments, molding compound 516 comprises an epoxy, a resin, a moldable polymer such as PBO, a MUF, or another moldable material. Molding compound 516 may encircle dies 512 in a top-down view (not provided). In an embodiment, molding compound 516 may be applied by compression molding, transfer molding, or the like. In an embodiment, molding compound 516 may be applied to cover top surfaces of dies 512. Molding compound 116 may be applied in liquid form, and may be subsequently cured to provide a solid encapsulant. In an embodiment (e.g., as illustrated by FIG. 7A), a planarization may be applied after curing to expose top surfaces of I/O contacts 508B. In such embodiments, top surfaces of molding compound 516 may be substantially level with top surfaces of I/O contacts 508B after planarization.

Figure 5I:
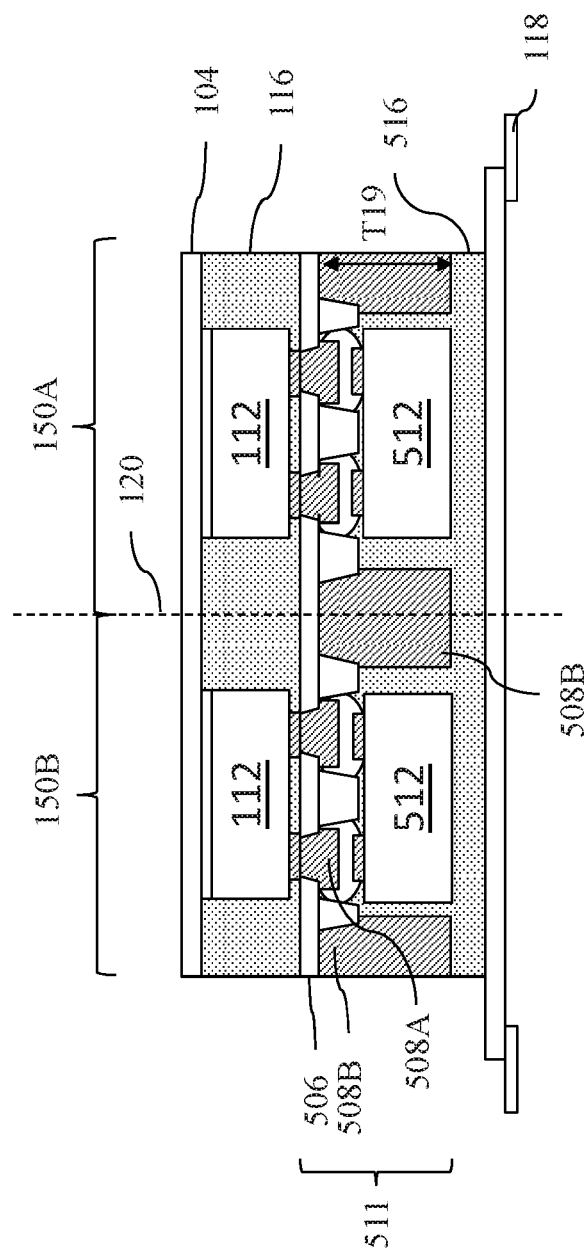

In FIG. 5I, a carrier substrate de-bonding is performed to detach (de-bond) carrier substrate 100 from dielectric layer 104. In accordance with some embodiments, the de-bonding includes projecting a light such as a laser light or an UV light on release layer 102 so that release layer 102 decomposes under the heat of the light and carrier substrate 100 can be removed. The structure is then flipped over and placed on a tape 118.

As further illustrated by FIG. 5I, a singulation process (not illustrated) may be performed along scribe lines 120, e.g., between adjacent regions 150 (labeled 150A and 150B). In the illustrated embodiment, scribe line 120 extends through conductive features in RDLs 511. For example, scribe line 120 may extend through I/O contacts 508B. The sawing singulates packages in a region (e.g., region 150A) from other packages formed in other regions (e.g., region 150B). Because the sawing is along scribe line 120, the sawing may further cut through I/O contacts 508B. Singulation may be performed using any suitable process using, for example, a mechanical saw/blade, a laser, combinations thereof, or the like. In some embodiments, the singulation process may be selected in accordance with a thickness T19 of conductive features (e.g., I/O contacts 508B) within RDL 111 as described above.

Figure 5J:
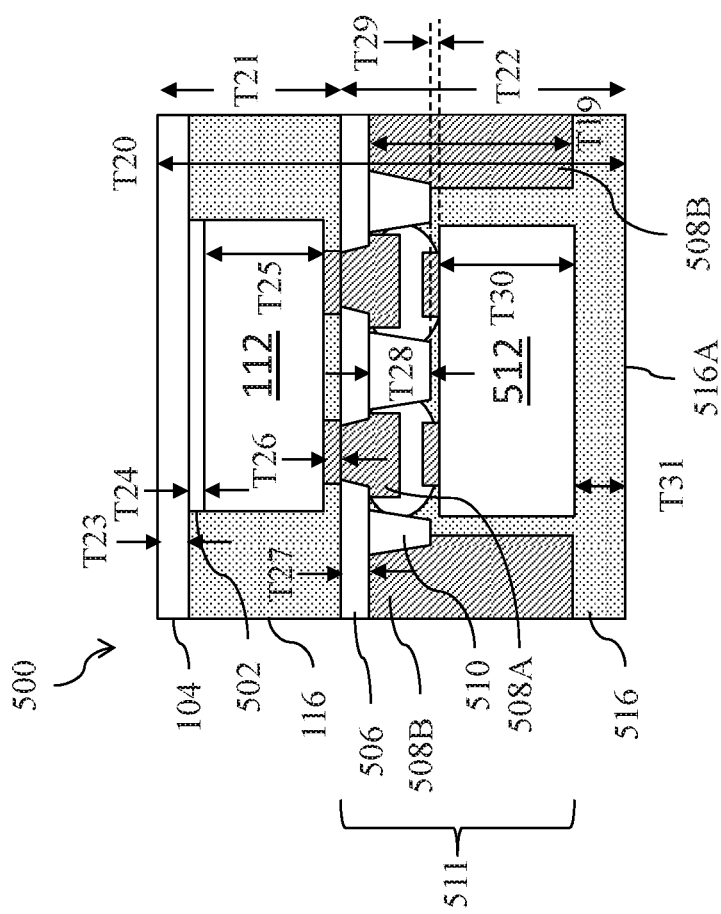

FIG. 5J illustrates the completed device package 500. Package 500 includes a plurality of stacked dies 112 and 512 having fan-out RDLs 511 disposed therebetween. Fan-out RDLs 511 include conductive features (e.g., conductive features 508A and 508B), which electrically connect die 112 to die 512. Fan-out RDLs may extend laterally past edges of dies 112 and 512 to increase an area available for electrical routing to dies 112 and 512.

Package 500 has a thickness T20, which may be about 181 µm with a first tier (e.g., between a top surface of dielectric layer 104 and a bottom surface of molding compound 116) having a thickness T21 of about 74 µm and a second tier (e.g., between a bottom surface of molding compound 116 and a bottom surface of molding compound 516) having a thickness T22 of about 107 µm. In such embodiments, a thickness T23 of dielectric layer 104 may be about 7 µm; a thickness T24 of adhesive layer 502 may be about 10 µm, a thickness T25 of die 112 may be about 50 µm or greater; a thickness T26 between die 112 and RDLs 511 may be about 7 µm; a thickness T27 of dielectric layer 506 may be about 5 µm; a thickness T28 of dielectric layer 510 may be about 7 µm; a thickness T29 of a distance between die 512 and dielectric layer 510 may be about 15 µm; a thickness 30 of die 512 may be about 50 µm or greater; and a thickness T30 between die 512 and an opposing surface of molding compound 516 may be about 30 µm. In other embodiments, package 500 and/or the various features within package 500 may have other thickness, such as, greater than or less than the values provided.

Some conductive features (e.g., I/O contacts 508B) in RDLs 511 provide contact pads exposed at sidewalls of package 500. For example, I/O contacts 508B are exposed at sidewalls of package 500. An exposed surface of I/O contacts 508B is substantially perpendicular to a bottom surface 516A of molding compound 516 (e.g., a surface 116A opposite RDLs 511).

In various embodiments, package 500 may include any number of I/O contacts. For example, FIG. 5K illustrates a perspective view of a package 500A having two I/O contacts 508B. One contact is illustrated in FIG. 5K, and the second contact may be disposed on an opposing side (not shown) of the package as the illustrated contact 508B. In an embodiment two-terminal device, a first I/O contact 508B provides a connection for power lines while a second I/O contact 508B provides a connection for ground lines. As another example, FIG. 5L illustrates a perspective view of a package 500B having more than two I/O contacts 508B. In package 500B, multiple I/O contacts 508B may be disposed on a side of the package. Furthermore, some contacts 508B may wrap around a corner of package 500B.

Figure 5M:
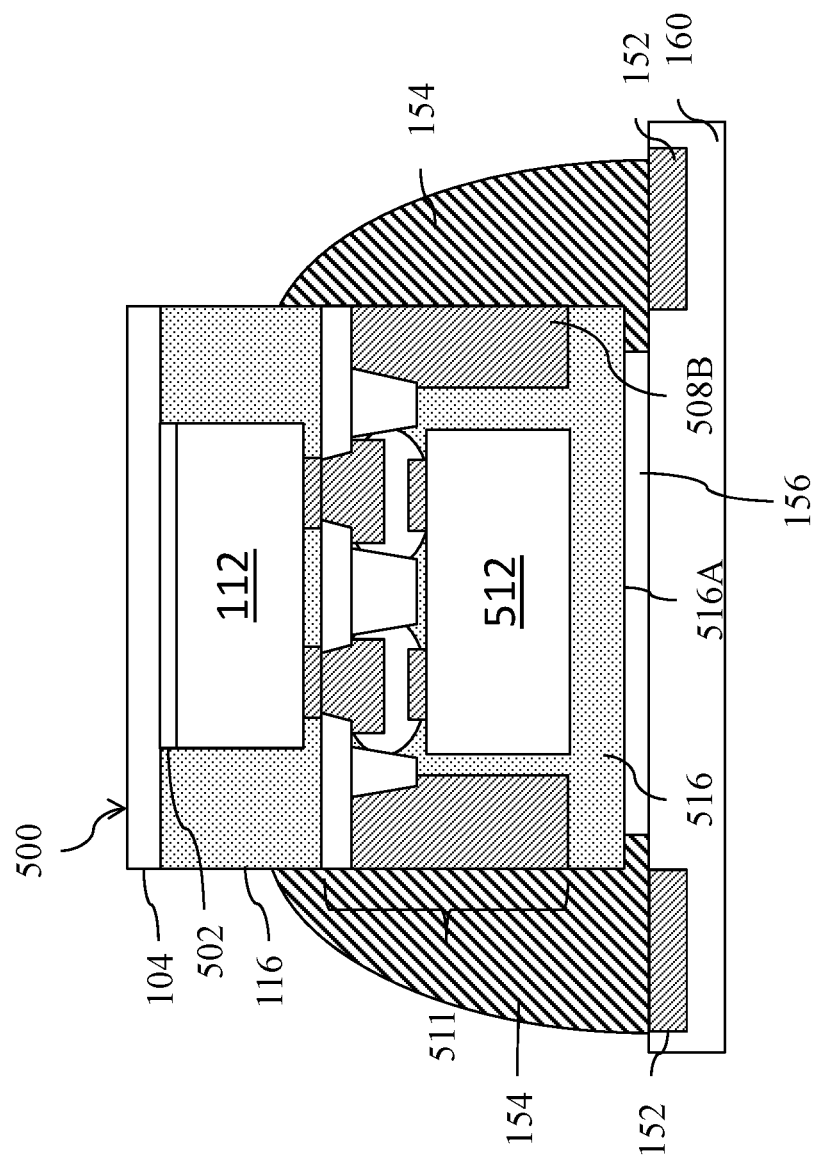

FIG. 5M illustrates a cross-sectional view of package 500 bonded to a substrate 160, for example, by solder regions 154. Solder regions 154 may extend along package 500 to contact I/O contacts 508B at sidewalls of package 500. Furthermore, package 500 may be oriented so that surface 516A of molding compound 516 faces substrate 160. After bonding, a spacing 156 (e.g., an air gap) may or may not remain between substrate 160 and package 500.

Figure 6D:
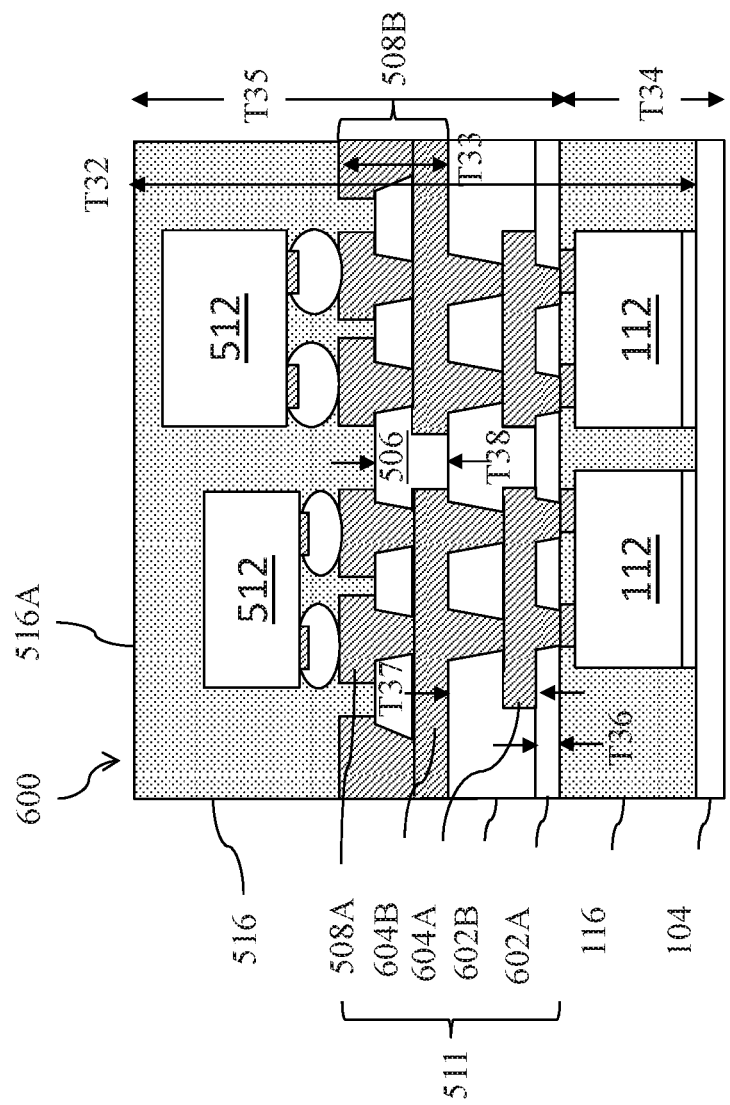

FIG. 6D illustrates another embodiment package 600 having multiple tiers of stacked dies. FIGS. 6A through 6C illustrate intermediary process steps for manufacturing package 600, which may be similar to the process of manufacturing package 500 as described above in FIGS. 5A through 5J where like reference numerals indicate like elements. Package 600 includes a plurality of stacked dies 112 and 512 having fan-out RDLs 511 disposed therebetween. Fan-out RDLs 511 include conductive features (e.g., conductive features 508A, 508B, 604A, and 604B), which electrically connect dies 112 to dies 512. Compared to package 500, package 600 may include RDLs 111 having multiple layers of stacked conductive lines 604A and 604B between dies 112 and 512.

Package 600 has a thickness T32, which may be between about 200 µm to about 350 µm with a first tier (e.g., between a bottom surface of dielectric layer 104 and a top surface of molding compound 116) having a thickness T34 of about 82 µm and a second tier (e.g., between a bottom surface of molding compound 116 and a top surface 516A of molding compound 516) having a thickness T35 of about 145 µm. In package 600, I/O contacts 508B has a top surface substantially level with top surfaces of contacts 508A. I/O contacts 508B in package 600 have a thickness T33 of, for example, about 20 µm to about 30 µm. Furthermore, in the illustrated embodiment, dielectric layer 602A has a thickness T36 of about 5 µm; dielectric layer 602B has a thickness T37 of about 10 µm; and dielectric layer 506 has a thickness T38 of about 10 µm. Thicknesses of dies 512 may or may not be the same in package 600. The other features of package 600 may have similar dimensions as respective features in package 500 where like reference numerals indicate like elements. In other embodiments, package 600 and/or the various features within package 600 may have other thickness, such as, greater than or less than the values provided.

Figure 6E:
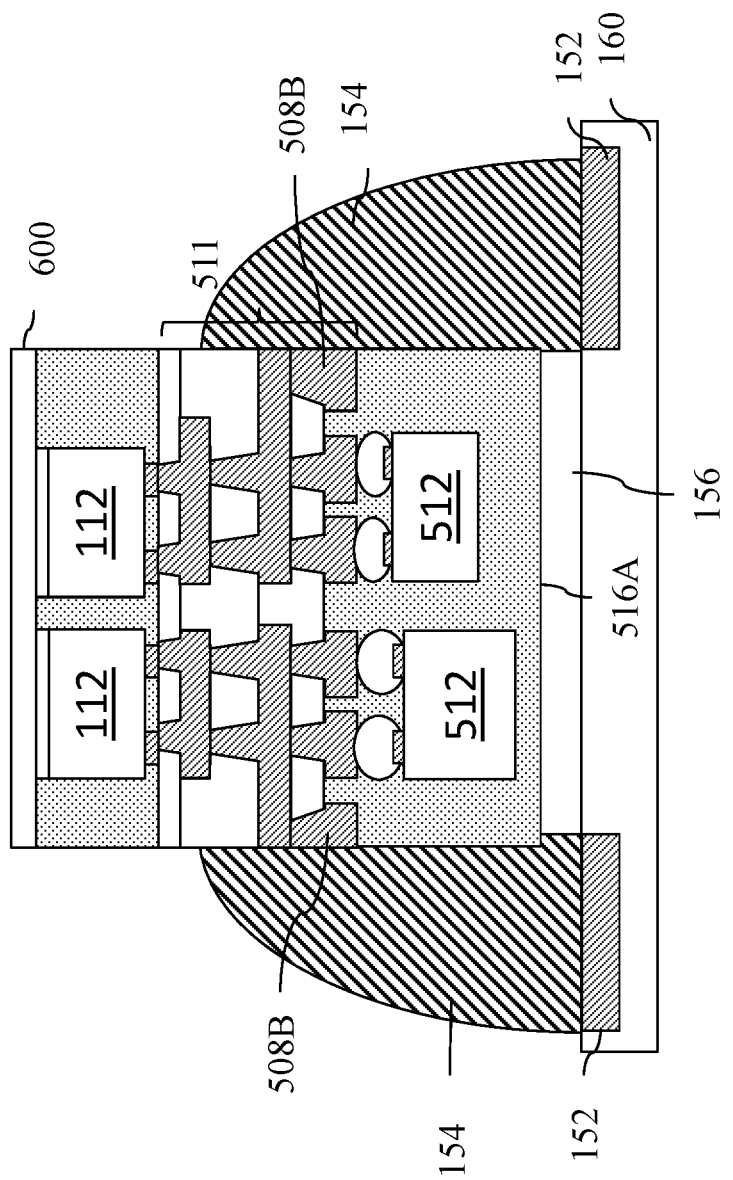

FIG. 6E illustrates a cross-sectional view of package 600 bonded to a substrate 160, for example, by solder regions 154. Solder regions 154 may extend along package 500 to contact I/O contacts 508B at sidewalls of package 500. Furthermore, package 500 may be oriented so that surface 516A of molding compound 516 faces substrate 160. After bonding, a spacing 156 (e.g., an air gap) may or may not remain between substrate 160 and package 600.

FIG. 7A illustrates a cross-sectional view another embodiment package having multiple tiers of stacked dies. Package 700 and package 600 may be similar where like reference numerals indicate like elements. Package 700 includes a plurality of stacked dies 112 and 512 having fan-out RDLs 511 disposed therebetween. Fan-out RDLs 511 include conductive features (e.g., conductive features 508A, 508B, 604A, and 604B), which electrically connect dies 112 to dies 512. Furthermore, I/O contacts 508B extends higher than dies 512, and top surface 516A of molding compound 516 may be substantially level with top surfaces of I/O contacts 508B. I/O contacts 508B may have a thickness T40 of about 100 µm to about 200 µm. The other features of package 700 may have similar dimensions as respective features in package 600 where like reference numerals indicate like elements. In other embodiments, package 700 and/or the various features within package 700 may have other thickness, such as, greater than or less than the values provided.

In various embodiments, package 700 may include any number of I/O contacts. For example, FIG. 7D illustrates a perspective view of a package 700A having two I/O contacts 508B on opposing sides of package 700. I/O contacts 508B extend to a top surface 516A of molding compound 516, and thus, I/O contacts 508B are disposed on at least two sides of package 700. In an embodiment two-terminal package, a first I/O contact 508B provides a connection for power lines while a second I/O contact 508B provides a connection for ground lines. As another example, FIG. 7B illustrates a perspective view of a package 700B having more than two I/O contacts 508B. In package 700B, multiple I/O contacts 508B may be disposed on a side of the package. Furthermore, some contacts 508B may wrap around a corner of package 700B and be disposed on at least three sides of package 700B. As yet another example, FIG. 7C illustrates a perspective view of a package 700C having more than two I/O contacts 508B. In package 700C, multiple I/O contacts 508B may be disposed on a side of the package. Furthermore, at least one I/O contact 508B' may extend through an interior region of molding compound 516 and is exposed at a top surface 516A of molding compound 516. I/O contact 508B' may be disposed, for example, between dies 512 (see FIG. 7A).

Figure 7E:
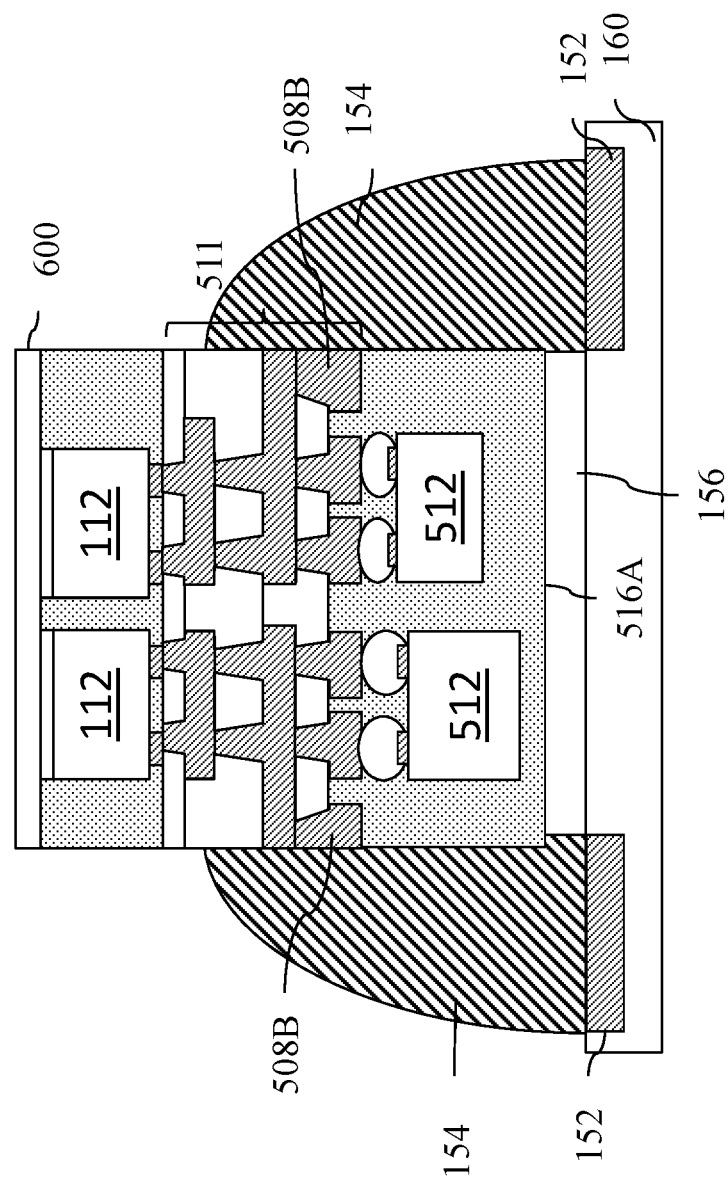
Figure 7F:
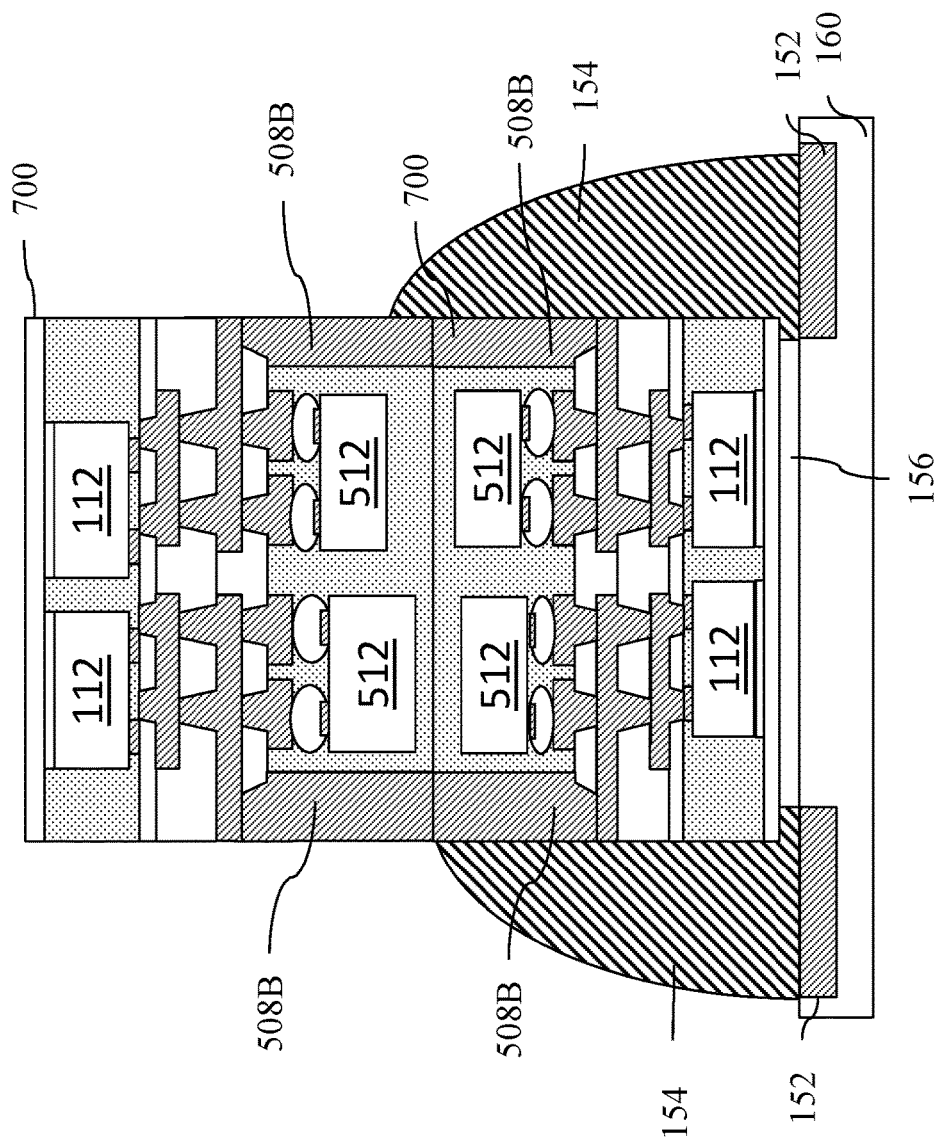

I/O contacts 508B may be used to electrically connect package 300 to another device feature. For example, FIG. 7E illustrates package 700 bonded to a substrate 160 by solder regions 154 on sidewalls of I/O contacts 508B. In some embodiments, package 700 may be oriented so that surface 516A of molding compound 516 (e.g., the surface of molding compound 516 opposite RDLs 511) is facing substrate 160. Thus, a portion of solder region 154 disposed between substrate 160 and package 700 may contact an exposed lateral surface of I/O contacts 508B (e.g., a surface of I/O contacts 508B substantially level with surface 516A of molding compound 516). Furthermore, because I/O contacts 508B extend to surface 516A of molding compound 516 opposing RDLs 511, multiple packages 700 may be vertically bonded and stacked on substrate 160 as illustrated by FIG. 7F. For example, two packages 700 may be stacked vertically. In an embodiment, packages 700 may be bonded, for example, by solder regions 154, and I/O contacts 508B of different packages may directly adjoin and contact each other. In other embodiments, a solder region (not shown) may be disposed between packages 700 on lateral surfaces of I/O contacts 508B. By allowing vertical stacking of multiple packages 700, increased component density can be advantageously achieved. Solder region 154 may extend along sidewalls of packages 700 to electrically connect to I/O contacts 508B at sidewalls of packages 700.

Figure 8C:
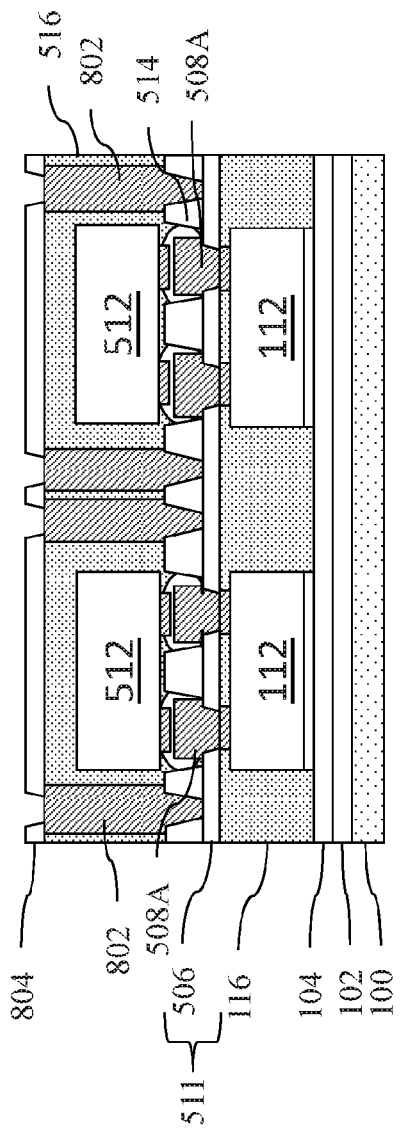

FIGS. 8A through 8E illustrate cross-sectional views of various intermediary stages of manufacturing an IPD package according to some other embodiments. FIG. 8A illustrates a carrier substrate 100, a release layer 102, dies 112 adhered to release layer 102, molding compound 116 around dies 112, and RDLs 511 over dies 112 and molding compound 116. RDLs 511 may include dielectric layer 504 and contact pads 508A. Dies 512 are bonded contact pads 508A, and a molding compound 516 is disposed around dies 512. Various features of FIG. 8A may be similar to the features of package 500 (see FIG. 5J) where like reference numerals indicate like elements. Furthermore, various process steps similar to those described above with respect to FIGS. 5A through 5H may be used to arrive at the structure illustrated in FIG. 8A. Thus, further description of these processes is omitted for brevity. However, in FIG. 8A, I/O contacts 508B are excluded and replaced with conductive vias 802. In an embodiment, conductive vias 802 do not extend to an outer perimeter of carrier 100. Conductive vias 802 may extend through molding compound 516, and top surfaces of molding compound 516 and conductive vias 802 may be substantially level. Conductive vias 802 maybe electrically connected to dies 112 and 512 by conductive features within RDLs 511.

In FIG. 8B, dielectric layer 804 is deposited on molding compound 516 and conductive vias 802. In some embodiments, dielectric layer 804 is formed of a polymer, which may be a photo-sensitive material such as PBO, polyimide, BCB, or the like, that may be patterned using a lithography mask. In other embodiments, dielectric layer 804 can be formed of a nitride such as silicon nitride; an oxide such as silicon oxide, PSG, BSG, or BPSG; or the like. Dielectric layer 804 may be formed by spin coating, lamination, CVD, the like, or a combination thereof.

Dielectric layer 804 is then patterned as illustrated by FIG. 8C. The patterning forms openings to expose portions of conductive vias 802. The patterning may be by an acceptable process, such as by exposing dielectric layer 804 to light when the dielectric layer is a photosensitive material or by etching using, for example, an anisotropic etch. If dielectric layer 804 is a photosensitive material, dielectric layer 804 can be developed after the exposure.

Figure 8D:
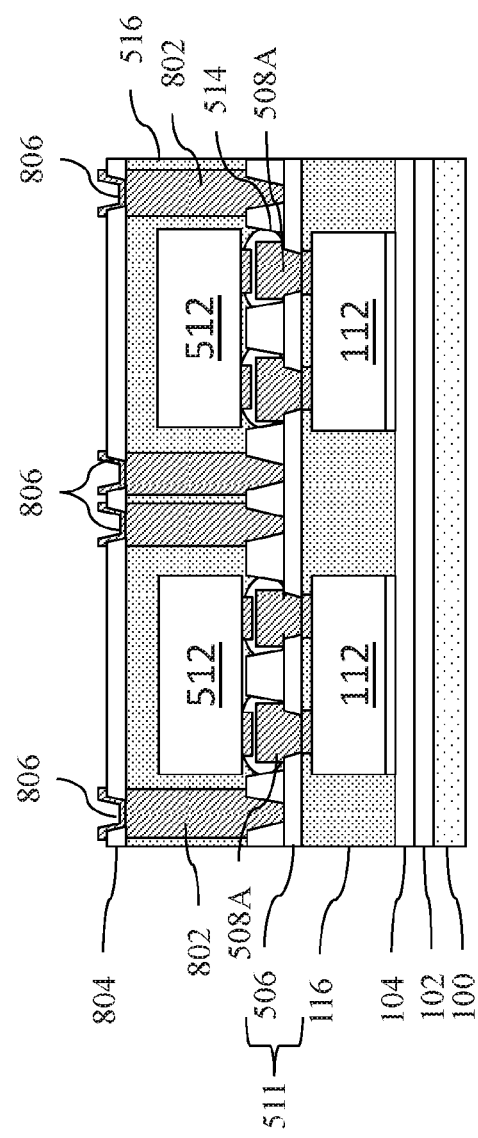

In FIG. 8D, under bump metallurgies (UBMs) 806 are optionally formed in openings through dielectric layer 804. As an example to form UBMs 806, a seed layer (not shown) is formed over conductive vias 802 in openings through dielectric layer 804. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to UBMs 806. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and optionally portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form UBMs 806.

Figure 8E:
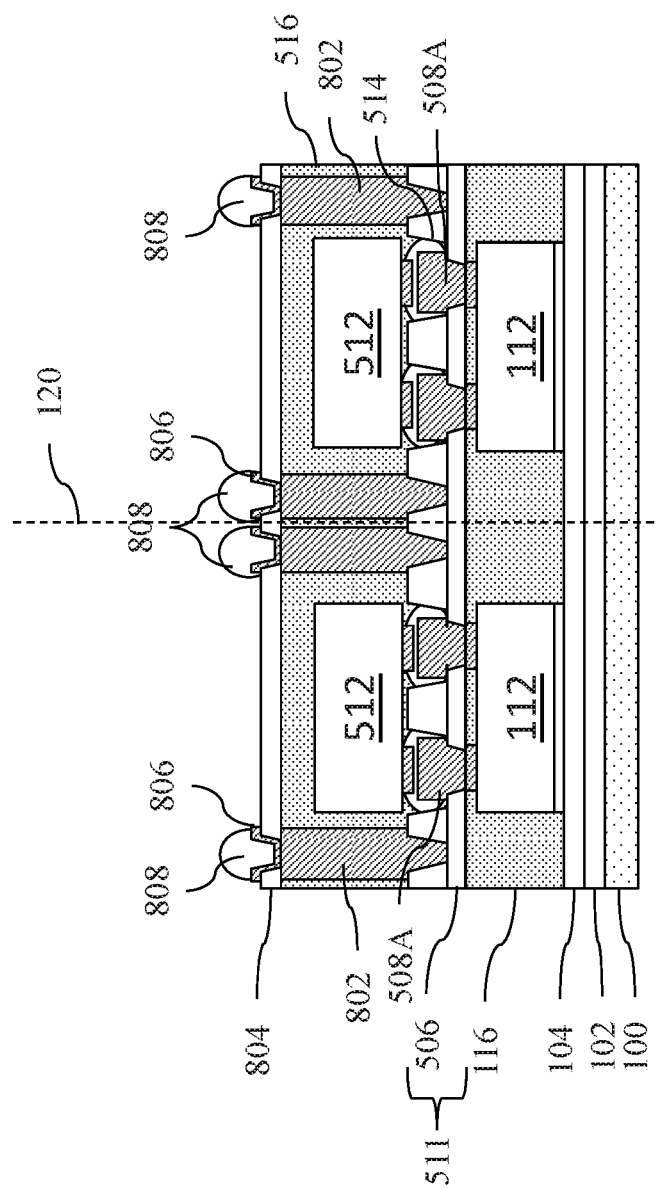

In FIG. 8E, connectors 808 are formed on UBMs 806 (or directly on conductive vias 802 in embodiments where UBMs 806 are excluded). Connectors 808 may be solder balls, such as, microbumps, C4 bumps, BGA balls, and the like. In an embodiment, connectors 808 may be formed using a ball mounting process. In other embodiments, connectors 808 may be formed prior to removing a photoresist used to define a pattern of UBMs 806. For example, after the conductive material of UBMs 806 is formed in openings of the photoresist, an additional plating may be performed to form a conductive layer (e.g., a tin layer or other solder material) on the UBMs 806. The photoresist and portions of the seed layer on which the conductive material is not formed is then removed as described above. After the photoresist and seed layer are removed, a reflow process may be performed to form solder balls (e.g., connectors 808).

Figure 8F:
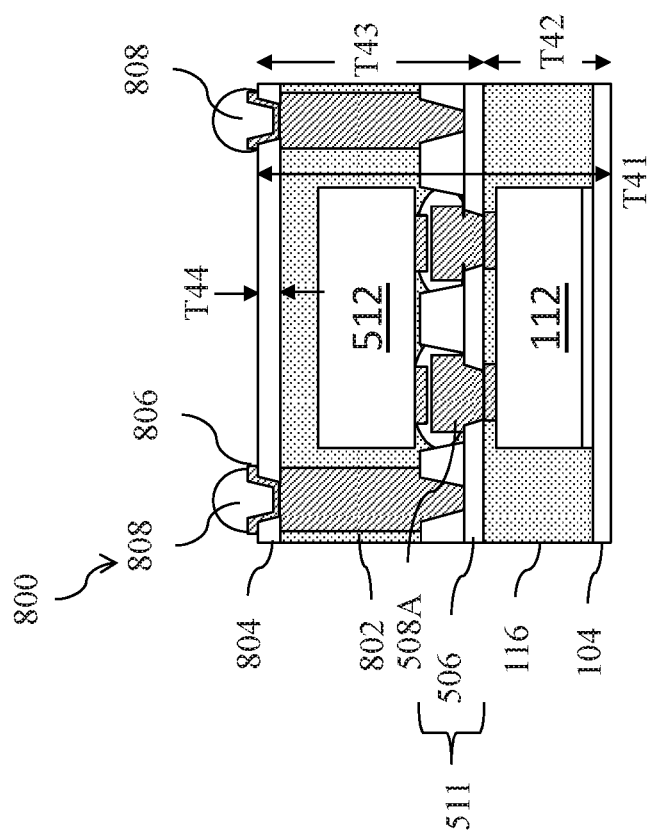

After connectors 808 are formed, carrier 100 and release layer 102 may be removed using a process as described above. A singulation process as described above may also be performed along scribe line 120. FIG. 8F illustrates the resulting package 800. Package 800 and package 500 (see FIG. 5J) may be similar where like reference numerals indicate like elements. Package 800 includes a plurality of stacked dies 112 and 512 having fan-out RDLs 511 disposed therebetween. I/O contacts in package 800 are provided by connectors 808. Connectors 808 may be disposed on a surface of package 800 opposite dielectric layer 104. Although FIG. 8F illustrates only two connectors 808, package 800 may include any number of connectors 808.

Package 800 has a thickness T41, which may be about 185 μm (exclusive of connectors 808) with a first tier (e.g., between a bottom surface of dielectric layer 104 and a top surface of molding compound 116) having a thickness T42 of about 74 μm and a second tier (e.g., between a top surface of molding compound 116 and a top surface of dielectric layer 804) having a thickness T43 of about 111 μm. In package 600, dielectric layer 804 has a thickness T44 of about 7 μm. The other features of package 800 may have similar dimensions as respective features in package 500 where like reference numerals indicate like elements. In other embodiments, package 800 and/or the various features within package 800 may have other thickness, such as, greater than or less than the values provided.

Figure 8G:
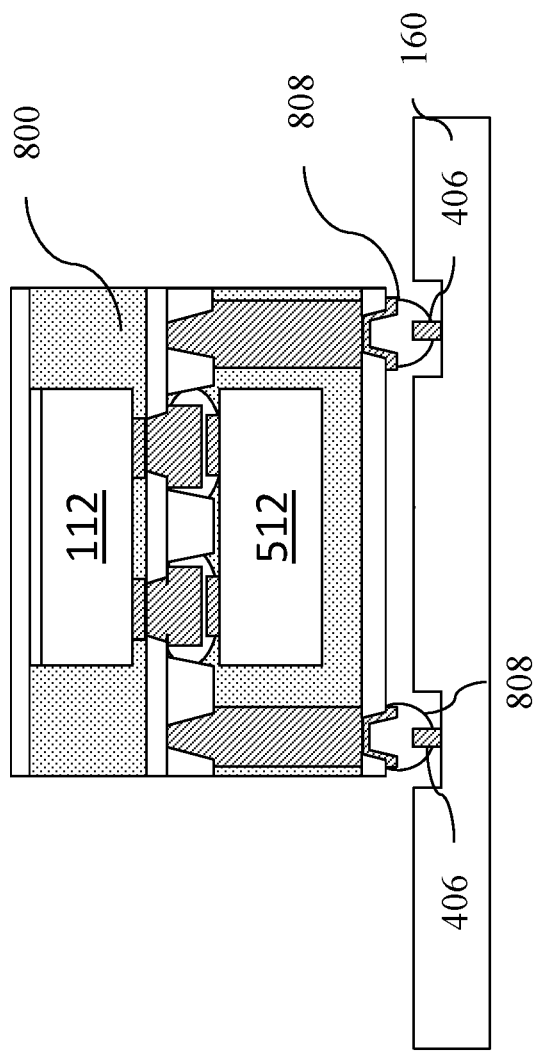

Connectors 808 may be used to bond package 800 to another device feature. For example, FIG. 8G illustrates a cross-sectional view of package 800 bonded to a substrate 160 by connectors 808. For example, package 800 may be disposed on substrate 160 by a pick-and-place tool. A reflow may then be performed to bond connectors 808 to conductive traces 406 of substrate 160. In an embodiment, connectors 808 may wrap around multiple sides of conductive traces 406 after bonding.

Figure 9A:
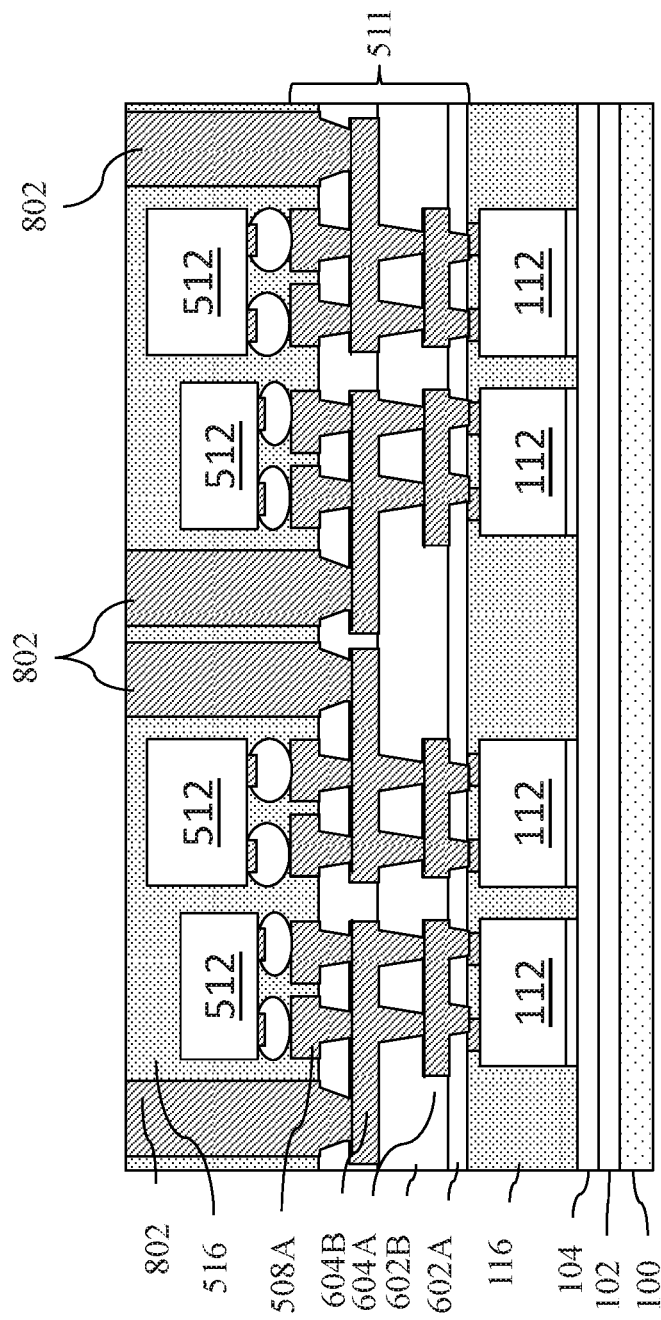
FIGS. 9A, 9B, 9C, 9D, 9E, 9F and 9G illustrate cross-sectional and top-down views of an IPD package according to some other embodiments.

FIGS. 9A through 9E illustrate cross-sectional views of various intermediary stages of manufacturing an IPD package according to some other embodiments. FIG. 9A illustrates a carrier substrate 100, a release layer 102, dies 112 adhered to release layer 102, molding compound 116 around dies 112, and RDLs 511 over dies 112 and molding compound 116. RDLs 511 may include dielectric layer 504, contact pads 508A, dielectric layers 602A/602B, and conductive features 604A/604B. Dies 512 are bonded contact pads 508A, and a molding compound 516 is disposed around dies 512. Various features of FIG. 9A may be similar to the features of package 700 (see FIG. 7A) prior to singulation where like reference numerals indicate like elements. Furthermore, various process steps similar to those described above with respect to FIGS. 5A through 5H may be used to arrive at the structure illustrated in FIG. 9A. Thus, further description of these processes is omitted for brevity. However, in FIG. 9A, I/O contacts 508B are excluded and replaced with conductive vias 802. In an embodiment, conductive vias 802 do not extend to an outer perimeter of carrier 100. Conductive vias 802 may extend through molding compound 516, and top surfaces of molding compound 516 and conductive vias 802 may be substantially level. Conductive vias 802 maybe electrically connected to dies 112 and 512 by conductive features within RDLs 511.

Figure 9B:
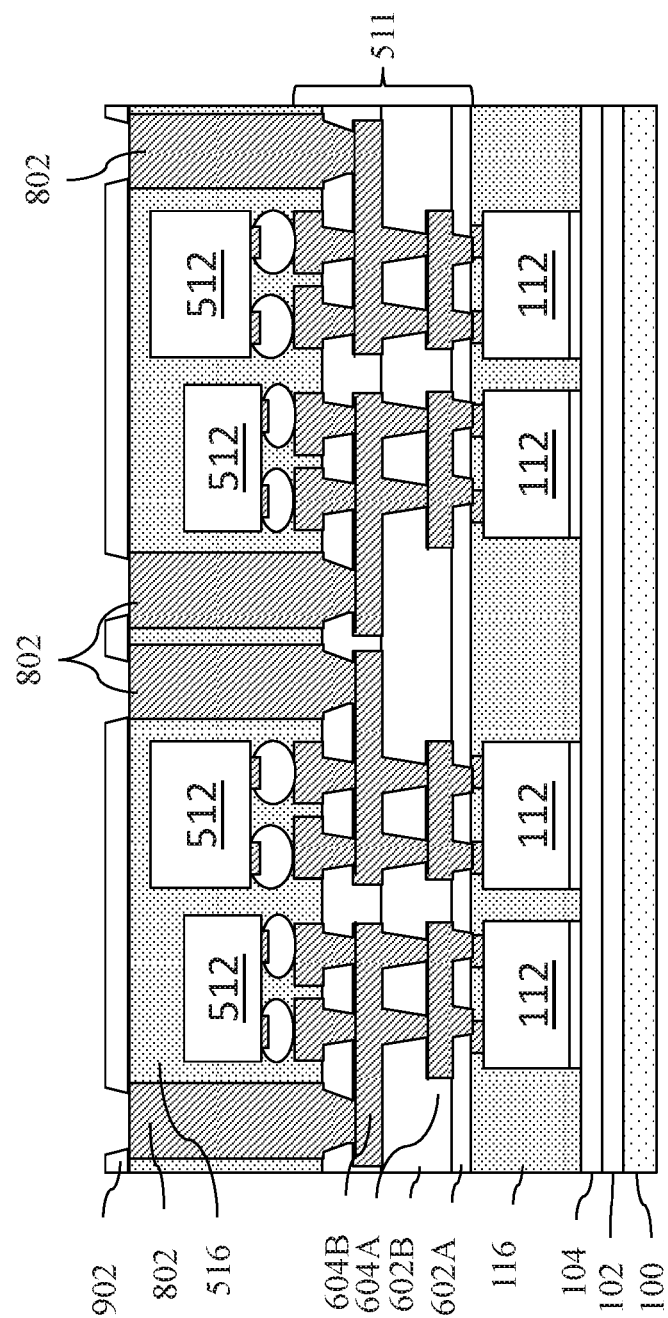

In FIG. 9B, dielectric layer 902 is deposited on molding compound 516 and conductive vias 802. In some embodiments, dielectric layer 902 is formed of a polymer, which may be a photo-sensitive material such as PBO, polyimide, BCB, or the like, that may be patterned using a lithography mask. In other embodiments, dielectric layer 804 can be formed of a nitride such as silicon nitride; an oxide such as silicon oxide, PSG, BSG, or BPSG; or the like. Dielectric layer 902 may be formed by spin coating, lamination, CVD, the like, or a combination thereof. Dielectric layer 902 is then patterned. The patterning forms openings to expose portions of conductive vias 802. The patterning may be by an acceptable process, such as by exposing dielectric layer 902 to light when the dielectric layer is a photosensitive material or by etching using, for example, an anisotropic etch. If dielectric layer 902 is a photosensitive material, dielectric layer 902 can be developed after the exposure.

Figure 9C:
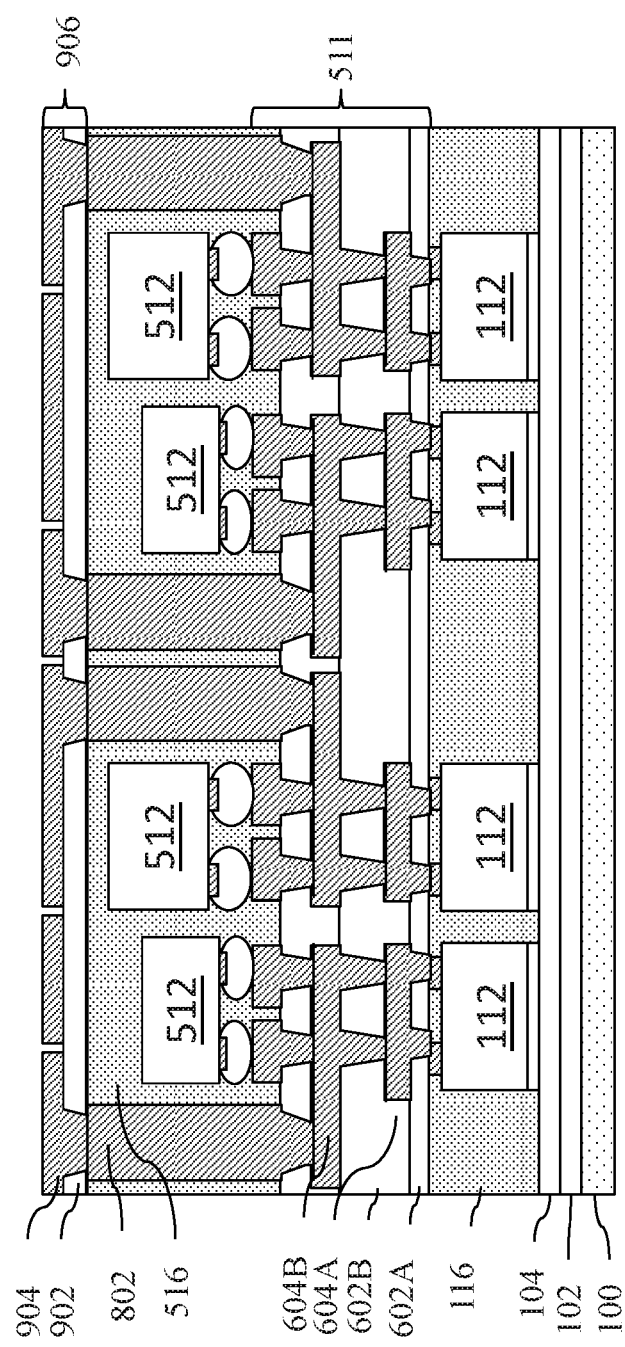

In FIG. 9C, conductive features 904 with vias are formed in openings through dielectric layer 902. As an example to form conductive features 904, a seed layer (not shown) is formed over conductive vias 802 in openings through dielectric layer 902. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to conductive features 904. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and optionally portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form conductive features 904.

Thus, RDLs 906 are formed over molding compound 516 and dies 512. RDLs 906 include conductive features 904, which are electrically connected to dies 112, dies 512, and conductive features in RDLs 511. RDLs 906 may be included in increase the area available for electrical routing to subsequently formed external connectors. Although RDLs 906 are illustrated as having only one layer of conductive features, in other embodiments, RDLs 906 may include any number of layers.

Figure 9D:
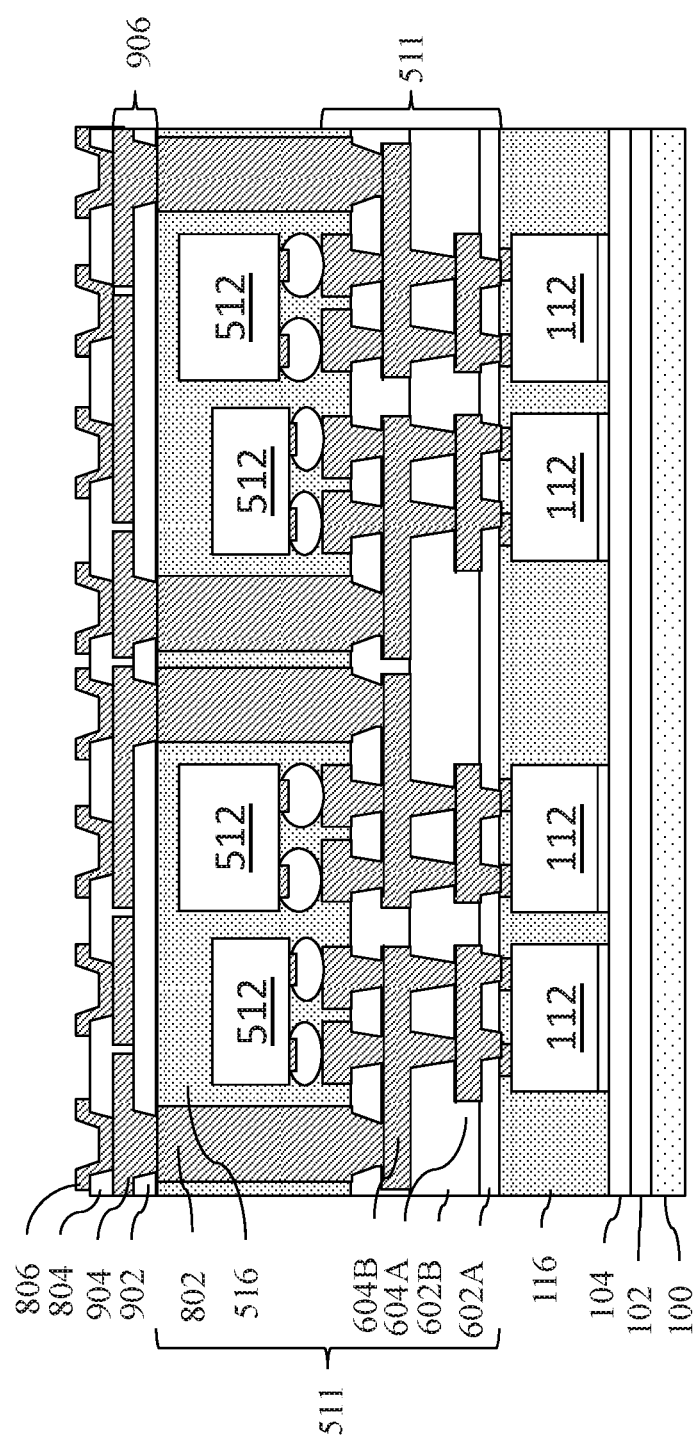
Figure 9E:
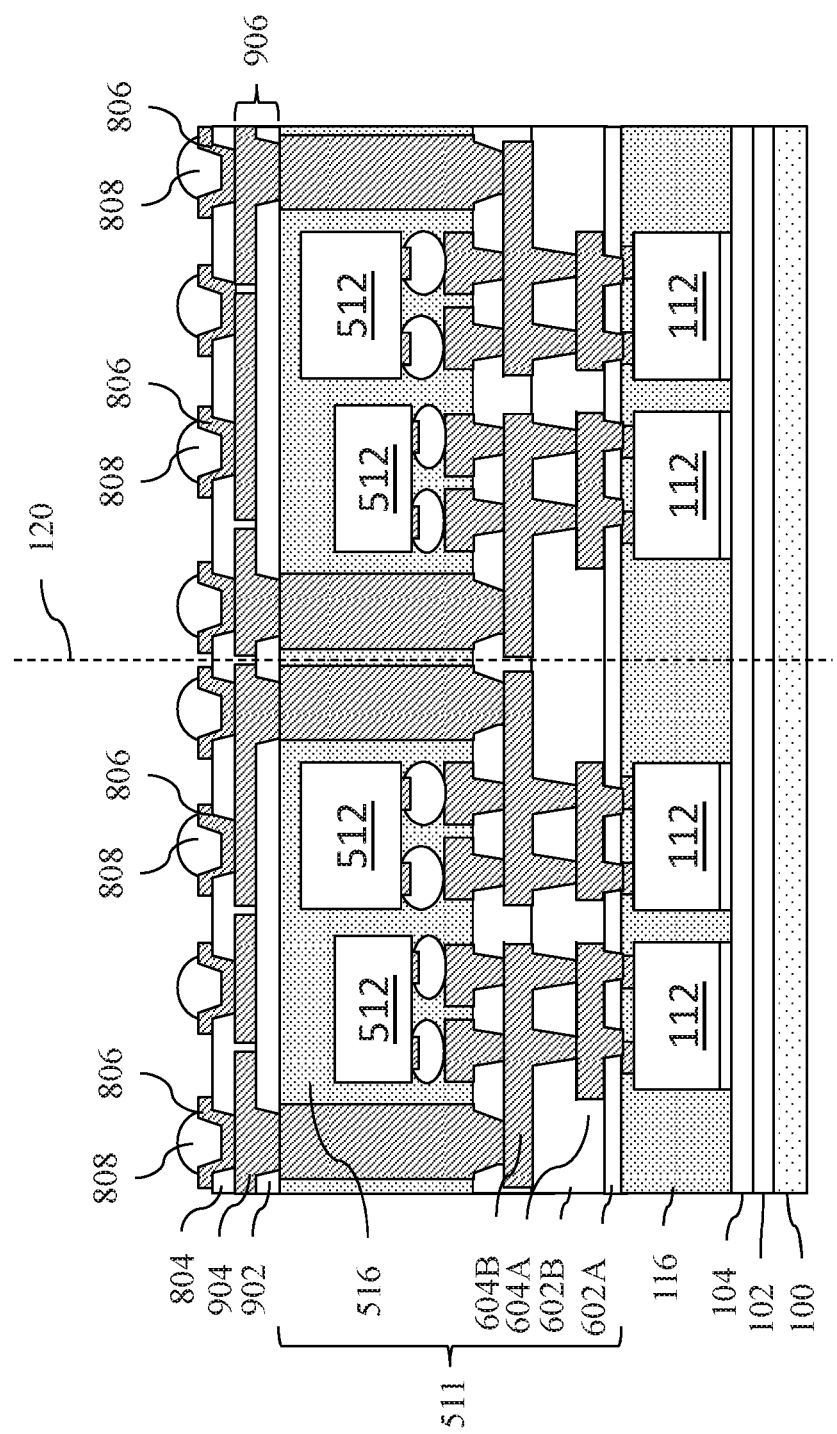

In FIG. 9D, dielectric layer 804 and UBMs 806 are formed, for example, as described above with respect to FIGS. 8B through 8D. In FIG. 9E, connectors 808 are formed on UBMs 806 (or directly on conductive vias 802 in embodiments where UBMs 806 are excluded). Connectors 808 may be solder balls, such as microbumps, C4 bumps, BGA balls, and the like. Connectors 808 may be formed, for example, using a ball mounting technique. In other embodiments, connectors 808 may be formed prior to removing a photoresist used to define a pattern of UBMs 806. For example, after the conductive material of UBMs 806 is formed in openings of the photoresist, an additional tin plating may be performed to form a solder layer on the UBMs 806. The photoresist is and portions of the seed layer on which the conductive material is not formed is then removed as described above. After the photoresist and seed layer are removed, a reflow process may be performed to form solder balls (e.g., connectors 808).

Figure 9F:
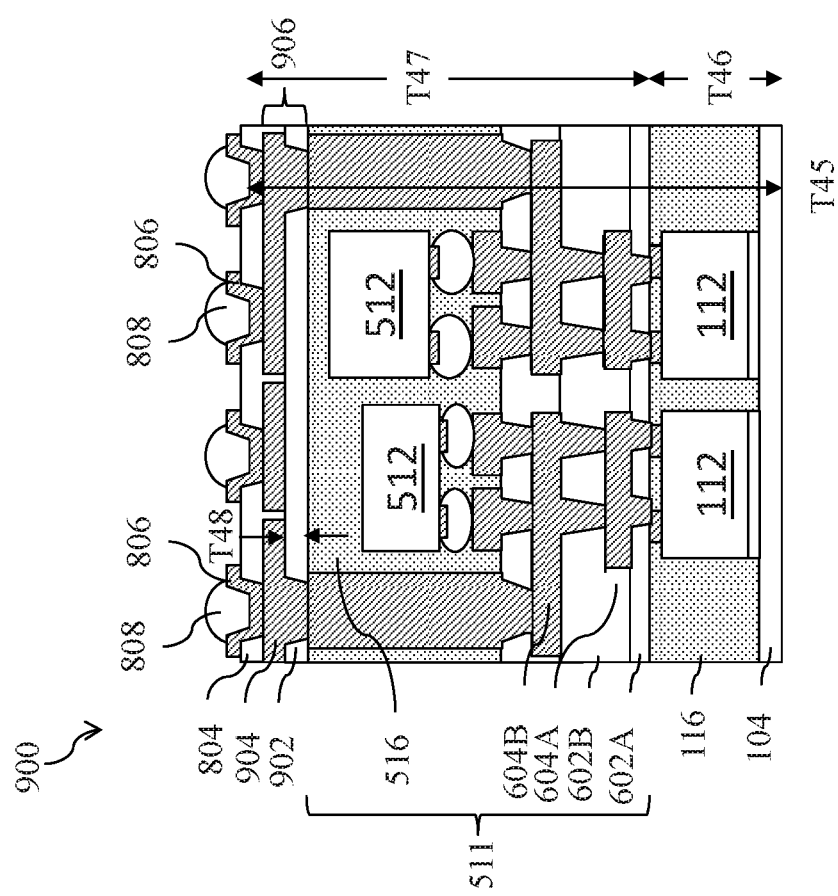

After connectors 808 are formed, carrier 100 and release layer 102 may be removed using a process as described above. A singulation process as described above may also be performed along scribe line 120. FIG. 9F illustrates the resulting package 900. Package 900 and package 700 (see FIG. 5J) may be similar where like reference numerals indicate like elements. Package 700 includes a plurality of stacked dies 112 and 512 having fan-out RDLs 511 disposed therebetween. I/O contacts in package 700 are provided by connectors 808 and fan-out RDLs 511. Connectors 808 may be disposed on a surface of package 900 opposite dielectric layer 104. Because RDLs 906 are included in package 900, connectors 808 may be disposed in an array having any number of connectors 808.

Package 900 has a thickness T45, which may be between about 200 µm and about 350 µm, such as about 244 µm (exclusive of connectors 808) with a first tier (e.g., between a bottom surface of dielectric layer 104 and a top surface of molding compound 116) having a thickness T46 of about 82 µm and a second tier (e.g., between a top surface of molding compound 116 and a top surface of dielectric layer 804) having a thickness T47 of about 162 µm. In package 900, dielectric layer 902 has a thickness T48 of about 10 µm. The other features of package 900 may have similar dimensions as respective features in package 800/700 where like reference numerals indicate like elements. In other embodiments, package 900 and/or the various features within package 900 may have other thickness, such as, greater than or less than the values provided.

Figure 9G:
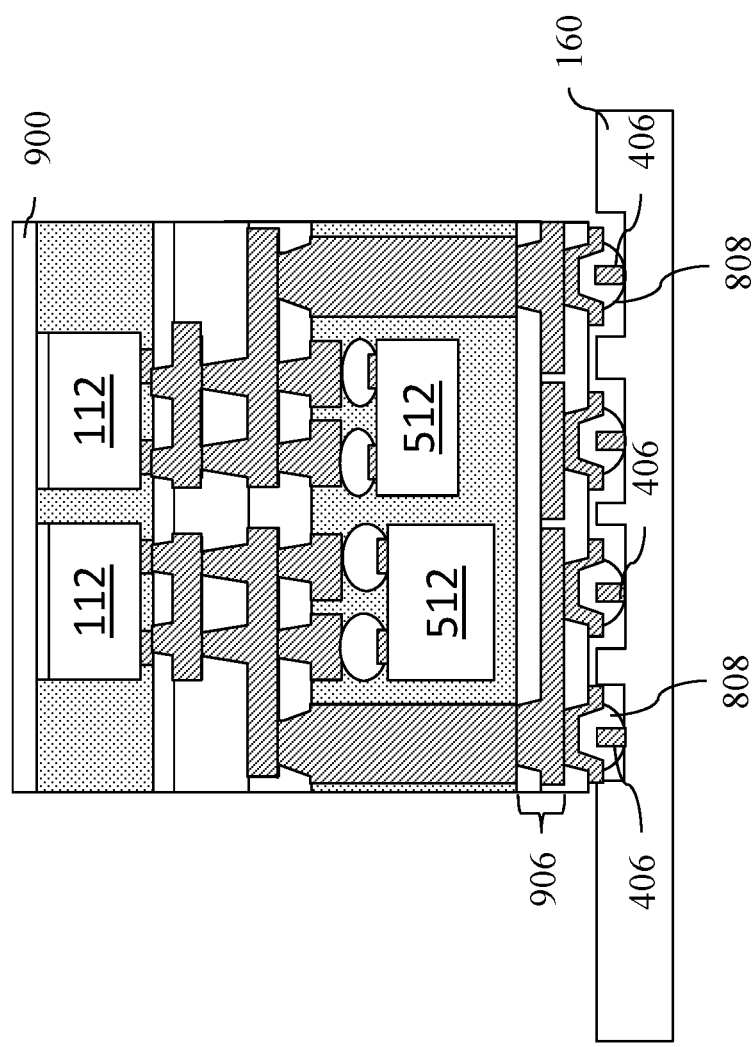

Connectors 808 may be used to bond package 900 to another device feature. For example, FIG. 9G illustrates a cross-sectional view of package 900 bonded to a substrate 160 by connectors 808. For example, package 900 may be disposed on substrate 160 by a pick-and-place tool. A reflow may then be performed to bond connectors 808 to conductive traces 406 of substrate 160. In an embodiment, connectors 808 may wrap around multiple sides of conductive traces 406 after bonding.

Figure 10C:
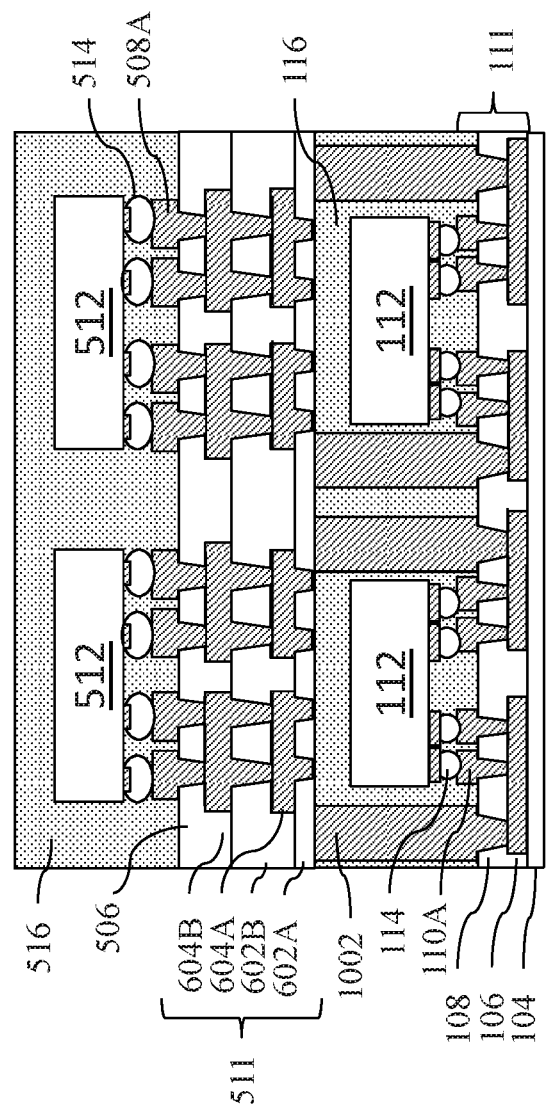

FIG. 10A through 10F illustrate cross-sectional views of various intermediary stages of manufacturing an IPD package according to some other embodiments. FIG. 10A illustrates a carrier substrate 100, a release layer 102, and RDLs 111 formed over release layer 102. RDLs 111 may include dielectric layer 104, conductive feature 106 (e.g., conductive lines), dielectric layer 108, and conductive features 110. The various features of FIG. 10A may be similar to the features of package 400 (see FIG. 4A) where like reference numerals indicate like elements. Thus, further description of these features and/or processes is omitted for brevity. However, in FIG. 10A, conductive features 110 do not include any sidewall I/O contacts 110C. Instead, sidewall I/O contacts 110C are replaced by conductive vais 1002, which may be formed, for example, by forming an additional conductive material on conductive features 110 using a similar process as described above with respect to FIG. 3B, for example. Although FIG. 10A illustrate RDLs 111 having one layer of conductive lines (e.g., conductive features 106), other embodiments may include any number of conductive lines (e.g., as described with respect to FIG. 2A). Conductive features in RDLs 111 may have any suitable pattern, such as the patterns described with respect to FIGS. 1G, 2B, 2C, or the like.

FIG. 10B illustrates dies 112 bonded to contact pads 110A using, for example, connectors 114. In some embodiments, connectors 114 are solder balls, such as microbumps, C4 bumps, or the like. A plurality of dies 112 is placed in each die placement region 150A and 150B. Furthermore, although only one die is illustrated as being placed in each region 150A/150B, embodiments may include any number of dies in each die placement region 150. Dies 112 may include all passive device dies, all active device dies, or a combination thereof. Dies 112 are electrically connected to conductive features in RDLs 111 (e.g., conductive features 106) by conductive features 110.

As further illustrated by FIG. 10B, the various components are encapsulated in a molding compound 116. In embodiments, molding compound 116 comprises an epoxy, a resin, a moldable polymer such as PBO, a MUF, or another moldable material. Molding compound 116 may encircle dies 112 in a top-down view (not provided). In an embodiment, molding compound 116 may be applied by compression molding, transfer molding, or the like. In an embodiment, molding compound 116 may be applied to cover top surfaces of dies 112. Molding compound 116 may be applied in liquid form, and may be subsequently cured to provide a solid encapsulant. After curing, a planarization process may be applied so that top surfaces of molding compound 116 and conductive vias 1002 as substantially level.

In FIG. 10C, additional features, such as, RDLs 511, dies 512, and molding compound 516 are formed over molding compound 116 and dies 112. RDLs 511, dies 512, and molding compound 516 may be substantially similar to respective features of package 600 (see FIGS. 6A through 6D) where like reference numerals indicate like elements. However, in FIG. 8A, I/O contacts 508B of package 600 (see FIG. 6D) may be omitted.

Figure 10D:
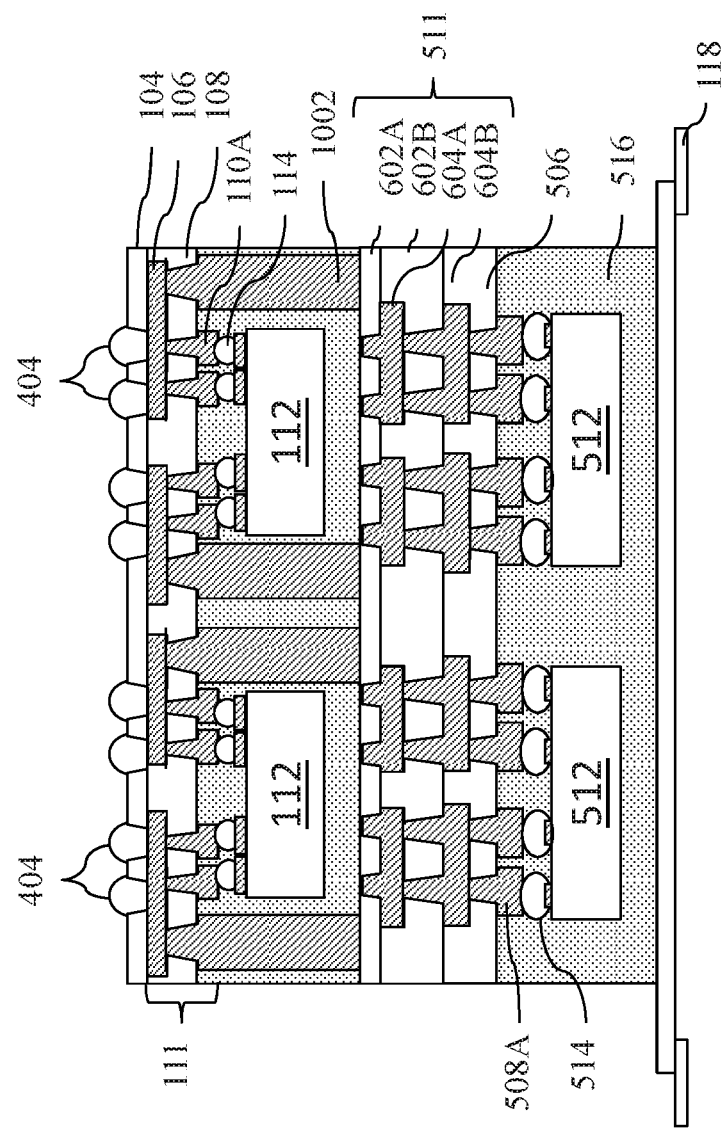

In FIG. 10D, a carrier substrate de-bonding is performed to detach (de-bond) carrier substrate 100 from RDLs 111, e.g., dielectric layer 104. In accordance with some embodiments, the de-bonding includes projecting a light such as a laser light or an UV light on release layer 102 so that release layer 102 decomposes under the heat of the light and carrier substrate 100 can be removed. The structure is then flipped over and placed on a tape 118.

As further illustrated in FIG. 10D, after carrier substrate 100 is de-bonded, openings are formed through the dielectric layer 104 to expose portions of conductive features 106. The openings may be formed, for example, using laser drilling, etching, or the like. Subsequently, connectors 404 may be disposed in the openings through dielectric layer 104. In some embodiments, connectors 404 comprise solder balls. Alternatively, after carrier substrate 100 is de-bonded, conductive features (not illustrated) in dielectric layer 104 are exposed. Removing portions of the dielectric layer may include any suitable patterning and/or planarization process. After the conductive features are exposed, connectors 404 are disposed on the conductive features.

Figure 10E:
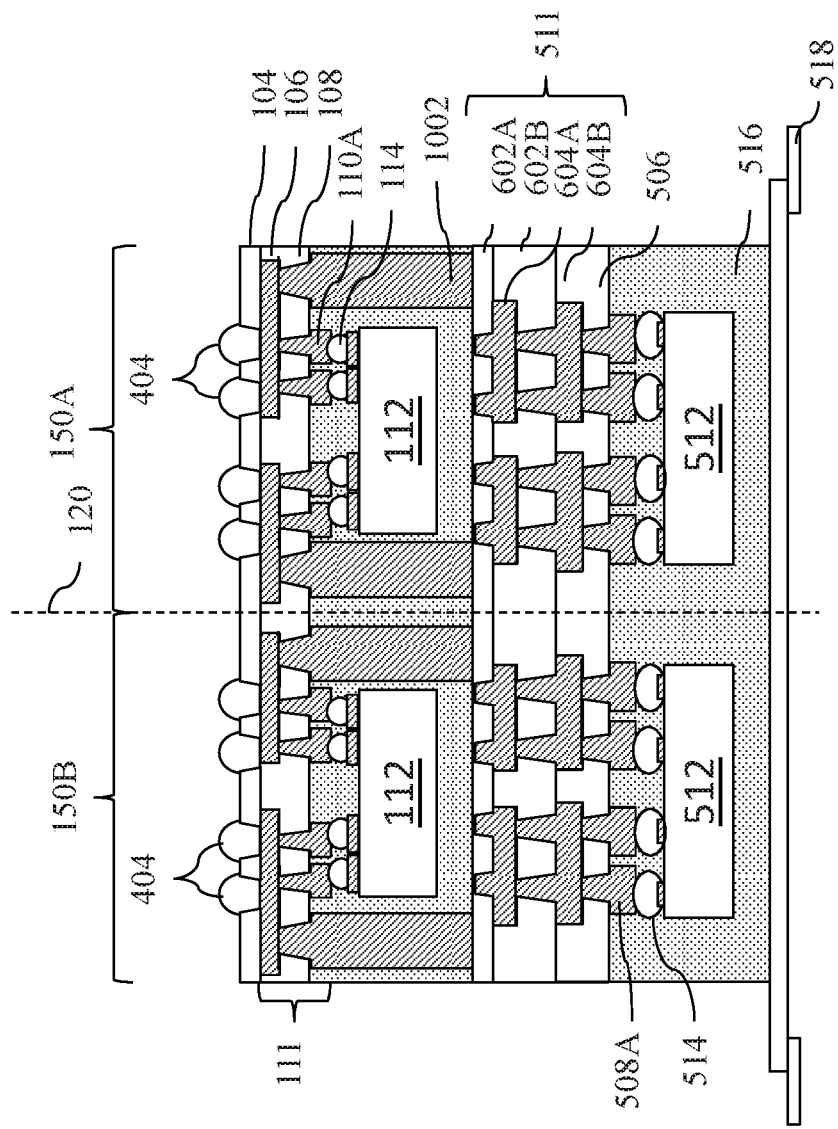

In FIG. 10E, a singulation process (not illustrated) may be performed along scribe lines 120, e.g., between adjacent regions 150 (labeled 150A and 150B). Singulation may be performed using any suitable process using, for example, a mechanical saw/blade, a laser, combinations thereof, or the like. In the illustrated embodiment, scribe line 120 and the singulation process do not extend through any conductive features in RDL, and I/O contacts are provided solely by connectors 404, not any sidewall I/O contacts (e.g., I/O contacts 110C, see FIG. 1J and/or I/O contacts 508B, see FIG. 5J). In other embodiments, connectors 404 may be combined with sidewall I/O contacts as described above (e.g., I/O contacts 110C, see FIG. 1J and/or I/O contacts 508B, see FIG. 5J).

FIG. 10F illustrates the completed device package 1000. Package 1000 includes a plurality of dies 112 and 512 encapsulated in molding compounds 116 and 516, respectively. Fan-out RDLs 111 and 511 having conductive features are electrically connected to dies 112 and 512, and fan-out RDLs 111 and 511 may extend laterally past edges of dies 112 and 512 to increase an area available for electrical routing to dies 112 and 512. Furthermore, as explained above, I/O contacts in package 1000 are provided by connectors 404. Connectors 404 may be disposed on a bottom surface of package 1000 (e.g., a surface of RDLs 111 opposite dies 112). Connectors 404 may be configured in an array in order to provide external connectors for package 1000.

Figure 10G:
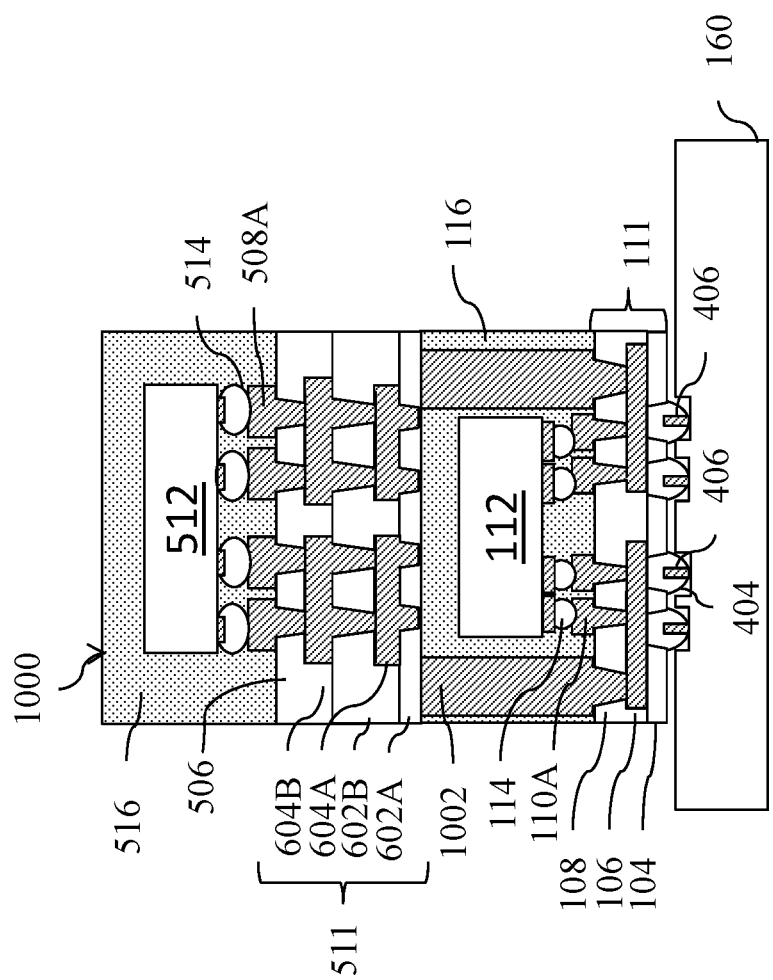

For example, FIG. 10G illustrates a cross-sectional view of package 1000 bonded to a substrate 160 by connectors 404. For example, package 1000 may be disposed on substrate 160 by a pick-and-place tool. A reflow may then be performed to bond connectors 808 to conductive traces 406 of substrate 160. In an embodiment, connectors 404 may wrap around multiple sides of conductive traces 406 after bonding.

Thus, as described above multiple dies may be integrated in various packaging schemes to provide packaged dies. In some embodiments, the dies are IPD dies, which allow for multiple IPD dies to be packaged with RDLs for increased flexibility in electrical routing. The various advantages described above can be achieved.

In accordance with some embodiments, a device package includes a first die, a second die, and a molding compound extending along sidewalls of the first die and the second die. The package further includes redistribution layers (RDLs) extending laterally past edges of the first die and the second die. The RDLs include an input/output (I/O) contact electrically connected to the first die and the second die, and the I/O contact is exposed at a sidewall of the device package.

In accordance with some embodiments, a package includes a substrate, a solder region over the substrate, and a device package bonded to the substrate by the solder region. The device package includes a plurality of passive device dies, a first molding compound encapsulating at least one of the plurality of passive device dies, and redistribution layers (RDLs) extending laterally past edges of the plurality of passive device dies. All dies encapsulated by the first molding compound is substantially free of any active regions. The RDLs electrically connects the plurality of passive device dies to the substrate.

In accordance with some embodiments, a method includes forming redistribution layers (RDLs) over a carrier substrate, bonding a first die and a second die to the RDLs, and encapsulating the first die and the second die in a molding compound. The method further includes removing the carrier substrate, and singulating the first die from the second die along a scribe line, wherein the scribe line extends through a conductive feature in the RDLs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
   a first die;
   a second die;
   a molding compound extending along sidewalls of the first die and the second die; and
   redistribution layers (RDLs) extending laterally past edges of the first die and the second die, wherein the RDLs comprise an input/output (I/O) contact electrically connected to the first die and the second die, wherein the I/O contact is electrically connected to at least the first die by a conductive line, wherein a portion of the I/O contact is exposed at a sidewall of the device package, wherein an interface between the conductive line and the I/O contact extends to the sidewall of the device package, and wherein a solder region contacts the portion of the I/O contact exposed at the sidewall of the device package.

2. The device package of claim 1, wherein the first die is an integrated passive device die substantially free of any transistors or diodes.

3. The device package of claim 1, wherein the second die comprises a transistor, a diode, or a combination thereof.

4. The device package of claim 1, wherein the I/O contact extends to a surface of the molding compound opposite the RDLs.

5. The device package of claim 1, wherein the second die is adjacent the first die.

6. The device package of claim 1, wherein the second die is disposed on an opposing side of the RDLs as the first die.

7. The device package of claim 1, wherein all dies encapsulated by the molding compound are free of any active devices.

8. A package comprising:
   a substrate;
   a solder region over the substrate; and
   a first device package bonded to the substrate by the solder region, wherein the first device package comprises:
      a plurality of passive device dies;
      a first molding compound encapsulating at least one of the plurality of passive device dies, wherein all dies encapsulated by the first molding compound are substantially free of any active regions; and
      first redistribution layers (RDLs) extending laterally past edges of the plurality of passive device dies, wherein the first RDLs electrically connects the plurality of passive device dies to the substrate.

9. The package of claim 8, wherein the first RDLs comprises a first input/output (I/O) contact exposed at a sidewall of the first device package, and wherein the solder region contacts the first I/O contact at the sidewall of the first device package.

10. The package of claim 9, wherein the first I/O contact comprises a first surface substantially level with a second surface of the first molding compound opposite the first RDLs.

11. The package of claim 10, wherein the solder region further contacts the first surface of the first I/O contact.

12. The package of claim 10 further comprising a second device package over the first device package and bonded to the substrate, wherein the second device package comprises:
    a plurality of additional device dies;
    a second molding compound encapsulating at least one of the plurality of additional device dies; and
    second RDLs electrically connected to and extending laterally past edges of the plurality of additional device dies, wherein the second RDLs comprises a second I/O contact exposed at a sidewall of the second device package, and wherein a line perpendicular to the first surface of the first I/O contact intersects the second I/O contact.

13. The package of claim 12, wherein the first I/O contact contacts the second I/O contact.

14. The package of claim 8, wherein a first one of the plurality of passive device dies is disposed on an opposing side of the first RDLs as a second one of the plurality of passive device dies.

15. The package of claim 8 further comprising:
third RDLs disposed on an opposing side of the first molding compound as the first RDLs; and
a conductive via extending through the first molding compound and electrically connecting the third RDLs to the first RDLs.

16. A method comprising:
forming redistribution layers (RDLs) over a carrier substrate;
bonding a first die and a second die to the RDLs;
encapsulating the first die and the second die in a molding compound;
removing the carrier substrate; and
singulating the first die from the second die along a scribe line, wherein the scribe line extends through a conductive feature in the RDLs.

17. The method of claim 16, wherein singulating the first die from the second die comprises using a singulation process in accordance with a thickness of the conductive feature.

18. The method of claim 17, wherein the singulation process comprises mechanical dicing, laser grooving, water-assisted laser cutting, routing machining, or a combination thereof.

19. The method of claim 16 further comprising planarizing the molding compound to expose a surface of the conductive feature.

20. The method of claim 16 further comprising attaching a third die to the carrier substrate, wherein forming the RDLs comprises forming the RDLs over the third die, and wherein bonding the first die and the second die comprises bonding the first die and the second die to an opposing surface of the RDLs as the third die.

* * * * *